United States Patent [19]

Hyatt

[11] 4,370,720
[45] Jan. 25, 1983

[54] COORDINATE ROTATION FOR NUMERICAL CONTROL SYSTEM

[76] Inventor: Gilbert P. Hyatt, P.O. Box 4584, Anaheim, Calif. 92803

[21] Appl. No.: 232,459

[22] Filed: Mar. 7, 1972

Related U.S. Application Data

[63] Continuation-in-part of Ser. No. 101,881, Dec. 28, 1970, abandoned, Ser. No. 134,958, Apr. 19, 1971, Ser. No. 135,040, Apr. 19, 1971, Ser. No. 229,213, Apr. 13, 1972, Pat. No. 3,820,894, and Ser. No. 230,872, Mar. 1, 1972.

[51] Int. Cl.³ ............................................. G05B 19/18
[52] U.S. Cl. ................................... 364/474; 364/171
[58] Field of Search .............. 340/172.5; 235/151.11; 318/572; 364/474, 107, 120, 167–171, 188, 189

[56] References Cited

U.S. PATENT DOCUMENTS

| | | | |
|---|---|---|---|
| 3,123,657 | 3/1964 | Clark, Jr. et al. | 235/151.11 X |
| 3,178,563 | 4/1965 | Wedgewood et al. | 364/853 |
| 3,315,235 | 4/1967 | Carnevale et al. | 340/172.5 |
| 3,453,549 | 7/1969 | Payne et al. | 318/572 X |
| 3,462,742 | 8/1969 | Miller et al. | 364/200 |
| 3,548,172 | 12/1970 | Centner et al. | 235/151.11 |
| 3,555,516 | 1/1971 | Proctor | 340/172.5 |
| 3,553,738 | 4/1971 | Bottles et al. | 364/107 X |
| 3,576,978 | 5/1971 | Rosenberg | 364/107 |
| 3,593,091 | 7/1971 | Ross | 318/572 |
| 3,626,266 | 12/1971 | Sindelar et al. | 318/572 |
| 3,626,385 | 12/1971 | Bouman | 340/172.5 |
| 3,633,011 | 1/1972 | Bederman et al. | 340/172.5 X |
| 3,634,662 | 1/1972 | Slawson | 235/151.11 |
| 3,668,653 | 6/1972 | Fair et al. | 340/172.5 |
| 3,685,022 | 8/1972 | Raynes | 340/172.5 |
| 3,699,317 | 10/1972 | Middleditch | 235/151.11 |
| 3,702,988 | 11/1972 | Haney et al. | 340/172.5 |

FOREIGN PATENT DOCUMENTS 1240882 7/1971 United Kingdom ............... 235/154

OTHER PUBLICATIONS

Francis et al., "The Computer Managed Manufacturing Concept", Proceedings of the 7th Annual Meeting and Technical Conference of the Numerical Control Society, Apr. 8–10, 1970, pp. 229–239.
"Introduction to Microprogramming Concepts", by Micro Systems Inc., 4-1969.
*Microprogramming Handbook* by Microdata, pp. 64–66, 6-1971.
"Down Links: Instructions and Commands", from *Computer Integrated Manufacturing* by Harrington, pp. 91–94.
"Microprogrammable Digital Computer", by Micro Systems, Inc., *Computer Design*, May 1969, p. 69.
"Three Machine Tool Shows-or Were They Control Show? It was Hard to Tell", in *Control Engineering*, Nov. 1970; pp. 53–56.
"The Technical Ins and Outs of Computerized Numerical Control—A Special Report", in *Control Engineering*, Mar. 1971; pp. 65–84.
Beelitz et al., "System Architecture for LSI", AFIPS Conf. Proc., vol. 31, Nov. 14–16, 1967, pp. 185–200.
Levy, "System Utilization of LSI", IEEE, vol. EC-16, No. 5, Oct. 1967, pp. 562–566.

*Primary Examiner*—Joseph F. Ruggiero
*Attorney, Agent, or Firm*—Gilbert P. Hyatt

[57] ABSTRACT

Multi-dimensional coordinate translation, rotation, and scaling for a machine control system provides translation, rotation, and scaling of coordinates such as for alignment, inch and metric, scaling, and expanded and contracted dimensions. A method of reducing accumulated errors uses absolute coordinate dimensions. Axis alignment provides for computationally aligning misaligned parts. Inch and metric scaling provides for dimensioning in either set of units. Expanded and contracted dimensions permits scaling to nominal dimensions, then expanding or contracting dimensions for special purposes such as compensation for thermal expansion and mating parts.

28 Claims, 33 Drawing Figures

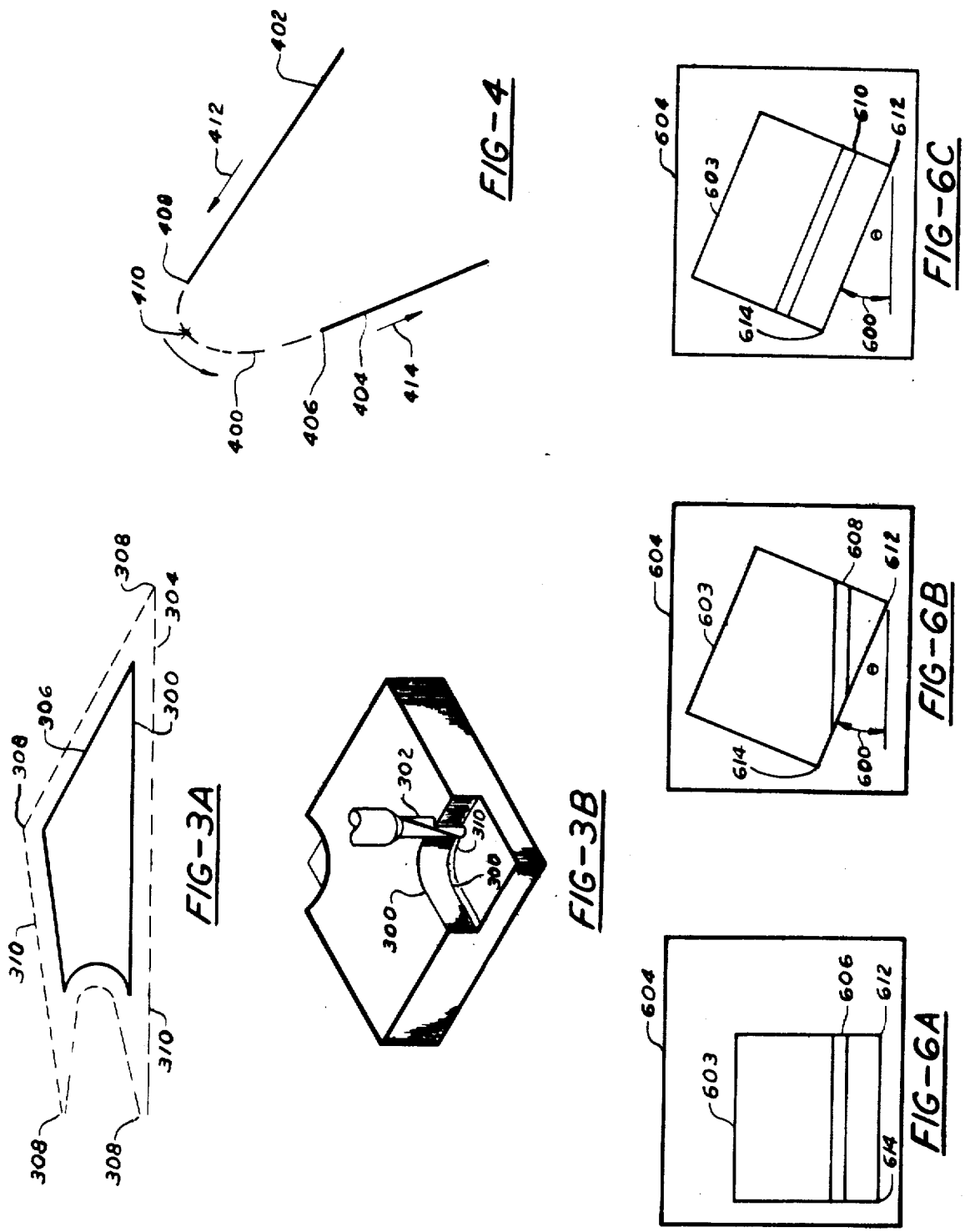

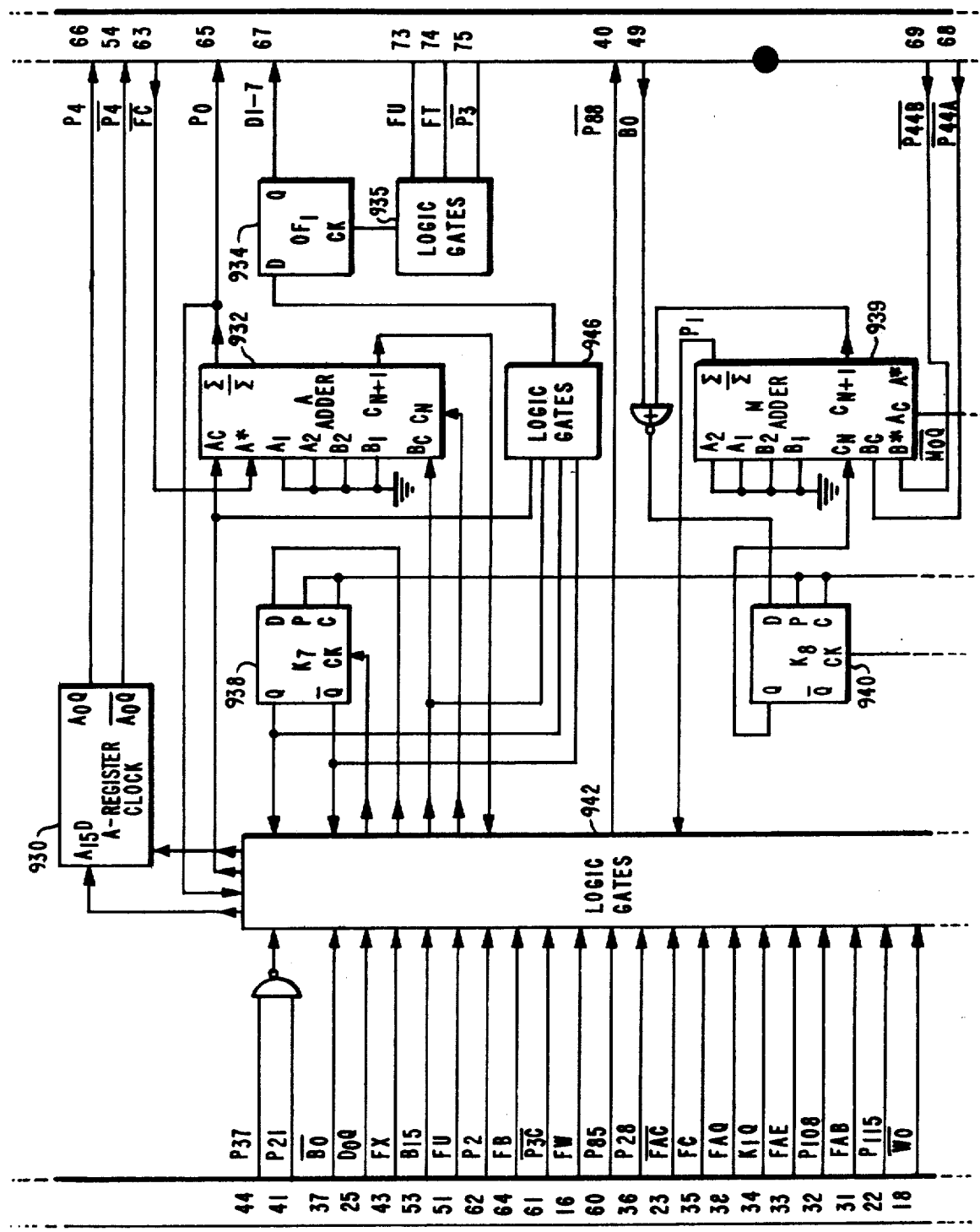
FIG.—9A

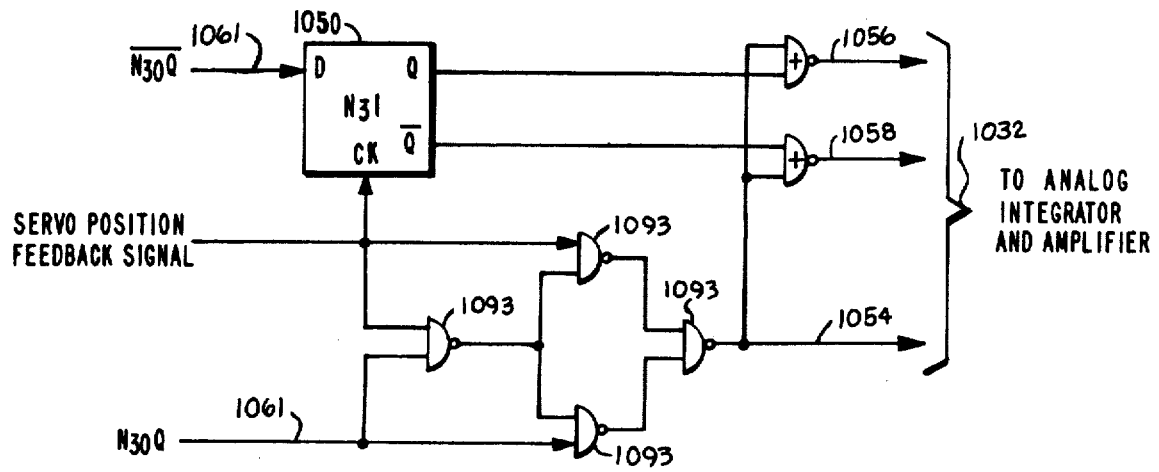
FIG.—10F
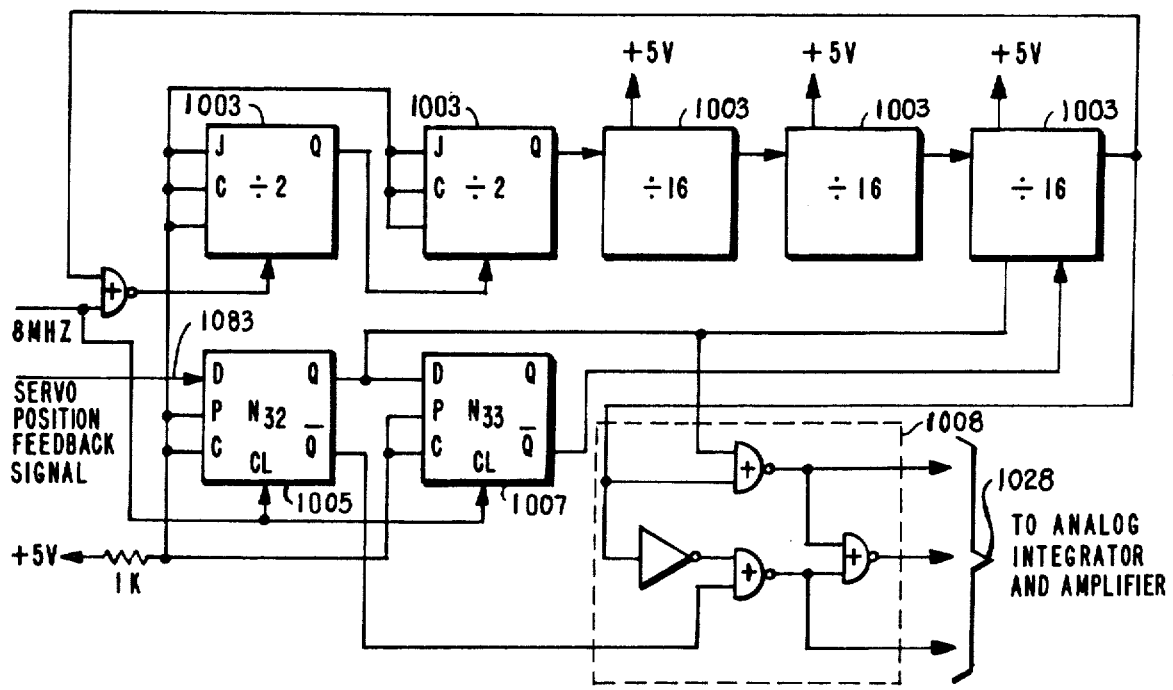
FIG.—10G

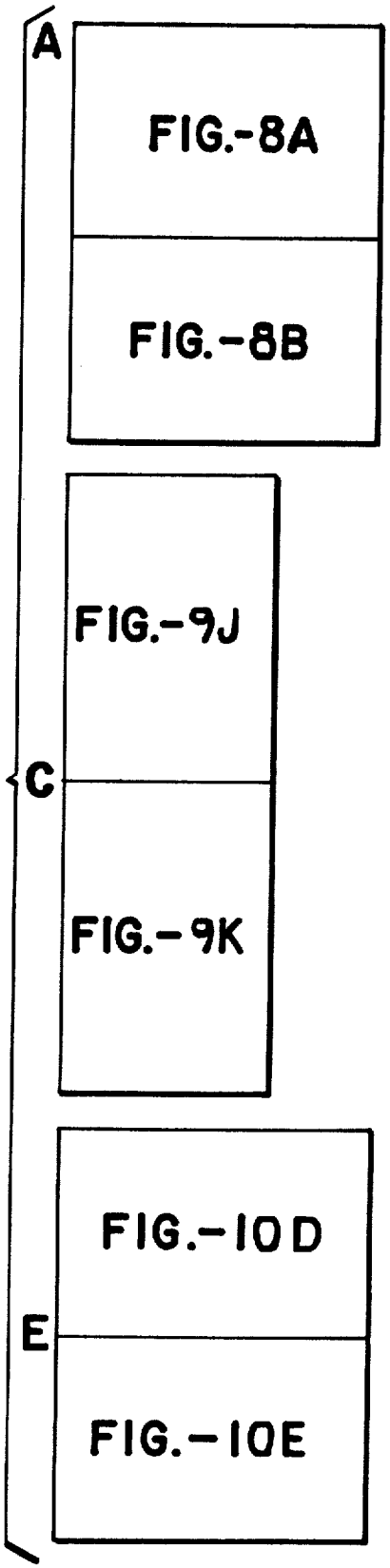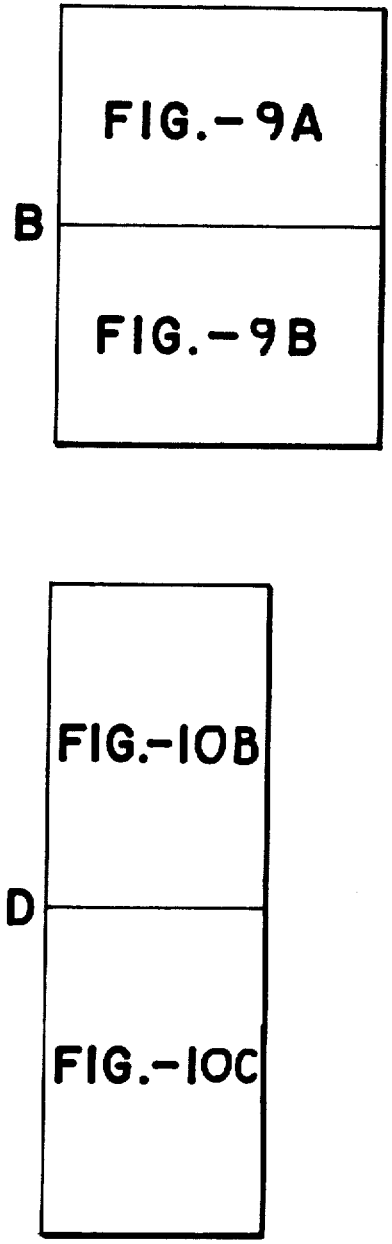

COORDINATE ROTATION FOR NUMERICAL CONTROL SYSTEM

CROSS REFERENCE TO RELATED APPLICATIONS

This application is a continuation-in-part of the chain of parent applications:

1. FACTORED DATA PROCESSING SYSTEM FOR DEDICATED APPLICATIONS Ser. No. 101,881 filed on Dec. 28, 1970 abandoned; where proceedings therein have been terminated.
2. CONTROL SYSTEM AND METHOD Ser. No. 134,958 filed on Apr. 19, 1971;
3. CONTROL APPARATUS Ser. No. 135,040 filed on Apr. 19, 1971;
4. APPARATUS AND METHOD FOR PRODUCING HIGH REGISTRATION PHOTO-MASKS Ser. No. 229,213 filed on Apr. 13, 1972 now U.S. Pat. No. 3,820,894 issued on Jun. 28, 1974; and
5. MACHINE CONTROL SYSTEM OPERATING FROM REMOTE COMMANDS Ser. No. 230,872 filed on Mar. 1, 1972;

all by Gilbert P. Hyatt:
wherein the benefit of the filing dates of this chain of parent applications is herein claimed in accordance with 35 USC 120 and other authorities provided therefore; and
wherein said parent applications and the patents issuing thereon are herein incorporated by reference.

This application is related to applications:

6. DIGITAL FEEDBACK CONTROL SYSTEM Ser. No. 246,867 filed on Apr. 24, 1972 now U.S. Pat. No. 4,310,878;
7. COMPUTERIZED SYSTEM FOR OPERATOR INTERACTION Ser. No. 288,247 filed on Sept. 11, 1972 now U.S. Pat. No. 4,121,284 issued on Oct. 17, 1978;
8. STORED PROGRAM DATA PROCESSING SYSTEM FOR DIRECT CONTROL OF A MACHINE IN REAL TIME WITH DISCRETE SIGNALS Ser. No. 291,394 filed on Sept. 22, 1972;
9. DIGITAL ARRANGEMENT FOR PROCESSING SQUAREWAVE SIGNALS Ser. No. 302,771 filed on Nov. 1, 1972;
10. APPARATUS AND METHOD FOR PROVIDING INTERACTIVE AUDIO COMMUNICATION Ser. No. 325,933 filed on Jan. 22, 1973 now U.S. Pat. No. 4,016,540 issued on Apr. 5, 1977;
11. ELECTRONIC CALCULATOR SYSTEM HAVING AUDIO MESSAGES FOR OPERATOR INTERACTION Ser. No. 325,941 filed on Jan. 22, 1973 now U.S. Pat. No. 4,060,484 issued on Nov. 29, 1977;
12. DIGITAL SIGNAL PROCESSOR FOR SERVO VELOCITY CONTROL Ser. No. 339,817 filed on Mar. 9, 1973 now U.S. Pat. No. 4,034,276 issued on Jul. 5, 1977;
13. CONTROL SYSTEM AND METHOD Ser. No. 339,688 filed on Mar. 9, 1973;
14. DATA PROCESSOR HAVING INTEGRATED CIRCUIT MEMORY REFRESH Ser. No. 402,520 filed on Oct. 1, 1973;
15. COMPUTERIZED MACHINE CONTROL SYSTEM Ser. No. 476,743 filed on Jun. 5, 1974; and
16. HIGH REGISTRATION PHOTOMASK METHOD AND APPARATUS Ser. No. 752,751 filed on Dec. 20, 1976 now U.S. Pat. No. 4,120,583 issued on Oct. 17, 1978:

all by Gilbert P. Hyatt.

This application is further related to applications:

17. INTERACTIVE CONTROL SYSTEM by Barry T. Lee, Ralph V. Cole, Irving Hirsch, Gilbert P. Hyatt, and Gunther W. Wimmer Ser. No. 101,449 filed on Dec. 28, 1970; now abandoned in favor of continuing applications; and herein incorporated by reference and
18. INTERACTIVE CONTROL SYSTEM by Barry T. Lee, Ralph V. Cole, Irving Hirsch, Gilbert P. Hyatt, and Gunther W. Wimmer Ser. No. 354,590 filed on Apr. 24, 1973 now U.S. Pat. No. 4,038,640 issued on Jul. 26, 1977.

Certain of said related applications that have matured or are maturing into U.S. patents have the same disclosure as-filed as contained in certain of said parent and related applications:

wherein said related application Ser. No. 402,520 had the same disclosure as-filed as said parent application Ser. No. 101,881;
wherein said related application Ser. No. 339,817 now U.S. Pat. No. 4,034,276 had the same disclosure as-filed as said parent application Ser. No. 135,040; and
wherein said related application Ser. No. 354,590 now U.S. Pat. No. 4,038,640 had the same disclosure as-filed as said parent application Ser. No. 101,449;
wherein said related applications Ser. No. 402,520; Ser. No. 339,817; and Ser. No. 354,590 having the same disclosures as-filed as said parent applications thereof Ser. No. 101,881; Ser. No. 135,040; and Ser. No. 101,449 respectively were filed as PTO Rule 60 continuing applications thereof; .
wherein the PTO had copied the disclosures of said parent applications thereof Ser. No. 101,881; Ser. No. 135,040; and Ser. No. 101,449 to obtain the disclosures as-filed for related applications Ser. No. 402,520; Ser. No. 339,817; and Ser. No. 354,590 respectively in accordance with said PTO Rule 60; and
wherein said U.S. Pat. Nos. 4,034,276 and 4,038,640 have been provided to the U.S. Patent and Trademark Office for being included in the file wrapper of the instant application.

Certain of said parent applications have been partially incorporated in continuing applications therefrom; wherein said parent application Ser. No. 101,881 had been partially incorporated in the instant application;
wherein said parent application Ser. No. 134,958 has been partially incorporated in said related application Ser. No. 246,867 and
wherein said parent application Ser. No. 230,872 has been partially incorporated in said related application Ser. No. 476,743.

One skilled in the art will be able to combine the disclosures in said applications that are incorporated by reference with the disclosure in the instant application from the disclosures therein and the disclosures herein.

Secrecy is hereby waived for the disclosure as-amended of said applications incorporated by reference and only for the disclosure as-amended, wherein the disclosure as amended shall be opened to the public to the limited extent that a requestor be "allowed to order a copy of only that portion of the patent application that relates to the common subject" (MPEP 103) which is limited to ordering a copy of only the disclosure as-filed and amendments to the disclosure.

BACKGROUND OF THE INVENTION

1. Field of the Invention

The field of the invention is a numerical control system for machine control using a stored program data processor; particularly for coordinate resolution of motion commands.

2. Prior Art

The prior art uses mechanical fixtures to align parts, precomputed coordinates punched on tape, and non-computerized numerical control systems; wherein prior art numerical control systems do not provide computerized coordinate resolution capability.

Numerical control systems are used to control machines such as machine tools. Digital parts program commands are input with a punched tape to describe the part to be cut on a machine such as a milling machine. These parts program commands are accessed from the tape by the numerical control system and are executed to drive the machine to automatically cut the part.

Prior art numerical control systems have been designed around special purpose digital devices where operations such as logic, control, and computations are performed with special purpose logic. Because of the high cost and limited capability of these special purpose numerical control systems, most of the computations are preprocessed with a remote, large scale computer using a parts program compiler such as APT. The remote computer preprocesses the information and generates a punched tape in a control oriented language containing the initial conditions and commands required by the special purpose numerical control equipment. These parts program tapes describe the part to be generated and are used as the command inputs to the numerical control system to cut the part.

The limited capability of the prior art, non-computerized numerical control systems have placed a considerable burden on the parts programmer, system operator, and the entire manufacturing organization. In prior art systems; parts programming requires many unnecessary calculations, workpiece setup and equipment operation are complex, and manufacturing control is very limited. Other problems are encountered due to the limitations of the prior art numerical control systems.

A numerical control system usually includes a machine control unit (MCU) and a machine, wherein the MCU and the machine are located together. A DNC system usually includes a remote computer center, a data link, an MCU, and a machine; wherein the MCU and machine are located together and wherein the MCU communicates with the remote computer center over the data link. In many DNC systems the MCU and machine may be a conventional numerical control system, wherein the MCU has a data link interface in place of or in addition to the usual tape reader.

SUMMARY OF THE INVENTION

The present invention is directed to a computerized numerical control system having coordinate resolution capability. This capability can be used for computationally aligning misaligned parts, converting between inch and metric coordinates, expanding and contracting part sizes, and other such applications. A summary of the general features of such a computerized numerical control system is presented below.

This invention presents a simple, inexpensive system and method to provide computerized capability for control applications. This system will be described as a milling machine numerical control system. It should be understood that any reference to such a numerical control system is intended to include any system wherein digital command and control capability is to be provided for a machine. The particular system discussed herein is one class of such devices.

The preferred embodiment of this invention is an advanced numerical control system, containing a general-purpose digital data processor for high levels of capability and versatility. Computerized capability is provided at a price competitive with prior art non-computerized systems, qualifying computerized numerical control (CNC) on only one machine. A major portion of the machine shop budget and production capability does not have to be committed to a limited capability, expensive central Direct Numerical Control (DNC) multi-machine control computer. The computerized numerical control system of this invention provided at each machine yields economy, because this system is cost competitive with prior art non-computerized systems that do not have CNC capability, and provides protection of production capability, because the shop is not dependent on a single central DNC computer which can malfunction and shut down the whole production capability. The system of this invention can provide one computer per machine "dedicated" to the individual machine on a stand-alone basis, which operates in conjunction with the machine in real time to provide self-contained CNC capability. Major assemblies in this system include a general purpose digital computer, interactive control panel, multi-axis servo drives, machine interface electronics, memory, CRT display, typewriter, punched tape reader, power supplies, and other equipment. Capability includes complex contouring with linear, circular, and parabolic curves; curve fitting; automatic fairing contours; six axes of simultaneous contouring; digital resolution of 50 millionths (0.000050) inch; departure range of 99.999 950 inches; contouring velocities of 1,200 inches per minute; and other features. Also provided are closed-loop DC servos with resolver feedback; inductosyn (Ferrand Scale) feedback; full absolute position feedback with multi-speed pickoffs and other features.

Special features include automatic tool change with up to 99 tool offsets in core memory, spindle speed control, constant cutter chip load, and adaptive feeds and speeds. Tool history is automatically recorded for preventative maintenance. Thread cutting with direct IPR and RPI (pitch) feedrate programming is provided for lathes, and cutter compensation is available for milling and grinding machines.

Numerical control systems typically accept parts programs from a punched tape reader. The CNC system of this invention provides access to parts programs from a taper reader, remote large-scale computer, internal memory, or other sources of parts programs. The input data format meets the requirements for "interchangeable perforated tape" as defined in EIA Standard RS-274. Block search and buffer memory features are provided. Data can be entered in either absolute or incremental coordinates, G code selectable, with the capability to mix both coordinate schemes in the same block of commands. Addressing is either variable block or tab sequential. Direct feedrate programming is standard. Full range floating zero and zero offsets are redefinable from the parts program. Other parts programming features include an unlimited number of M and G commands contained in one block, editing symbols such as decimal points, sequence of commands at the parts programmers convenience, and a full circle programmable in one block of commands.

This dedicated computer system includes a computer integrated into the system for versatility, economy, and performance. For example, the control panel is an extension of the computer I/O section. This I/O section is physically partitioned so that many of the interface operations, normally performed in a computer I/O, are physically contained on the panel motherboard. This system is under program control, where control, display, data processing, contouring, and machine control operations are handled under program control by the computer. The executive routine permits time-share operation and self-contained diagnostics. Therefore, the system can be conveniently upgraded to incorporate additional features, primarily by reprogramming the computer.

Prior art systems use large scale remote computers to process parts program information, but have used local, noncomputerized numerical control systems for real time machine control operations. Problems associated with using a remote computer and the limitations of a non-computerized numerical control system have greatly limited their effectiveness. The manufacturing system of this invention provides a local, dedicated computer contained in the numerical control system for performing the real time machine control operations such as contour interpolation, sequencing a spindle on or off, and other such machine control functions. This system also provides parts program processing to eliminate the need for a remote computer for many applications. In addition, parts program modification capability such as editing capability is provided that does not require the extensive capabilities of a large scale computer with a parts program compiler such as the APT compiler.

Machine information is provided to the shop manager to aid in the determination of machine use, preventative maintenance records, and operator efficiency. A remote readout of current operation is provided which includes feedrate override, operating mode, block sequence number in process, and part in process. This current operation report defines the instantaneous condition of the equipment. A remote readout of past operation includes total time in each mode and cycle-on/cycle-off conditions. Down time and delays are identified and logged based upon type and duration of the condition. Machine historical records are maintained, including machine operation cycles and accumulated time with automatic notification of preventative maintenance.

Parts program checkout on prior art numerical control systems requires identification of the program errors at the machine, with correction of errors on a remote large-scale computer. Tape correction logistics are time consuming, where poor availability of the large-scale computer in conjunction with its remote location often preclude rapid turnaround. Several iterations of parts programs checkout and correction may be required, with up to a week of delays due to punched tape turnaround. Numerical control systems can be tied up for that excessive nonproductive period. With the editing capability provided with the system of this invention, the parts program can be corrected as it is checked-out, thereby eliminating the expensive, time-consuming logistics usually associated with parts program correction.

Cutting of parts from sheet metal plates is performed with flame cutting machines, where it is often necessary to nest or fit the patterns together to minimize scrap. Nesting of patterns involves both position offsets and axis rotation to reorient and fit the programmed part on the sheet metal plate. Floating zero point redefinition for automatic position offsets and resolution of the parts program departure commands through a predefined angle for axis rotation provides this capability. Position offset and axis rotation parameters are commanded either from the tape or with the manual data input (MDI) keyboard. Pattern nesting capability results in substantial economy for the user, where the reduction in scrap, ease of programming, and simplified operation greatly enhance the "cost-of-ownership" characteristics of the system.

Parts programming is significantly simplified with this computerized numerical control system, where the computer relieves the parts programmer of much of his tedious calculations. Large scale computers with sophisticated software such as APT are often used to simplify the parts programming effort. This system simplifies parts programming when using APT and enhances the feasibility of manual parts programming when APT is not available. The features provided in the system of this invention that simplify parts programming include direct feedrate programming with various systems of units, combining incremental and absolute coordinate programming, cutter compensation, axis alignment and others.

Simplified parts programming described hereafter, permits parts program changes to be made in a control oriented language such as the EIA Standard format, instead of requiring a compiler oriented language and the associated large scale computer to generate a parts program or a parts program correction. Therefore, a programmer can conveniently generate a parts program or a correction.

In the prior art, calculations required to generate a parts program or to change a parts program were complex; often requiring a large scale computer with a parts program compiler. The capability provided with the CNC system of this invention simplifies parts programming, permitting parts programs to be generated manually without a large scale computer and simplifies changes to parts programs so changes can be made manually without a large scale computer. The simplified parts programming features include cutter compensation, selectable dimensioning, acceleration and deceleration, and other special capabilities. Other features are provided, such as axis alignment, simplify setup and operation of the system.

A computerized numerical control system will be termed a CNC system, which is herein intended to mean the special numerical control capabilities of a stored program data processor and the associated numerical control system.

An object of this invention is to provide a practical computerized numerical control system.

A yet further object of this invention is to provide coordinate resolution capability.

A still further object of this invention is to provide computational alignment capability.

Another object of this invention is to provide inch and metric conversion capability.

A further object of this invention is to increase the capability of the numerical control system.

A further object of this invention is to reduce the dependence of the numerical control system on a remote large scale computer system.

Still a further object of this invention is to simplify the operation and programming of a numerical control system.

The foregoing and other objects, features, and advantages of this invention will be apparent from the following detailed description of preferred embodiments of this invention, as illustrated in the accompanying drawings.

BRIEF DESCRIPTION OF THE DRAWINGS

A better understanding of the invention may be had from a consideration of the following detailed description, taken in conjunction with the following drawings.

FIG. 1 comprises FIGS. 1A and 1B wherein

FIG. 3 is a diagram of material removal and tool geometry comprising FIG. 3A showing geometry of a cut and FIG. 3B showing the physical relationship between a cutter and a part.

FIG. 4 is a diagram of a fairing contour.

FIG. 6 shows workpiece alignment geometry comprising FIG. 6A showing an aligned cut within an aligned part, FIG. 6B showing a misaligned cut within a misaligned part, and FIG. 6C showing an aligned cut within a misaligned part.

FIG. 8 comprising

FIG. 9A and 9B is a schematic and block diagram representation of the A logic circuit board.

FIG. 11 illustrates the manner in which the separate sheets of drawings of FIGS. 8A and 8B, FIGS. 9A and 9B, FIGS. 9J and 9K, FIGS. 10B and 10C, and FIGS. 10D and 10E are combined.

DETAILED DESCRIPTION OF THE INVENTION

Figure 1A:
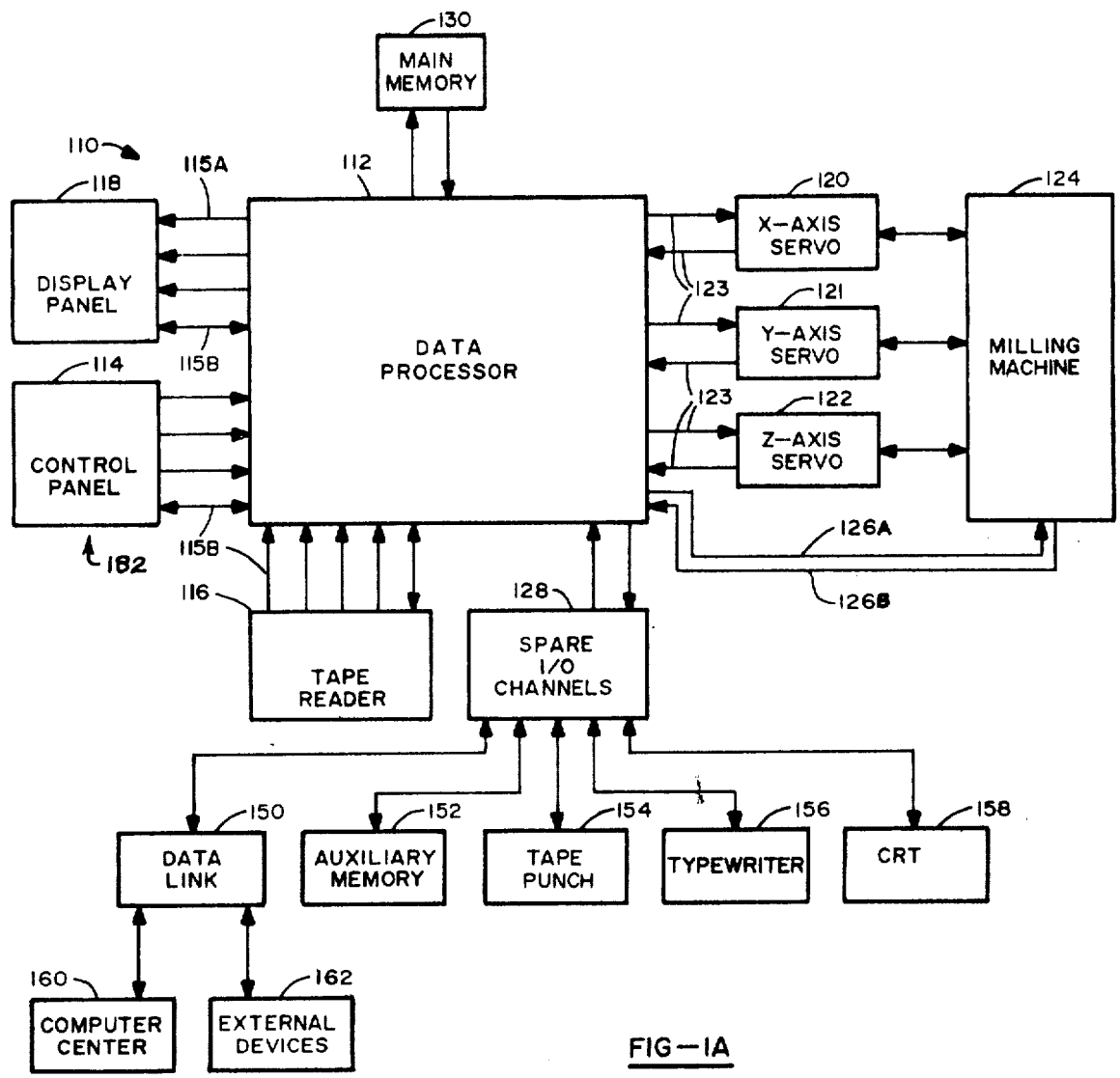
FIG. 1A is a block diagram representation of a numerical control system and FIG. 1B is a block diagram representation of a stored program data processor in accordance with the present invention.

The numerical control system of this invention can take any of a number of possible forms. A preferred embodiment of the present invention is shown in FIG. 1 and will be described in detail hereafter.

By way of introduction of the illustrated embodiment, the components shown in the drawings have been assigned general reference numerals and a brief description of each such component is given in the following description. The components in each figure have in general been assigned three digit reference numerals wherein the hundreds digit of the reference numerals corresponds to the figure number. For example, the components in FIG. 1 have reference numerals between 100 and 199 and the components in FIG. 2 have reference numerals between 200 and 299 except that the same component appearing in successive drawing figures has maintained the first reference numeral.

This application is a continuation in part to the previously referenced application Ser. No. 101,881 describes the CNC capability provided with the system of that referenced application.

The system shown in block diagram form in FIG. 1A is described in detail in the copending patent applications set forth under Cross Reference To Related Applications above and incorporated by reference. A brief description of the system is presented under System Description hereinafter. Further, preferred embodiments of various system arrangements are described in sections entitled Tape Reader, Data Processor, Interactive Control System, and Servo Command Structure hereinafter. These arrangements are described in further detail in the related copending patent applications that are incorporated by reference. Still further, a brief description of data processor interface instructions is presented under Instruction Repetoire hereinafter. A detailed description of the data processor instruction repetoire is provided in the parent application, Factored Data Processing System For Dedicated Applications Ser. No. 101,881 filed on Dec. 28, 1970 and incorporated herein by reference.

CNC commands and displays can be provided with the control panel 114 and the display panel 118 using available switches and displays and using spare switches and displays described in the previously referenced applications Ser. No. 101,881 and Ser. No. 101,449. Still further CNC capability is provided with the auxiliary input/output channels 128 described in the previously referenced application Ser. No. 101,881. These auxiliary input/output channels 128 provide access to alternate parts program memories, alternate sources of parts programs, alternate sources of CNC commands and displays, and other capability which is discussed in greater detail hereafter.

Figure 1B:
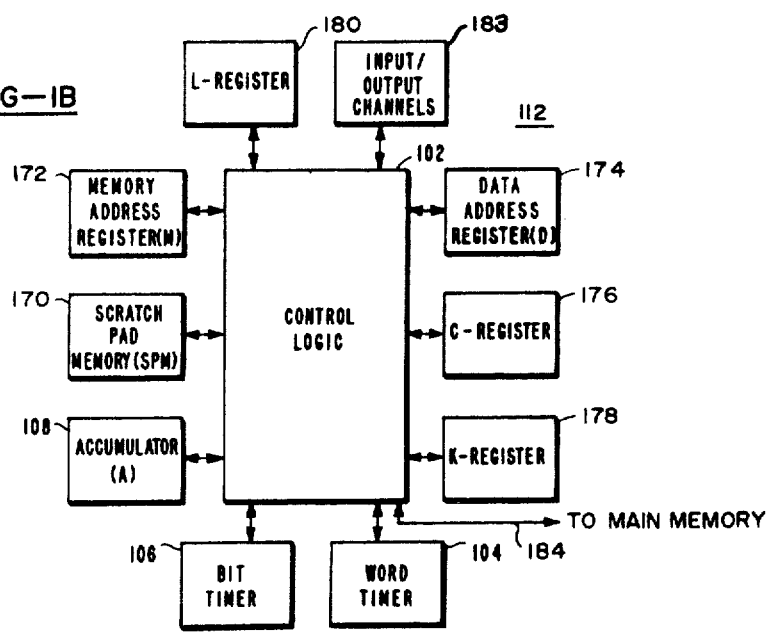
Figure 2:
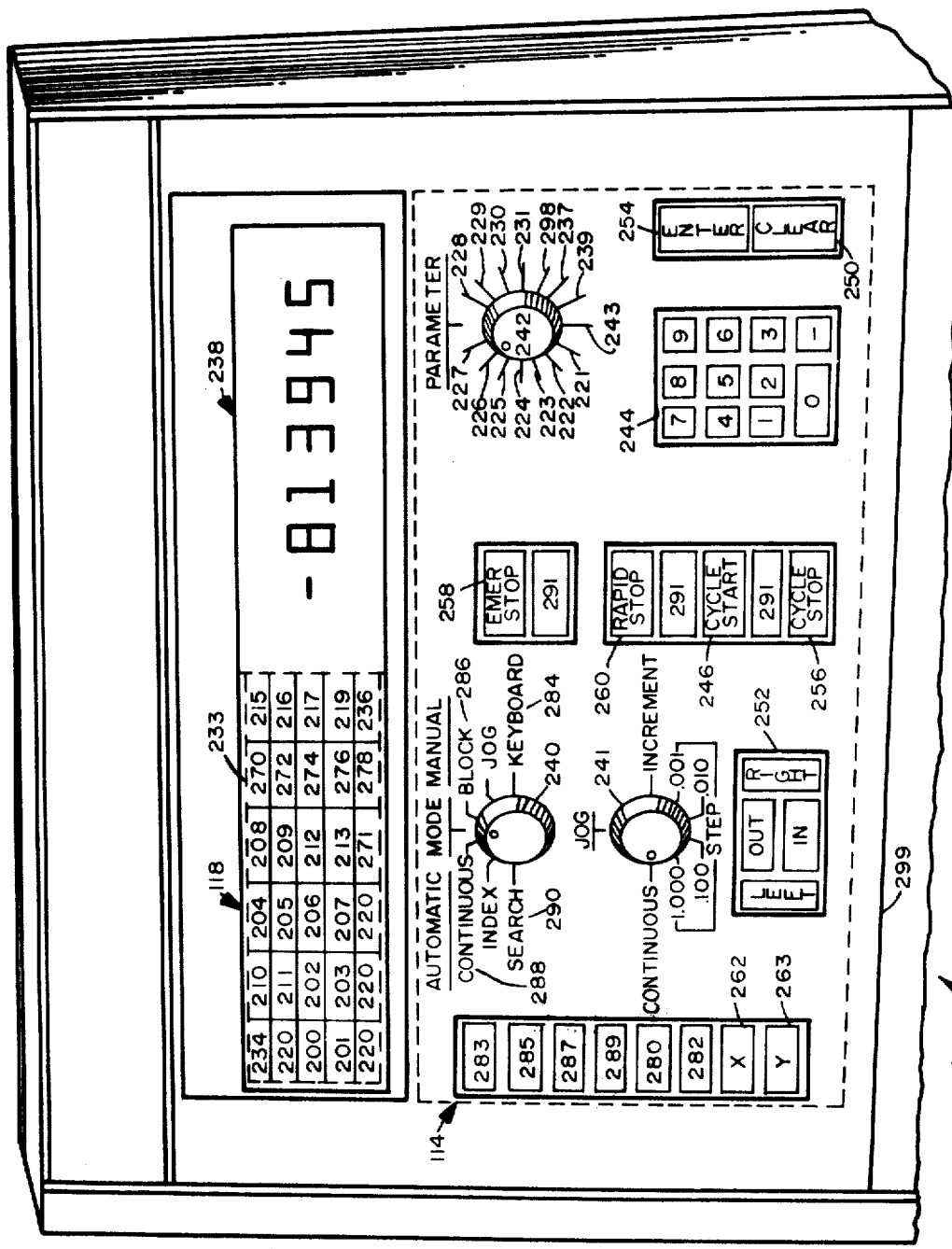
FIG. 2 is a diagram of the control and display panel.

FIGS. 1A, 1B and 2 of this application are generally the same as the corresponding the corresponding FIGS. 1, 4 and 2 respectively in the previously referenced application Ser No. 101,881; with minor changes such as with the assignment of reference numerals to make those figures compatible with the form of this application.

Many of the elements shown in FIG. 1 are described in detail in the reference parent applications. System 110 is described in parent application Ser. No. 101,881 at pages 1-16. Data processor 112 is described in parent application Ser. No. 101,881 at pages 16-18 and 34-120. Input-output channels such as auxiliary channels 128 are described in parent application Ser. No. 101,881 such as at pages 83 and 84. Tape Reader 116 is described in parent application Ser. No. 101,881 such as at page 32. Operator panel 182 comprising control panel 114 and display panel 118 is described in parent application Ser. No. 101,881 at pages 19-31 and in related application Ser. No. 101,449 at pages 1-19. Servos 120-122 are described in parent applications Ser. No. 101,881 at pages 32-34 and 84-88; Ser. No. 134,958 at pages 1-23; and Ser. No. 135,040 at page 1-33.

The system of this invention will now be described, where the previously referenced application Ser. No. 101,881 provides the preferred embodiment of this invention. The system 110 is shown in FIG. 1A. The data processor 112 communicates with the control panel 114 and the display panel 118 over signal lines 115. The primary function of the main memory 130 is to contain the stored program for the data processor 112. In one embodiment, this main memory is a core memory and is also used to store a parts program. The tape reader 116 is primarily used to load a parts program. In one mode of operation, this tape reader 116 is used to access the parts program for execution by the data processor 112 to control the machine 124. In another mode of operation, this tape reader 116 is used to access the parts program for loading a parts program memory, which may be a portion of the main memory 130 or auxiliary parts program memory 152.

Various CNC commands are entered through the tape reader 116 and the control panel 114 to provide the CNC capability described. In addition, special CNC panel controls can be provided for entering CNC commands in place of or in addition to the tape reader method of entering these CNC commands. Other embodiments and methods for providing this capability will become obvious to those knowledgeable in the art.

The data processor 112 can access other subsystems through the spare I/O channels 128 for alternate sources of CNC commands, alternate sources of parts programs, and alternate parts program memories. The machine 124 is controlled with multiple axis servos 120, 121, and 122 operating from data processor real time command signals 123 and is controlled with various auxiliary command signals 126. These command signals are provided by the data processor 112 which accesses a parts program and computes the command signals required to command the machine 124 to execute the parts program.

The data processor 112 accepts parts program commands at a data rate and at operating times dictated by the source of parts program commands and by the numerical control system operations. The machine 124 requires commands at a rate dictated by the machine considerations such as machine dynamics for contouring; discussed in the previously referenced application Ser. No. 134,958 and machine response time such as for tool change and spindle speed change requirements. These machine command requirements place a real time operation constraint on the control system 110. Real time machine commands are herein intended to mean commands to the machine 124 with time constraints dictated by machine requirements.

Parts program information is typically accessed by a punched tape reader 116 but may be obtained from other sources; where the use of alternate sources of parts programs is presented in the previously referenced application Ser. No. 101,881 particularly page 22 lines 4 through 7 and other descriptions therein. One source may be a remote large scale computer system that generates the parts program with an APT compiler, then transmits this program over a data link 150 to the CNC system 110. The data link 150 could be a telephone line or other well known means with appropriate terminal devices such as modems that are well known in the art.

INTRODUCTION

By way of example, a factored computer system is represented in block diagram form in FIG. 1A as a numerical control system 110, including an electronic data processor 112, arranged in accordance with the invention. The specific example referred to here and described hereafter relates to a three-axis controlled milling machine, but it will readily be appreciated that systems in accordance with the invention may be applied to a wide variety of tasks including communication, process control, processing of business data and other control functions such as photo-optical pattern generators and multi-turret machines.

In accordance with the basic concepts of a factored electronics system, the numerical control system (FIG. 1A) provides an illustration of this factoring process. The data processor is used in conjunction with the various extremities of the system where some of these extremities are elemental extremities. The data processor has a distributed characteristic, where the raw instruction signals comprised of micro operation and operand address signals are communicated in intrinsic signal form to the interface assembly which is physically distributed and set apart from the data processor 112 and the various extremities that communicate with the data processor through this input-output structure.

The data processor 112 is shown by way of this example to be used in conjunction with a core memory 130. The basic architecture of this data processor will permit an integrated circuit memory, such as a read only memory (ROM), or a random-access memory (RAM) or flip-flop type memory to be substituted for the core memory 130 to provide a completely integrated circuit computer which might be called a monolithic computer.

The architecture of the computer is oriented towards a factored computer system to permit the data processor to operate in close conjunction with the extremities for this factored computer system. The special organization and instruction repertoire aid in implementing this factored computer system.

The control panel operates with the data processor in a mutually interdependent fashion to yield interactive capability for operator functions.

The photoelectric tape reader 116 is an extremity that inputs part programs to define the part to be cut by the milling machine 124. The real-time non-adapted signal form 115B intrinsic to the tape reader 116 includes not only data but tape reader characteristics caused by photo-optical, electro mechanical, and electrical effects that are inherent to the tape reader, described in the reference application A Method and Apparatus For Processing The Digital Output Of An Input Means. The data processor accepts these intrinsic signal forms directly from the tape reader and derives the required data from the ambiguity and errors present in this intrinsic signal form.

The milling machine 124 is an extremity of the system which can be implemented as an elemental extremity in conjunction with the data processor. Direct control of the various machine functions, such as storing the tool positions, compensating for tool characteristics, and controlling a turret motor for tool selection reduce the machine interface that is often implemented with relay logic and other such "magnetics". The machine axes pickoffs in the square-wave servo loop can be used directly by the data processor to derive position, velocity and acceleration information pertaining to the motion of machine axes.

The axes servos 120, 121, and 122 are a typical example of elemental extremities. The communication between the data processor and the axes servos is in a signal form wherein the whole number aspect is intrinsic to the data processor and wherein the square-wave aspect is intrinsic to the axes servos. This intrinsic signal form simplifies the communication interface between the data processor and the axes servos and relieves limitations previously imposed on servos for numerically controlled machines.

The operative dispersion associated with this factored computer system is typified by the multi-axes contouring capability of the system. The data processor performs the countouring computations in whole number form intrinsic to the data processor and generates the resultant whole number commands for the axes servos. The operative dispersion provides extremely high levels of performance with a significant reduction in hardware and a reduction in the computational burden placed on the data processor. The intrinsic signal forms of the servos have a whole-number square-wave characteristic that is acceptable to the data processor in a non-adapted form to provide interactive communication between the data processor and the axes servos to provide adaptive control capability with this elemental extremity. The axes servos illustrate an elemental extremity that can yield a high level of economy and versatility with a reduced burden on the data processor together with the additional capability of adaptive control.

The present invention more particularly incorporates the normal computer functions of controlling, performing mathematical operations, and storing data into a physically distributed, operatively dispersed system providing concurrent internal control of coaction with associated extremities.

The substantially direct communication between the computer and the extremities permits the reduction or elimination of interface logic and interface controllers required in prior art systems.

Specific data processor features include an adaptive memory control power interrupt technique preventing detrimental system operation and a memory protect technique creating inalterable fields in an electrically alterable memory. Functional modifiers permit shortened program instructions without sacrifice of program capability or flexibility.

One technical area in which systems in accordance with the invention have particular advantage is in the control of multi-axis machine tools and the control of photo-optical plotters to provide output products. Other areas of particular advantage include the processing of communications and business data, for instance, payroll processing and inventory control. In all of these applications the system can receive rudimentary data in real-time intrinsic signal form from an elemental extremity such as an axis servo, process the non-adapted intrinsic signals, and provide data to the system. The system in turn commands an output device in a signal form which may be readily usable by or intrinsic to the output device, such as a servo system. Use of the physical distribution and operative dispersion of the system in conjunction with processor-dependent elemental extremities operating in non-adapted language modes permitting great versatility to be attained with low manufacturing cost. Furthermore, orientation of the system to a different class of tasks involves no significant redesign, but primarily involves changes in the data processor program.

A general-purpose data processor in accordance with this invention may include multiple data and program registers, a random access memory and a scratch pad memory, and non-buffered, directly coupled input-output lines connected to elemental input-output devices. These elements perform basic or prime functions and are physically distributed at different locations in the system, with operative dispersion making them functionally available throughout the system. This system comprises a numerical control machine, e.g., for three axis controlled milling machine, and closely integrates the operator and other input and output functions into the numerical control tasks. Minimal structure input-output extremities in this particular example comprise an elemental tape reader 116 and operator panels 114 and 118, servos 120, 121, and 122 for independent tool axis control and a passive data display 118. The data processor in real time concurrently monitors these extremities, pre-processes the external manifestations into machine-adaptable or intrinsic data, and generates extremity intrinsic or extremity-adapted extrinsic commands. The system concurrently operates under program control to perform the other aspects of the task, including carrying out complex computations for tool path control, generating servo commands for each of the controlled axes, sequencing through the program, providing other machine controls and generating graphical and printed output data if needed.

Part program inputs are provided by a photoelectric punched tape reader having Model No. RRS0304RA, manufactured by Remex Electronics. The manual for this tape reader is TRM-902U and is incorporated herein by reference.

Data and program storage is provided by a core memory 130 which may be a commercially available memory having Part No. 909838-A01, manufactured by Electronic Memories, Inc. Electronic Memories Inc. drawings 909811-909819 and 910792 show this memory in detail and are incorporated herein by reference. This is an 8-bit 4096 word core memory which is primarily devoted to program storage. Remaining portions may be used for data storage if desired. In this application, the core memory 130 (CM) may be replaced by a read-only memory (ROM) such as a MOS FET read-only memory sold commercially by General Instruments Corporation of Hicksville, New York or a flip-flop memory.

In a typical, very generalized example of the operation of the system of FIG. 1A for control of a milling machine 124, the data processor 112 accepts part program data from the tape reader 116 and operator inputs from the control panel 114 to commence the computation of servo commands. As the reader 116 and panel 114 are operated, the processor 112 is under program control to monitor the operative states of these devices and pre-processes the rudimentary data itself. Concurrently, and also under program control, the display panel 118 is activated by exciting the passive elements to form desired characters at a flicker-free rate. These time-related monitoring and pre-processing subtask functions concerned with the extremities continue to be carried out as needed as the processor 112 enters into its computational and processing functions concerned with its main task, that of executing the part program in real time. Thereafter, command data is translated into servo commands for the individual servos 120, 121, and 122, in intrinsic servo signal form. Feedback signals in the intrinsic servo format are likewise returned to the processor 112, pre-processed for conversion into the processor base language and utilized in further computations.

Programming of computers is a well-known art and is described in detail in the prior art literature such as PROGRAMMING: AN INTRODUCTION TO COMPUTER LANGUAGES AND TECHNIQUES by Ward Douglas Maurer for Holden Day Inc. (1968); PROGRAMMING FOR DIGITAL COMPUTERS by Joachim Jeenel for McGraw Hill (1959); FUNDAMENTALS OF FLOWCHARTING by Thomas J. Schriber for John Wily and Sons (1969); and ELEMENTS OF COMPUTER PROGRAMMING by Swallow and Price for Holt, Rinehart, and Winston (1965); incorporated herein by reference. The programs to provide data processor operations described hereinafter will be obvious to those skilled in the programming art from the descriptions of these desired operations. Further, coding of programs for use with the particular computer described herein will be obvious to those skilled in the programming art from the description of computer instructions provided hereinafter.

There are profound differences between systems thus arranged and operated and systems of the prior art. In the physical and operational sense, the data processor 112 is a much greater portion of the whole, and the associated units 114, 116, 118, 120, 121 and 122 are extremities of the processor 112. These extremities, which may not be independent in terms of control, are largely directly coupled to the processor 112. Each elemental extremity has certain characteristic relationships to the system, although other differences necessarily exist. Each relies essentially upon the operatively dispersed program capabilities of the processor 112. Each further effectively relies upon the processor 112 for pre-processing of the non-adapted signal forms for interpretation of signals and meaningful time-related data transfer. In this respect, digital buffering, conversion, and signal conditioning functions ordinarily provided by interface logic circuits are also avoided. Furthermore, the processor 112 itself need not be tailored in configuration to cooperate with pre-determined interface formats and requirements. In a further respect, the data processor presents data or accepts data in real time from/to system extremities in intrinsic signal forms such that the processor itself can effect the significance of such terms.

Elimination of physical identities are representative of what is herein termed physical distribution, where the processor 112 can be distributed throughout the preponderance of the task-performing system. Yet, by virtue of the operational dispersion of the system and other prime functions, this task-performing system may readily be modified, with a minimum of hardware changes to perform another task. Such change entails the essential modification of the system program, and also modification of the subtask programs and their relation to the task-pertinent program. It should be appreciated that the operative dispersion of the system encompasses and eliminates much of the interface circuitry that is redundant when used in conjunction with a data processor.

For the performance of many tasks, as in the numerical control field, systems in accordance with the invention can utilize a relatively small-scale computer without overloading. Concurrent performance of the subtasks does not in the usual instance result in excessive demands on the processor. To the contrary for numerical control systems, the general-purpose computational capability of the system hereafter described can generally be utilized to perform many functions such as contouring functions.

The data processor 112 is organized to operate in a manner somewhat similar to presently known stored program digital computers. The fundamental theory and technology of such presently known systems are described in Chapter 11 of *Digital Computer Design Fundamentals,* Yaohan Chu, McGraw-Hill Book Co., Inc. (New York, 1962) incorporated herein by reference.

The data processor 112 is organized to process 8-bit words with most working and storage registers having a 16-bit capacity permitting the storage of two words. Serial transfer of data is used throughout the data processor 112 to minimize the logic and interconnections required.

The data processor 112 includes a 12-bit memory address register (M Register) which defines a memory location being accessed in the main memory 130. A memory data register (D-Register) defines an operand location such as in the scratch pad memory and input/output (I/O) channels. Thirty-two Scratch Pad Memory (SPM) Registers provide convenient intermediate storage, independent of the main memory. A three-bit counter divides the execution of program instructions into word times and a four-bit counter subdivides the word times into bit times, the basic operating intervals.

The data processor operates by executing programmed instructions received from the main memory. When an instruction is received control logic causes the data processor to progress through a matrix of micro operations, the exact path varying with the instruction being executed. Each micro operation occurs during one of the eight possible word times, 0 thru 7, and performs a micro operation portion of the instruction being executed. Upon completion of the FZ micro operation, the data processor recycles through the matrix including flow diagram paths LIQ and P89; or LIQ, P89, and Y7; or LIQ, FAJ, FAL, FAM, FAN, and FAO; or LIQ, P89, Y7, FAK, FAL, FAM, FAN, and FAO as shown in FIG. 8B to begin execution of the next instruction.

The following description of the system, as will be evident to those skilled in the art, comprises a complete definition of a preferred embodiment in accordance with the invention. In order to simplify the description and drawings, extensive use has been made of logical equations, which per se are definitive of detailed circuit elements and interconnections for a specific system, in accordance with modern integrated circuit techniques and is well known to those skilled in the art. In order to simplify the description, extensive and orderly reference is made to principal micro operations, both in the form of the states of major subsystems at particular points in time during these micro operations as well as in the form of the sequences and purposes of each micro operation. The totality of these principal micro operations completely define the operation of this processor system.

It will also be recognized by those skilled in the art that the description of details of structure and operation of a general-purpose computer system is of necessity extended and complex. For convenience and ease of understanding the following description commences with those units most apparent to and used by an operator.

Tape Reader

Referring now to FIG. 1A, the tape reader 116 may be a commercially available paper tape puncher and reader such as Model RRS0304RA manufactured by Remex Electronics. However, it has been found that by implementing this tape reader 116 as an Elemental Extremity and using the Intrinsic Signal Form concept and Operative Dispersion concept, significant advantages can be achieved. These advantages are described in detail in copending application, "A Method and Apparatus For Processing the Digital Output of an Input Means," Ser. No. 879,293, filed Nov. 24, 1969, by Gilbert P. Hyatt and incorporated herein by reference. This referenced application is now abandoned in favor of the present application. Generally, the system operates by having the data processor sample the output of the tape reader 116 at a cyclic rate which is much faster than the operation of the tape reader 116 in a manner similar to the sampling of the control panel outputs. Punching and formatting of the paper tape is in accordance with EIA standards RS-274-B, Interchangeable Perforated Tape Variable Block Format for Contouring and Contouring/Positioning Numerically Controlled Machines, incorporated herein by reference.

Servos

The servos 120, 121 and 122 may be identical and are described with reference to the servo 120 only. As shown in block diagram form in FIG. 10A and in schematic form in FIGS. 10D and 10E, the servo 120 is able to attain the accuracy of digital control by operating with squarewave or digital signals. A squarewave reference signal 1070 is provided with respect to which the phase of the encoded signals are measured. The data processor produces a digital position signal 1071 which indicates a commanded servo position. The signal 1071 is a completely digital whole word signal produced under program control and having a characteristic defined as an intrinsic signal form. The reference signal 1070 and digital position information signal 1071 are applied to a digital detector 1074 which produces pulse width position difference command signals 1075. The reference signal 1070 is applied to a rotor of a resolver 1078 which is mechanically linked to machine tool 1080 which is being controlled. The stator of the resolver then produces a signal, the phase of which depends upon the position of the rotor as controlled by the machine tool 1080. The stator signal passes to an adding, shaping and amplifying circuit 1082 which produces a position defining squarewave feedback signal 1083 indicating the actual position of the machine tool 1080. The position feedback signal is passed to comparator circuits 1086 along with the position command signal 1075. The comparator circuits 1086 produce plus or minus pulse width squarewave signals 1087 with the duration of the positive portion of the signals indicating the difference between the commanded position and the actual position. A digital-to-amplitude converter 1088 converts this signal to a servo control error signal 1089 which is presented to one side of a summing resistor 1090A.

The digital-to-amplitude converters 1088 and 1096 (FIGS. 10A, 10D and 10E) accept pulse width modulated signals 1087 and 1094 respectively, and provide analog voltages 1089 and 1097 respectively, proportional to the duty cycle or width of the input pulses. These converters 1088 and 1096 are well known to those skilled in the art and may be configured with an analog switch controlled by the pulse width input signal to gate charge into a filter network for the time that the signal is true. The filter network averages this signal with respect to time to provide the analog voltage.

By comparing the half cycle period of the position feedback signal 1083 with the half cycle period of the reference signal 1070, a digital tachometer 1092 produces plus or minus squarewave signals 1094 with the duration of the positive portion of the signal indicating velocity. This signal passes to a digital-to-amplitude converter 1096 which produces a velocity feedback signal 1097 which is connected to summing resistor 1090B. The junction of the summing resistors 1090A and 1090B is connected to a power amplifier 1098 which drives a servo motor 1099 to control the position of the machine tool 1080. By using this squarewave technique, the servo 120 incorporates the combined accurance of digital and analog signals with the simplicity of analog signals and is typical of an Elemental Extremity with Intrinsic Signal Form implementation.

Data Processor

As shown in FIG. 1A, the data processor 112 receives data from the various input sources, performs calculations or otherwise manipulates data in accordance with the input information and outputs processed information to control the milling machine 124 through servos 120, 121, and 122 and auxiliary control signals 126A and 126B. The data processor is built from series SN7400 integrated circuits manufactured by Texas Instruments, Inc. which are located on a series of printed circuit boards. These printed circuit boards plug into a motherboard which provides necessary interconnections between the terminals of the printed circuit boards.

The architecture of the data processor 112 lends itself to a fully integrated circuit computer mainframe where all of the logic may be implemented with integrated circuits in a conventional manner and additionally includes an integrated circuit scratch pad memory (SPM). Further, this data processor 112 has the architecture to use an integrated circuit read-only memory (ROM) in place of or in addition to a core memory such as for the main memory 130 providing a data processor with the digital portion constructed wholly of integrated circuit components.

In a somewhat simplified block diagram, the data processor 112 is shown in FIG. 1B as control logic 102 interconnecting registers, timers and communication channels. Common signal definitions are provided to permit those knowledgeable in the art to identify the various connections between boards.

Figure 9B:
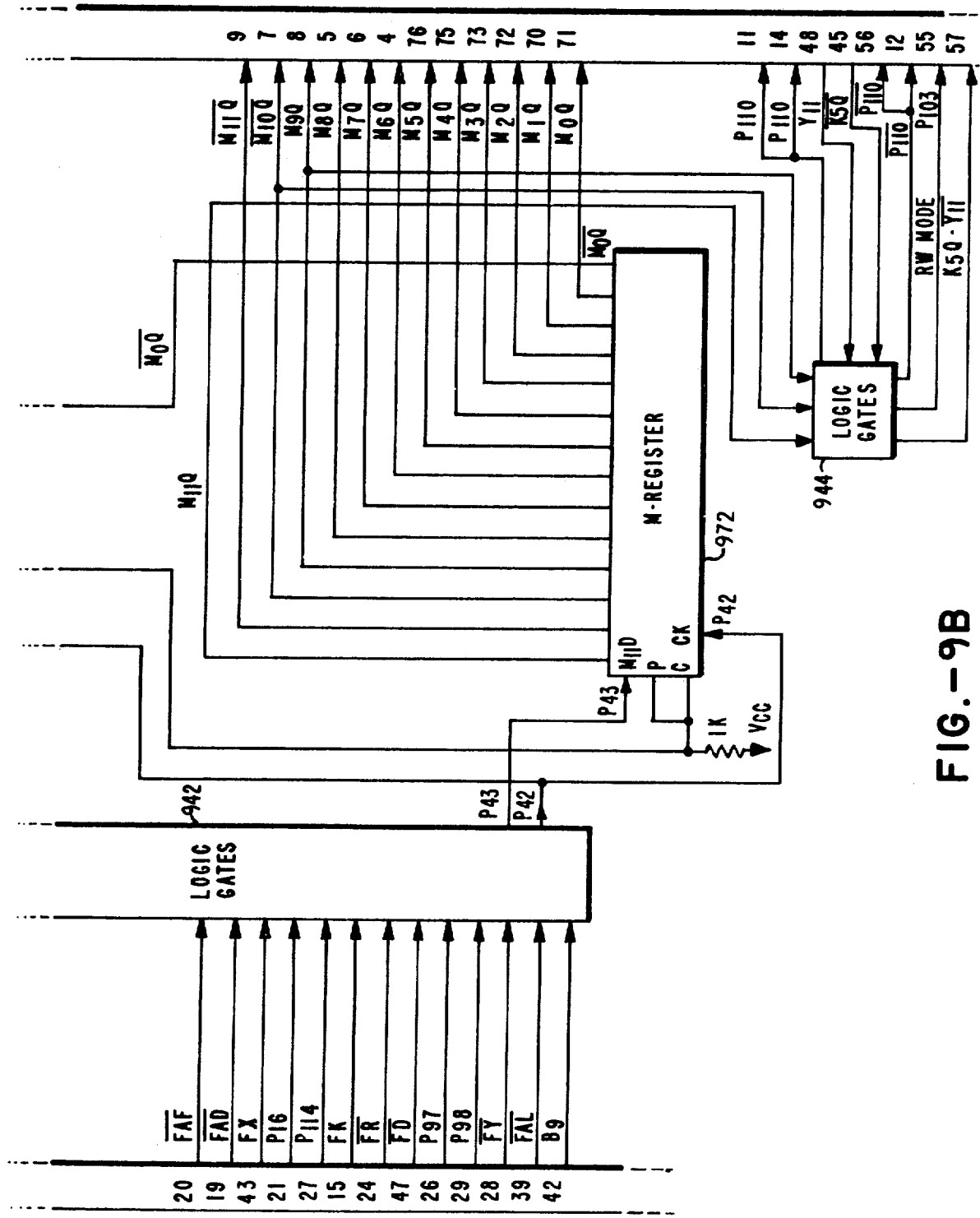
Figure 9C:
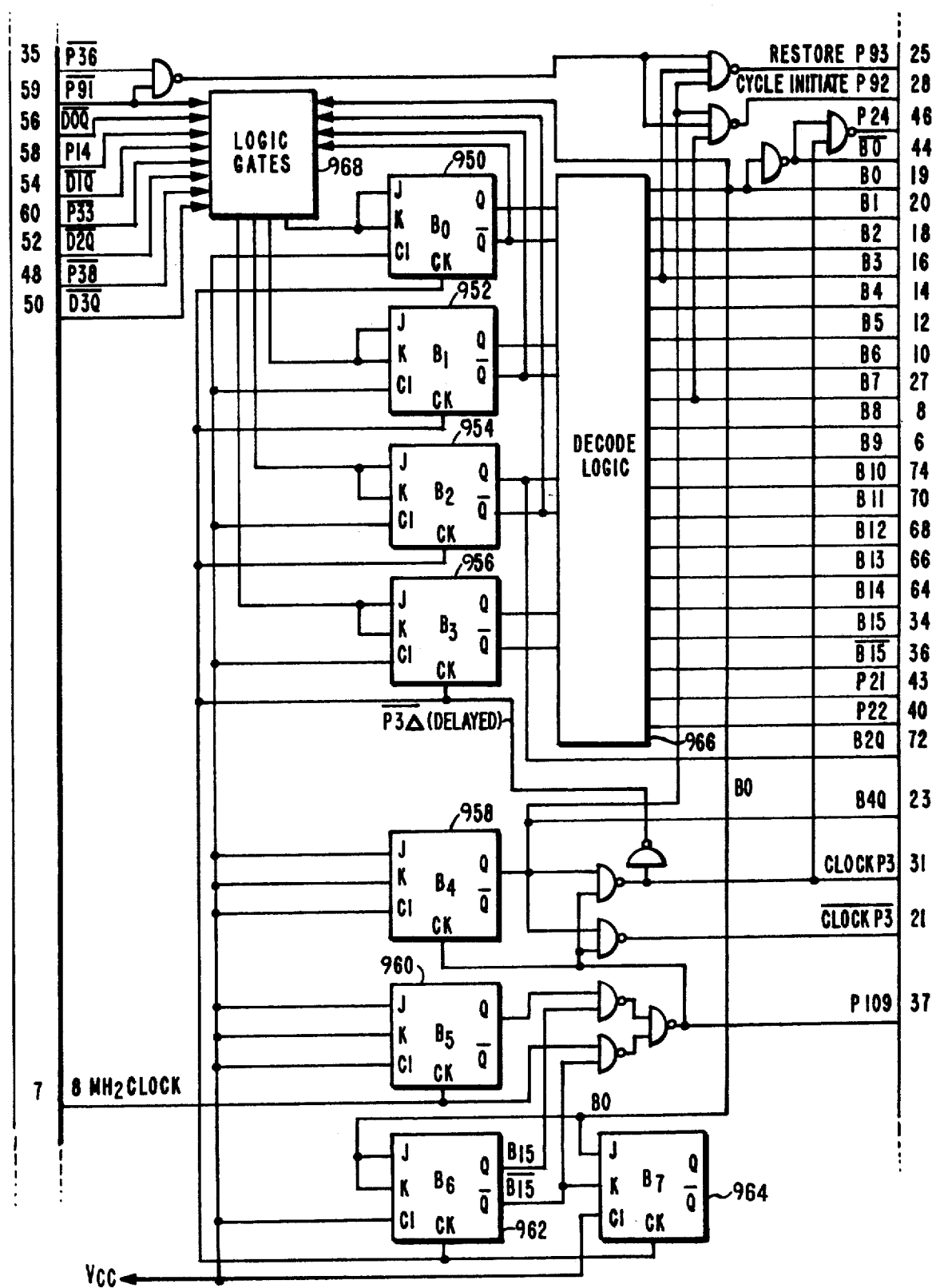
FIG. 9C is a schematic and block diagram representation of the B logic circuit board.
Figure 9D:
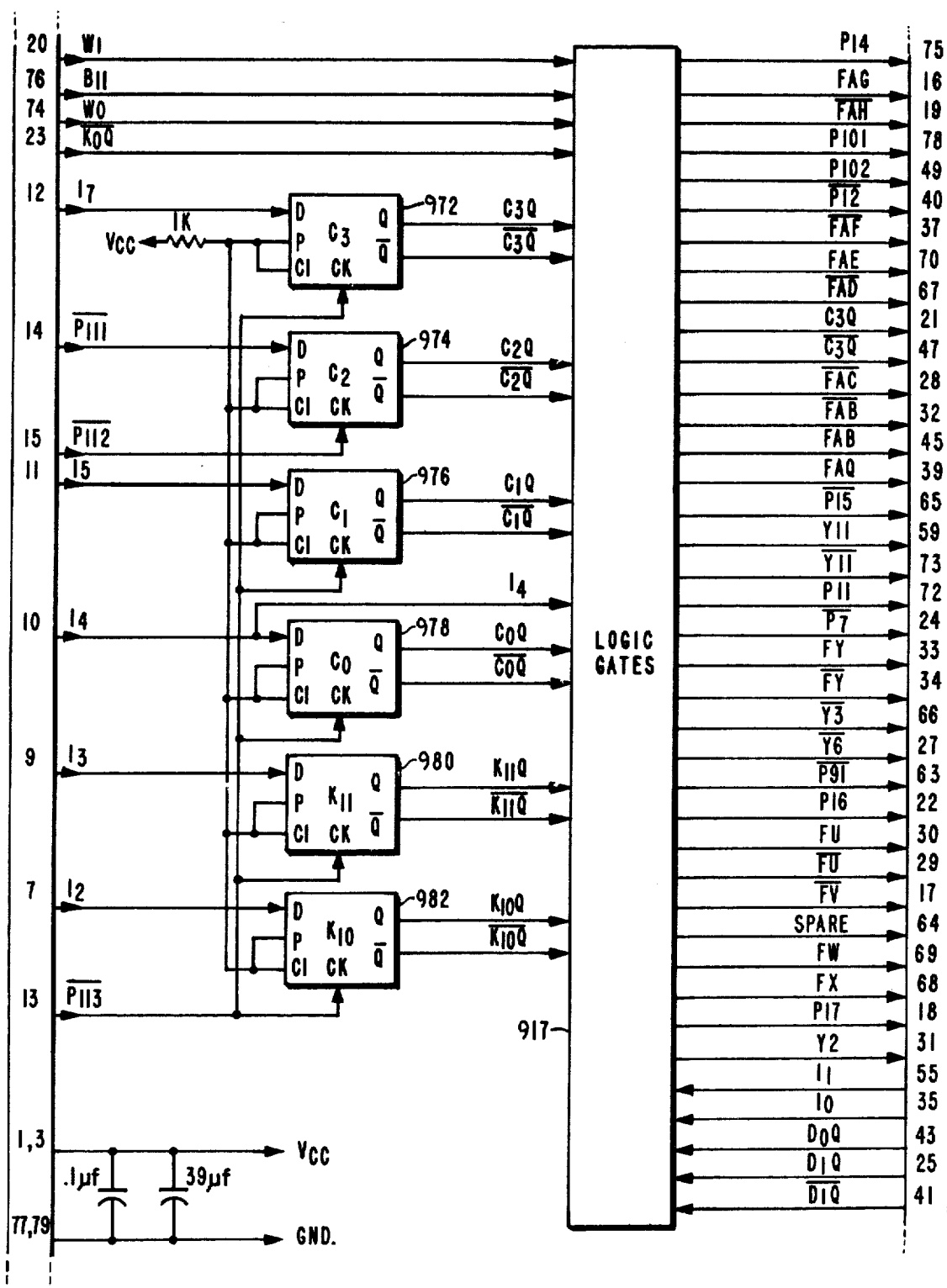
FIG. 9D is a schematic and block diagram representation of the C logic circuit board.

The basic timing functions of the data processor 112 are performed by a word timer 104 (FIG. 1B) and $W_0$–$W_2$ (FIG. 9G) and a bit timer 106 (FIG. 1B) and $B_0$–$B_3$ (FIG. 9C). The fundamental synchronization of the central processor 112 is provided by an 8 MHz clock signal (FIG. 9C) which is included as part of the control logic 102. The synchronizing clock signal is an asymmetric squarewave, the positive portion of which is designated $P_3$ and the negative portion of which is designated $\bar{P}_3$. The asymmetrical character of the clock signal permits a longer clock period for stabilization of propogation delays without sacrifice of processing speed. The word timer 104 (FIG. 1B) and $W_0$–$W_3$ (FIG. 9G) is a three-bit counter $W_0$–$W_2$ (FIG. 9G) with associated decode logic. It counts from 0 to 7 as the data processor cycles through the micro operations during the performance of an instruction with each micro operation being performed in a different word time. The associated decode logic provides eight output lines, each being true during one of the eight different counting states of the word timer 104 (FIG. 1B) and $W_0$–$W_2$ (FIG. 9G). These output signals are used by the control logic 102 (FIG. 1B) including logic gates 931 (FIG. 9G) for sequencing the data processor through the micro operations associated with an instruction. The bit timer 106 (FIG. 1B) and $B_0$–$B_3$ (FIG. 9C) is a four-bit binary counter $B_0$–$B_3$ (FIG. 9C) with associated decode logic. The bit timer 106 (FIG. 1B) and $B_0$–$B_3$ (FIG. 9C) counts down from 15 thru 0 and consequently the associated decode logic 966 (FIG. 9C) has 16 output lines $B_0$–$B_{15}$ (FIG. 9C), each going true during a different one of the 16 possible counts of the bit timer 106 (FIG. 1B) and $B_0$–$B_3$ (FIG. 9C). The bit timer 106 (FIG. 1B) and $B_0$–$B_3$ (FIG. 9C) provides sequencing and timing within a given micro operation or word time.

An accumulator (A-register) 108 (FIG. 1B) and 930 (FIG. 9A) is the basic arithmetic register and is used as the repository of the results of arithmetic and logical operations. It is also the source and destination of the input/output (I/O) parameters. The A-register 108 (FIG. 1B) and 930 (FIG. 9A) is a 16-bit serial in, serial out shift register Associated with the A-register 108 (FIG. 1B) and 930 (FIG. 9A) is a serial full adder 932 (FIG. 9A) which in FIG. 1B is included within the control logic 102.

A scratch pad memory (SPM) 170 (FIGS. 1B and 9H) provides storage for intermediate parameters such as computational results, return addresses, indexes and other pertinent information. The SPM 170 (FIGS. 1B and 9H) provides rapid internal storage without the need for transferring data to the main memory 130. It is a group of 32 16-bit serial in, serial out registers which are divided into two pages with 16 registers 929 (FIG. 9H) on each page. Paging is accomplished by toggling the $I_1$ flip-flop (FIG. 9I) which is automatically set to page 0 when the power is turned on. When the SPM 170 (FIGS. 1B and 9H) is set to page 0, the data processor acts as if page 1 did not exist; and similarly, when the SPM is set to page 1, the data processor acts as if page 0 did not exist. All of the SPM registers can be used for the storage of information, but some of them are primarily associated with specific functions to increase the efficiency of the data processor. The $SPM_0$ register is automatically assumed and need not be programmed in conjunction with the TX instruction. The $SPM_2$ register is used for the return address associated with the execution of transfer-type instructions. In addition, the $SPM_2$ register is used as the intermediate register for operands obtained from the constant memory portion of the main memory. The first eight SPM registers can be used for index or TX instructions in addition to scratch pad operations.

A memory address register (M-register) 172 (FIGS. 1B and 9B) holds the 12-bit address of $M_0Q$–$M_9Q$, $\overline{M_{10}Q}$ and $\overline{M_{11}Q}$ (FIG. 9B) of an eight-bit byte to be accessed from the program memory. The M-register 172 (FIGS. 1B and 9B) is a 12-bit shift register having the capacity to address up to 4,096 different memory locations. It has a serial input $M_{11}D$ (FIG. 9B) and both serial and parallel outputs $M_0Q$–$M_9Q$, $\overline{M_{10}Q}$ and $\overline{M_{11}Q}$ (FIG. 9B). Associated with the M-register 172 (FIGS. 1B and 9B) but represented as being within the control logic 102 is a serial full adder 939 (FIG. 9B) which increments the M-register 172 (FIGS. 1B and 9B) to access sequential instructions or, as applicable, the next two bytes of in-line instructions. The M-register 172 (FIGS. 1B and 9B) is incremented by two for a TX instruction when the condition of that transfer is not met, resulting in a skip of two bytes. The M-register 172 (FIGS. 1B and 9B) is incremented by three for a skip-on-discrete (SD) instruction. The M-register 172 (FIGS. 1B and 9B) is exchanged with the $SPM_2$ register for transfer-type instructions and exchanged with a data address register (D-register) 174 (FIG. 1B) and 986 (FIG. 9E) to access operands from the main memory. The M-register 172 (FIGS. 1B and 9B) is also exchanged with the $SPM_2$ register at the start of an ST instruction which causes the contents of the A-register 108 (FIG. 1B) and 930 (FIG. 9A) to be stored in the main memory when implemented with a core memory.

The data address register (D-register) 174 (FIG. 1B) and 986 (FIG. 9E) is a 12-bit shift register 186 (FIG. 9E) that usually contains an operand address and is used to select: (a) SPM register, (b) I/O channel, and (c) number of shifts, depending upon the type of instruction being executed. The D-register 174 (FIG. 1B) and 986 (FIG. 9E) has a serial input $D_{11}$ (FIG. 9E) and serial output $D_0Q$ (FIG. 9E) with the eight least significant bits $D_0Q$–$D_7Q$ (FIG. 9E) having parallel outputs in addition.

A C-register 176 (FIG. 1B) is composed of six flip-flops designated $C_3,C_2,C_1,C_0,K_{11}$, and $K_{10}$ (FIG. 9D) which store the six most significant bits of an eight-bit instruction byte obtained from program memory. The flip-flops $C_3$ through $K_{10}$ store the instruction bits designated $I_7$, $I_6$ (included in the P111 signal), $I_5$, $I_4$, $I_3$ and $I_2$ respectively as received from the main memory interface lines (I). These instruction bits are held by the C-register 176 (FIGS. 1B and 9D) during the performance of an instruction to control the sequence of micro operations executed during the performance of the instruction.

An element designated K-register 178 (FIGS. 1B and 9F) is a group of miscellaneous flip-flops for various functions. The $K_0$, $K_1$ and $K_2$ flip-flops (FIG. 9F) are used to control sequencing through the micro operations. The $K_1$ flip-flop is also used to store the sign of the operand in the A-register 108 (FIG. 1B) and 930 (FIG. 9A) and the sign of a decremented number during a TX instruction. The $K_2$ flip-flop is also used to extend the A-register during a shift left operation where the $K_2$ register acts as the $A_{-1}$ stage of the A-register. The $K_3$, $K_4$, and $K_5$ flip-flops (FIG. 9F) may be grouped together and designated the KA-register and may be used to store the address of the index. The KA-register is also used as an extension of the A-register during a shift left operation with $K_3$ as the $A_{-2}$ stage, $K_4$ as the $A_{-3}$ stage, and $K_5$ as the $A_{-4}$ stage of the A-register 108 (FIG. 1B) and 930 (FIG. 9A). The $K_7$ flip-flop 938 (FIG. 9A) is used as a carry flip-flop in conjunction with the A-register 108 (FIG. 1B) and 930 (FIG. 9A) full adder 932 (FIG. 9A). It is also used in the FK micro operation in the transfer of the D-register 174 (FIG. 1B) and 986 (FIG. 9E) contents to the M-register 172 (FIGS. 1B and 9B) as a shift left operation to multiply the D-register word address by two to obtain the M-register byte address. The $K_8$ flip-flop 940 (FIG. 9A) is used as a carry flip-flop in conjunction with the M-register full adder 939 (FIG. 9A). As previously described, the $K_{10}$ and $K_{11}$ flip-flops 982 and 980 (FIG. 9D) form the two least significant bits of the C-register 176 (FIGS. 1B and 9D).

An element designated L-register 180 (FIG. 1B) is, like the K-register 178 (FIGS. 1B and 9F), a group of miscellaneous flip-flops performing control functions. The most significant is the $L_1$ flip-flop 910 (FIG. 9F) which controls turn-on and turn-off of the data processor.

Input/output (I/O) channels 183 (FIGS. 1B and 9I) include whole number and discrete channels. The whole number channels connect the A-register 108 (FIG. 1B) and 930 (FIG. 9A) with the various entities and extremities. The whole number I/O channels 183 (FIGS. 1B and 9I) are arranged in pairs so that as the output from the least significant bit ($A_0Q$) (FIGS. 9A and 9I) of the A-register 108 (FIG. 1B) and 930 (FIG. 9A) shifts information to an output channel (OW) with a corresponding input channel (IW) simultaneously shifting information into the A-register 108 (FIG. 1B) and 930 (FIG. 9A) through the input to the most significant bit ($A_{15}D$) (FIG. 9A).

A data path 184 provides two-way communication between the data processor and the main memory. This path carries the main memory address stored in the M-register and transfers operands to or from the main memory.

Micro-Operations

Figure 8A:
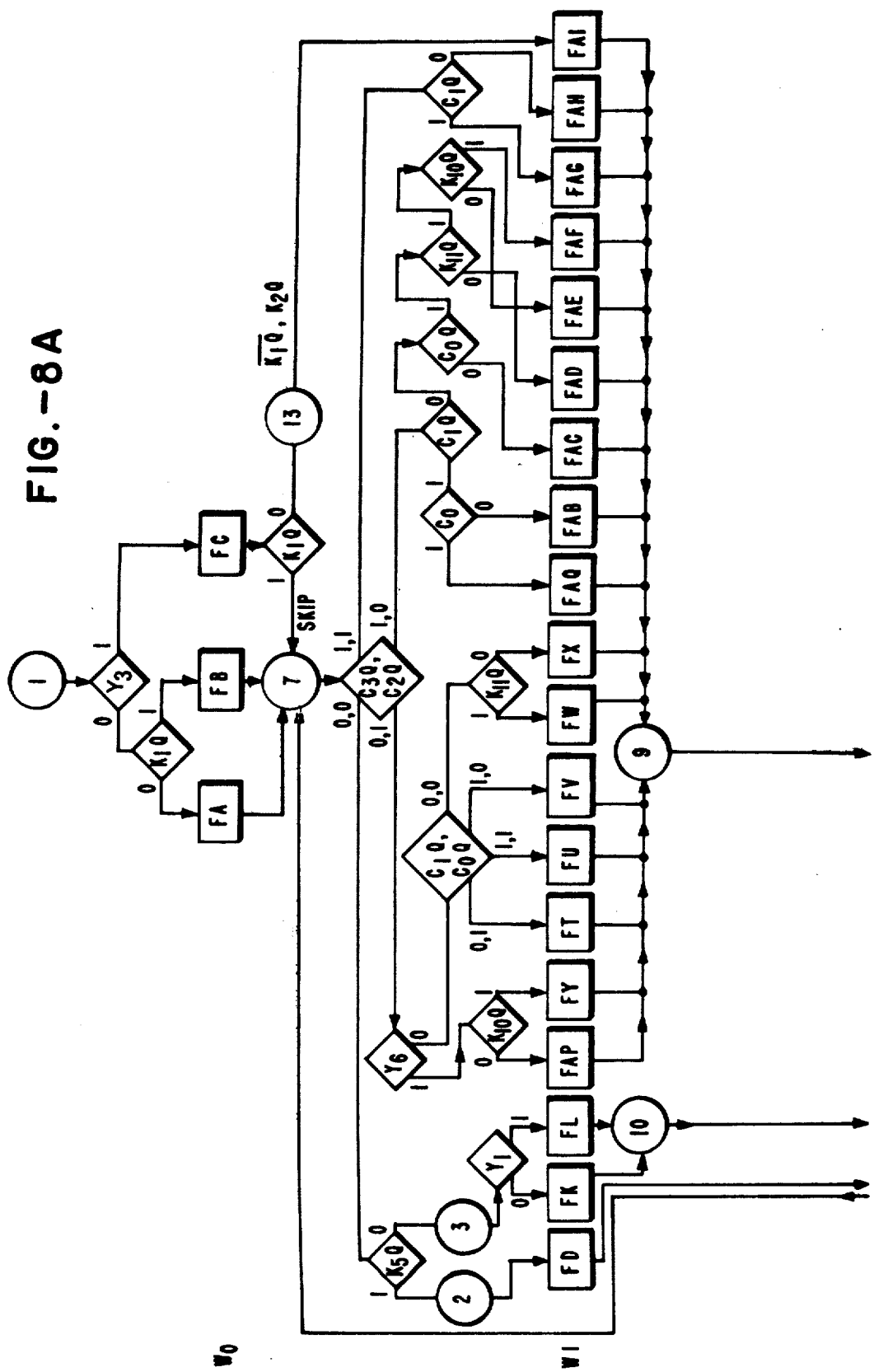
FIGS. 8A and 8B is a micro-operation flow chart for the data processor shown in FIG. 1B.
Figure 8B:
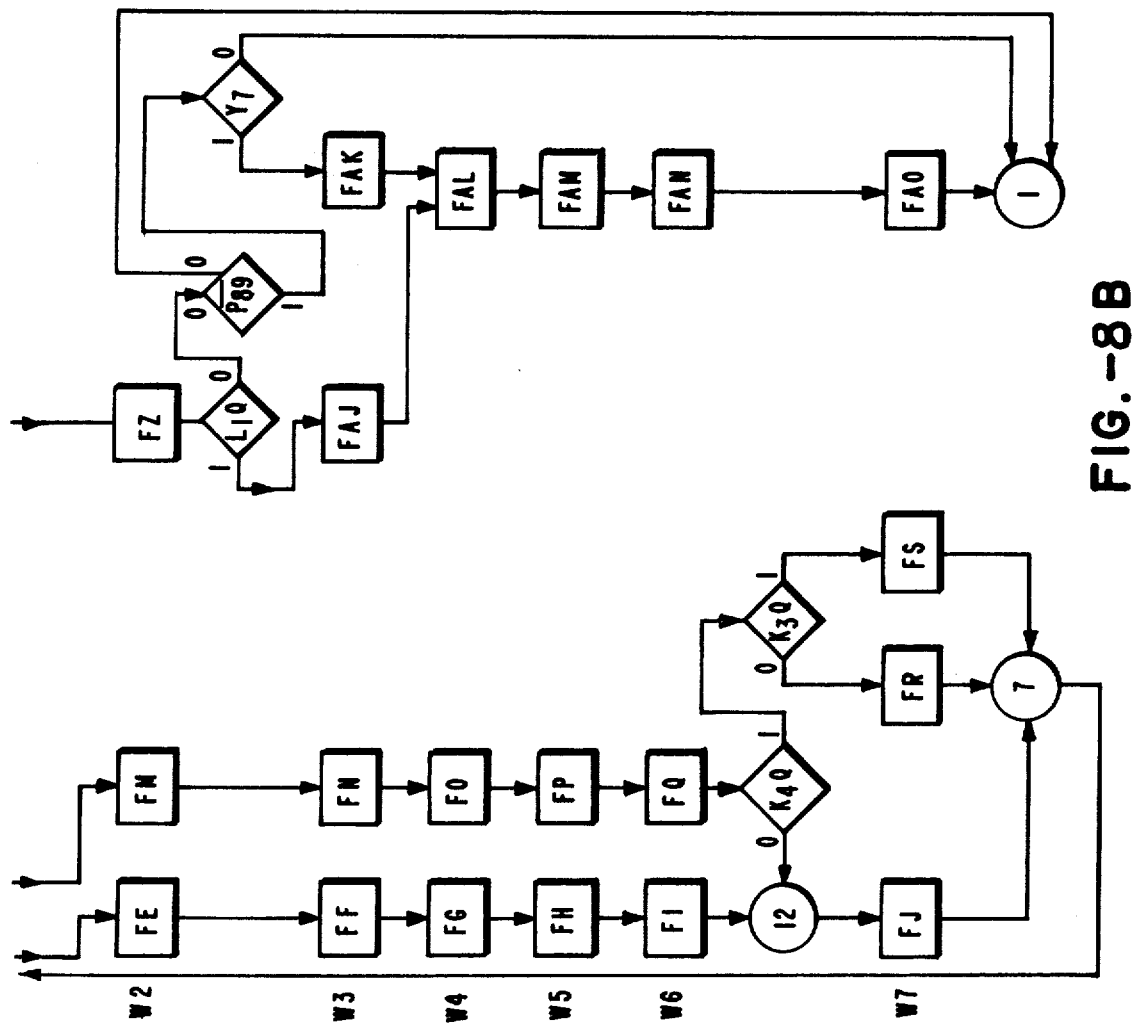

The operation of the data processor in carrying out an instruction can best be understood by examining the micro-operation flow chart shown in FIG. 8. The small rectangles represent micro-operations in accordance with the letter designation therein and the diamonds represent alternative conditions. If the condition or function contained within a diamond is true, the path designated 1 is taken. Otherwise, the path designated 0 is taken. The micro-operations are arranged in parallel rows according to the word time in which they occur. For instance, the FA, FB and FC micro-operations occur in word time W0, while the row of micro-operations beginning with FD and FK occur during the W1 word time. Each micro operation consists of one or more bit times to define the number of clock pulses used to execute that micro-operation. The word and bit times are presented with the following description of each micro-operation and summarized in Table V. The circled numbers are provided as references for ease of understanding and discussion.

During the execution of a program instruction, the data processor begins at point 1 at the top center of FIG. 8. The first branch condition is $$Y3 = \overline{C_3Q} \cdot \overline{C_2Q} \cdot C_1Q \cdot \overline{C_0Q} \cdot \overline{K_{11}Q} \cdot K_{10}Q \cdot I_1 \cdot \overline{I_0}$$

which represents the operation code for a TX instruction. If this term is true, the FC micro-operation is performed; if not true, a second control condition is tested. If flip-flop $K_1$ is in the 0 state, the FA micro-operation is executed and if it is in the 1 state, the FB micro-operation is executed. In similar fashion, a series of micro-operations are executed in accordance with the programmed instruction until the micro-operation FZ is completed. At this point the power-interrupt flip-flop $L_1$ determines whether or not the execution of programmed instructions continues to reference point 1. If the $L_1$ flip-flop is in the 1 state indicating an interrupt, a series of micro-operations is entered which place the return address in $SPM_2$ and loads the interrupt routine address into the M-register. If the $L_1$ flip-flop is in the 0 state indicating a non-interrupt condition, the processor returns to point 1 and begins the execution of another program instruction unless an X5 signal indicates that there is an external interrupt. If there is an external interrupt, the data processor ignores it, returning to point 1 unless the interrupt override flip-flop $L_3$ is true and the flip-flop $K_1$ is in the false state.

Each micro-operation will now be described in detail including the logical equations (summarized in Table III) which determines whether a micro-operation is true or false, the word time in which it occurs (summarized in Table V), the bit times in each micro-operation (summarized in Table V), a brief written description of the micro-operation, and a shorthand notation of what functional operations are performed by each micro-operation. In describing the micro-operations and throughout this application, a flip-flop or register bit designation followed by a Q indicates an output. If there is no bar over the term, the true or 1 state of the output is indicated; and if there is a bar over the term, the 0 or false state of the output is indicated. Similarly, a flip-flop or register bit designation followed by a D, T. J, or K indicates the input to the designated flip-flop and the flip-flop synchronizing clock pulse input is designated "clock". For instance, the term $L_1T$ indicates the toggle input to the $L_1$ flip-flop while the term $\overline{A_0Q}$ indicates a 0 or false output from the $A_0$ bit of the A-register which is the least significant bit. In addition, the following commonly used symbols will be used throughout this application:

| Symbol | Description of Symbol |
| --- | --- |
| ( ) | Parentheses denote contents of a register. |
| [ ] | Square brackets denote a portion of a register, the contents of which has a functional dependence upon a register. Thus I[D] means instruction part of the D-Register. Op[D] means operation part of D-Register. Ad[M] means address part of M-Register. Sn[A] and Mg[A] means sign and magnitude parts of A-Register, respectively. |
| M<A> | This symbol denotes a location of a memory word addressed by the A-Register. |
| (M<A>) | This symbol denotes the contents of a memory word addressed by the A-Register. |
| → | Denotes transfer of a word from one register to another. Thus, (A)→M means that the contents of the A-Register is transferred to the M-Register. (A)→PM<M> means that the contents of the A-Register is transferred to the program memory location addressed by the M-Register. |

-continued

| Symbol | Description of Symbol |
|---|---|
| + | This symbol represents a logical-OR operation. |
| . | This symbol represents a logical-AND operation. |
| : | Colon following a variable (representing a state or the command) denotes the occurrence of the subsequent statement when the value of the variable is 1. |
| PM | Program (main) memory which may be a core memory or an ROM. |
| SPM | Scratch pad memory. |

A detailed description of each micro-operation follows.

$$FA = WO \cdot \overline{K_1Q} \cdot (\overline{B15 \cdot Y3} + K_2Q)$$

The FA micro-operation occurs in the WO word time and has a length of 16 bit times. It is used for all instructions that are not preceded by an index byte nor are TX (decrement and transfer) instructions. The following operations take place during this micro-operation:

(M)+1→M at B11 thru B0. The address in the M-Register is incremented by 1 in the last 12 bit times to eliminate a race, if a ROM is used, with the scanout of the instruction bits ($I_i$) from the memory instruction register into the D-Register.

Ad[I]→D at B15 thru B11. If dynamic MOS-FET type integrated circuits are used, they are refreshed by recirculation at bit times B15 thru B0.

Sn[A]·$C_3Q$→$K_1$ at B0. The A-Register is recirculated to refresh it if MOS-FET type integrated circuits are used and to make the sign bit, which is the most significant bit, available to $K_1$ in case $C_3Q$ is true.

0→$K_3$,$K_4$, $K_5$ at B0.

0→$K_8$ at B0. This is the M carry flip-flop which is used to increment the address in the M-Register during this micro-operation and it is reset at B0.

$$FB = WO \cdot K_1Q \cdot (\overline{B15 \cdot Y3} + K_2Q)$$

The FB micro-operation occurs during the WO word time and has a duration of 16 bit times. It is used for all instructions preceded by an index byte with the exception of the TX (decrement and transfer) instruction. The following operations take place during this micro-operation:

(M)+1→M at B11 thru B0. The address stored in the M-Register is incremented during the last 12 bit times to eliminate a race, if a ROM is used, with the scanout of the contents of the memory instruction register (I) into the D-Register.

Ad[I]+(SPM<$K_3$, $K_4$, $K_5$>)→D at B15 thru B0. This operation clocks the index which was stored in the designated SPM-Register, causing it to be added to the instruction operand address. The sum is loaded into the D-Register.

$C_3Q$: Sn[A]→$K_1$ at B0. The A-Register is recirculated to refresh if dynamic MOS-FET type integrated circuits are used and to clock the sign bit of the A-Register, which is the most significant bit, into the $K_1$ flip-flop.

0→$K_3$,$K_4$ at B0.

Y2→$K_5$ at B0. The $K_3$, $K_4$ and $K_5$ flip-flops hold the address of the selected SPM-Register during this micro-operation and are reset at the end. The Y terms are defined in Table II.

0→$K_7$ at B0. This is the A carry flip-flop which is not used during this micro-operation.

0→$K_8$ at B0. This is the M carry flip-flop which is used to increment the address stored in the M-Register and is reset at B0.

$$FC = WO \cdot (B15 \cdot \overline{C_3Q} \cdot \overline{C_2Q} \cdot C_1Q \cdot \overline{C_0Q} \cdot \overline{K_{11}Q} \cdot K_1 \cdot 0Q \cdot I_1\overline{I_0} + K_2Q)$$

The FC micro-operation occurs during the WO word time and has a duration of 16 bit times. It is used for all TX (decrement and transfer) instructions. The operations executed during this micro-operation are as follows:

(M)+1→M at B11 thru B0. The address in the M-Register is incremented in the last 12 bit times to eliminate a race, if a ROM is used, with the scanout of the instruction bits ($I_i$) from the memory instruction register into the D-Register.

Ad[I]→D at B15 thru B11. The address portion of the memory instruction register (I) is scanned into the D-Register during the last six bit times.

The SPM-Registers are circulated to refresh them if dynamic MOS-FET type integrated circuits are used.

0→$K_3$,$K_4$,$K_5$ at B0. These flip-flops hold the address of the index register during this micro-operation and are reset at B0.

0→$K_7$ at B0. This is the A-Register carry flip-flop and is reset at B0.

0→$K_8$ at B0. This is the M-Register carry flip-flop and is reset at B0.

$$FD = \overline{C_3Q} \cdot \overline{C_2Q} \cdot K_5Q \cdot W1$$

The FD micro-operation occurs at word time 1 and has a duration of 12 bit times. It is used for a core memory ST (store) instruction. The operations executed during this micro-operation are as follows:

(SPM<2>)$_{lsh}$→M at B11 thru B0. The 12 least significant bits of the SPM-2 Register are clocked into the M-Register at these two registers are interchanged.

(M)→SPM<2> at B11 thru B0. The contents of the M-Register is clocked into the 12 most significant bit positions of the SPM-2 Register as part of the interchange of these two registers.

(A)$_{lsh}$→A$_{msh}$ at B11 thru B4.

(A)$_{lsh}$→D$_{msb}$ at B11 thru B4.

(A)$_{msh}$→A$_{lsh}$ at B11 thru B4. During the first eight bit times the A-Register is half circulated, moving the most significant half (msh) to the least significant half (lsh) and the least significant half to the most significant half. At the same time, the contents of the least significant half of the A-Register are transferred to the eight most significant bit positions (msb) of the D-Register.

0,0,0,0→D at B3 thru B0. During the last four bit times, the operand stored in the most significant bit positions of the D-Register are shifted into the least significant bit positions and four zeros are shifted into the D-Register.

$$FE = \overline{C_3Q} \cdot \overline{C_2Q} \cdot K_5Q \cdot W2$$

The FE micro-operation occurs during the W2 word time and has a duration of eight bit times. It is used for a core memory ST (store) instruction. The operations executed within this micro-operation are as follows:

(D)$_{lsb}$→PM<M> at B7 thru B0

Write Strobe at B7. This write strobe at the beginning of the micro-operation permits the eight least significant bits of the D-Register to be clocked into the memory as they are clocked out of the D-Register.

0→SPM<2> at B7 thru B4. The contents of the M-Register transferred to the most significant bit positions during the FD micro-operation are shifted into the 12 least significant bit positions.

$$FF = \overline{C_3Q} \cdot \overline{C_2Q} \cdot K_5Q \cdot W3$$

The FF micro-operation occurs during the W3 word time and has a duration of 1 bit time. It is used to fill out the word times and no operations take place during this micro-operation.

$$FG = \overline{C_3Q} \cdot \overline{C_2Q} \cdot K_5Q \cdot W4$$

The FG micro-operation occurs during the W4 word time and has a duration of 12 bit times. It is used with a core memory ST (store) instruction and loads the second operand byte into the D-Register while incrementing the M-Register to address the main memory location where the second byte is to be stored. The operations performed within this micro-operation are as follows:

(M)+1→M at B11 thru B0.

(A)$_{lsh}$→A$_{msh}$ at B11 thru B4. This completes the recirculation of the A-Register begun in the FD micro-operation.

(A)$_{lsh}$→D$_{msb}$ at B11 thru B4. As recirculation of the A-Register is completed, the second byte of the operand is recirculated and shifted into the most significant bit positions of the D-Register.

0→D at B3 thru B0. The second byte of the operand is shifted into the eight least significant bit positions and zeros are shifted into the most significant bit positions of the D-Register.

0→K$_8$ at B0. This is the M carry flip-flop which is reset after the M-Register is incremented.

$$FH = \overline{C_3Q} \cdot \overline{C_2Q} \cdot K_5Q \cdot W5$$

The FH micro-operation occurs during the W5 word time and has a duration of eight bit times. It is a continuation of a core memory ST (store) instruction and places the second byte of the operand into core memory. The operations executed during this micro-operation are as follows:

Write Strobe at B7.

(D)$_{lsb}$→PM<M> at B7 thru B0. Following a Write Strobe, the second byte of the operand is shifted from the D-Register into the location in core memory addressed by the M-Register.

$$FI = \overline{C_3Q} \cdot \overline{C_2Q} \cdot K_5Q \cdot W6$$

The FI micro-operation occurs during the W6 word time and has a duration of eight bit times. It is used to fill out the eight word times of a core memory ST (store) instruction cycle and no functions are executed.

$$FJ = \overline{C_3Q} \cdot \overline{C_2Q} \cdot (\overline{K_4Q} + K_5Q) \cdot W7$$

The FJ micro-operation occurs during the W7 word time and has a duration of 12 bit times. This micro-operation sets the necessary control flip-flops to cause the FY or FAP micro-operations to be executed next. The functions executed are:

0001→D$_3$D$_2$D$_1$D$_0$ at B12 thru B0. This makes Y6 true so that the proper branch will be followed after point 7 on the micro-operation flow chart, FIG. 8.

1→C$_2$ at B0. This sets the C$_3$, C$_2$ flip-flops to the 0, 1 state causing the proper micro-operation flow path to be followed after point 7 on the micro-operation flow chart, FIG. 8.

0→K$_1$,K$_2$,K$_3$,K$_4$,K$_5$ at B0.

0,0,1→W$_2$,W$_1$,W$_0$ at B0. The word timer is set to word time 1 to cause the next micro-operations executed to be the FAP and FY micro-operations which follows.

$$FK = \overline{C_3Q} \cdot \overline{C_2Q} \cdot K_5Q \cdot (B11 \cdot Y1 + K_3Q) \cdot \overline{FAJ} \cdot W1$$

The FK micro-operation occurs in the W1 word time and has a duration of 12 bit times. It is used exclusively for the instructions that obtain the operand or transfer address from program memory. This micro-operation is used during the DP, BP, XP, and AP instructions that obtain the operand from the constant memory portion of the program memory. This micro-operation is used to place the operand word address, multiplied by two to provide the operand byte address, in the M-Register and to preserve the next instruction-address in the D-Register. The operations which are executed are as follows:

(D)→K$_7$ at B11 thru B0.

(K$_7$)→M at B11 thru B0.

(M)→D at B11 thru B7. The effect of these three transfers is to exchange the contents of the D- and M-Registers. By shifting the contents of the D-Register indirectly through the K$_7$ flip-flop to the M-Register, the contents of the M-Register is shifted 1 bit to the left (multiplied by 2) and the most significant bit is stored in the K$_7$ flip-flop at the end of this micro-operation. This multiplication by 2 converts a word address to a byte address.

$$FL = \overline{C_3Q} \cdot \overline{C_2Q} \cdot K_5Q \cdot (B11 \cdot Y1 + K_3Q) \cdot W1$$

The FL micro-operation occurs in word time 1 and has a duration of 1 bit time. It sets selected flip-flops to control subsequent micro-operations. The operations executed are:

0→K$_1$ at B0.

1→K$_3$ at B0.

Y4→K$_4$ at B0.

$$FM = \overline{C_3Q} \cdot \overline{C_2Q} \cdot K_5Q \cdot \overline{K_1Q} \cdot W2$$

The FM micro-operation occurs at word time 2 and has a duration of 8 bit times. It is used to access a first of the two bytes for the instructions that use the FK or FL micro-operations. The operations executed are as follows:

Read Strobe at B7.

(PM<M>)→I.

Restore Strobe at B3.

$$FN = \overline{C_3Q} \cdot \overline{C_2Q} \cdot K_5Q \cdot \overline{K_1Q} \cdot W3$$

The FN micro-operation occurs at word time 3 and has a duration of eight bit times. It causes an eight-bit byte accessed from the program memory in the FM micro-operation to be scanned out of the memory data lines (I) into the SPM-2 Register. The operations executed are as follows:

(I)→SPM<2>$_{msh}$ at B7 thru B0.

(SPM<2>$_{msh}$)→SPM<2>$_{lsh}$ at B7 thru B0. These steps scan the contents of the I lines into the most significant half of the SPM-2 Register and the most significant half of the SPM-2 Register into the least significant half of the SPM-2 Register.

$$FO = \overline{C_3Q} \cdot \overline{C_2Q} \cdot \overline{K_5Q} \cdot \overline{K_1Q} \cdot W4$$

The FO micro-operation occurs in word time 4 and has a duration of 12 bit times. It is used to increment the M-Register to permit the second of the two bytes to be accessed from program memory. This operation can be executed simultaneously with the FN micro operation if a core memory is used, but is performed after the FN micro-operation to permit a ROM to be used in place of a core memory. The operations executed are as follows:

(M)+1→M at B11 thru B0.

0→K$_8$ at B0. The M carry flip-flop is used to increment the M-Register and then reset at the end of this micro-operation.

$$FP = \overline{C_3Q} \cdot \overline{C_2Q} \cdot \overline{K_5Q} \cdot \overline{K_1Q} \cdot W5$$

The FP micro-operation occurs in word time 5 and has a duration of eight bit times. It is used to access the second byte from program memory. The operations executed are as follows:

Read Strobe at B7.

(PM<M>)→I.

Restore Strobe at B3. This micro-operation transfers the second byte into the memory data lines (I) and then restores the information to the memory.

$$FQ = \overline{C_3Q} \cdot \overline{C_2Q} \cdot \overline{K_5Q} \cdot \overline{K_1Q} \cdot W6$$

This micro-operation occurs in word time 6 and has a duration of eight bit times. The second byte is scanned out of the I lines and into the SPM-2 Register. The operations executed are as follows:

(I)→SPM<2>$_{msh}$ at B7 thru B0.

(SPM<2>$_{msh}$)→SPM<2>$_{lsh}$ at B7 thru B0. These operations complete the transfer of the two bytes from memory into the SPM-2 Register.

$$FR = \overline{C_3Q} \cdot \overline{C_2Q} \cdot \overline{K_5Q} \cdot K_4Q \cdot \overline{K_3Q} \cdot \overline{K_1Q} \cdot W7$$

The FR micro-operation occurs in word time 7 and has a duration of 12 bit times. It is used to set the proper flip-flops to guide the data processor through subsequent micro-operations in executing the instruction. This operation could be executed simultaneously with the FQ micro-operation if a core memory is used, but is performed after the FQ micro-operation to permit a ROM to be used in place of a core memory. The operations executed are as follows:

0,0,1,0→D at B11 thru B0. A binary 2 is shifted into the least significant bit positions of the D-Register to address the SPM-2 Register which contains the two operand bytes being processed.

1→C$_2$ at B0.

0,0→K$_2$,K$_1$ at B0.

0,0,0→K$_5$,K$_4$,K$_3$ at B0.

$$FS = \overline{C_3Q} \cdot \overline{C_2Q} \cdot \overline{K_5Q} \cdot K_4Q \cdot K_3 \cdot Q \cdot \overline{K_1Q} \cdot W7$$

The FS micro-operation occurs in word time 7 and has a duration of twelve bit times. It is used to set the proper flip-flop to guide the data processor through subsequent micro-operations in executing the instructions.

0,0,1,0→D at B11 through B0. A binary 2 is shifted into the least significant bit of the D-Register to address the SPM-2 Registers which store the two operand bytes.

1→C$_2$ at B0.

0,0→K$_2$,K$_1$ at B0.

0,0,0→K$_5$,K$_4$,K$_3$ at B0.

$$FT = Y38 \cdot \overline{C_1Q} \cdot C_0Q$$

The FT micro-operation occurs in word time 1 and has a duration of 16 bit times. It is used to add the contents of the A-Register to the contents of an SPM-Register addressed by the D-Register which contains an operand and stores the sum in the A-Register. The contents of the SPM-Register are preserved. The executed operations are as follows:

(A)+($\overline{SPM<D>}$)→A at B16 thru B0.

(SPM<D>)→SPM<D> at B16 thru B0.

(B0·C$_{n+1}$)→K0 at B0. Any overflow from the addition operation is stored in the K$_0$ flip-flop.

0→K$_7$ at B0. The A adder carry flip-flop is used during this micro-operation and reset at B0.

$$FU = Y38 \cdot C_1Q \cdot C_0Q$$

The FU micro-operation occurs at word time 1 and has a duration of 16 bit times. It is used to subtract an operand stored in the SPM-Register from the contents of the A-Register and stores the difference in the A-Register. The contents of the SPM-Register are preserved. Subtraction is implemented by adding the contents of the A-Register to the ones complement of the operand in the SPM-Register and also adding a least significant bit to convert the ones complement to a twos complement number. The executed operations are as follows:

(A)+($\overline{SPM<D>}$)+(1×2$^{-n}$)→A at B16 thru B0.

(B0·C$_{n+1}$)→K0 at B0. Store overflow.

0→K$_7$ at B0. The A adder carry flip-flop is used during this micro-operation and reset upon its completion.

(C$_n$+1)→K$_8$ at B0. The final carry term is stored in the carry flip-flop for the M adder.

$$FV = Y38 \cdot C_1Q \cdot \overline{C_0Q}$$

The FV micro-operation occurs in word time 1 and has a duration of 16 bit times. It is used for index instructions to transfer the address of the SPM-Register containing the operand from the D-Register to the K$_5$, K$_4$, and K$_3$ flip-flops. This makes the D-Register available for the operand address of the next instruction. The executed micro-operations are as follows:

1=K$_1$ at B0. The K$_1$ flip-flop is one set to identify an index byte. This will insure that the next instruction will be processed through the FB micro operation, which adds the contents of the selected SPM-Register (identified by the contents of the K$_5$, K$_4$, and K$_3$ flip-flops) to the operand address and stores the sum into the D-Register.

(D$_2$,D$_1$, D$_0$)→K$_5$,K$_4$,K$_3$ at B0.

$$FW = Y38 \cdot \overline{C_1Q} \cdot \overline{C_0Q} \cdot K_{11}Q$$

The FW micro-operation occurs in word time 1 and has a duration of 16 bit times. It is used to perform the logical AND operation between the contents of the A-Register and an operand stored in an addressed SPM-Register. The executed operations are as follows:
(A)·(SPM<D>)→A at B15 thru B0.
(SPM<D>)→SPM<D> at B15 thru B0.

$$FX = Y38 \cdot \overline{C_1Q} \cdot \overline{C_0Q} \cdot \overline{K_{11}Q}$$

The FX micro-operation occurs in word time 1 and has a duration of 16 bit times. It is used to EXCLUSIVE-OR the contents of the A-Register and an operand stored in an addressed SPM-Register and store the results in the A-Register. The contents of the addressed SPM-Register are preserved.
(A)⊕(SPM<D>)→A.
(SPM <D>)→SPM<D>.

$$FY = \overline{C_3Q} \cdot C_2Q \cdot C_1Q \cdot \overline{C_0Q} \cdot \overline{K_{11}Q} \cdot K_{10}Q \cdot D_0Q \cdot W1$$

The FY micro-operation occurs in word time 1 and has a duration of 16 bit times. It is used during transfer type instructions. The next instruction address, contained in the SPM-2 Register, is exchanged with the return address from the M-Register. Thus, the next instruction address for the transfer is placed in the M-Register and the return address is placed in the SPM-2 Register. The executed operations are as follows:
(SPM<2>)$_{1sh}$→M at B15 thru B4.
(M)→SPM<2>$_{1sb}$ at B15 thru B4.
0=SPM<2>$_{msb}$ at B3 thru B0.

$$FZ = (C_3Q + C_2Q) \cdot W2$$

The FZ micro-operation occurs in word time 2 and has a duration of eight bit times. It is used to access the next program instruction from the memory. The executed operations are as follows:
Read Strobe at B7.
Restore Strobe at B3.
Op[I]→C at B0.
$C_3Q \cdot L_1Q \cdot (\overline{K_1Q} + \text{interrupt}):0→K_1$ at B0.
$L_1Q + K_1Q \cdot \text{interrupt}:1→K_1$ at B0.
0ΣK₂ at B0.
C₃Q:0,0,0,0 = K₅,K₄,K₃ at B0.
I₃,I₂→K₁₁,K₁₀ at B0.

$$FAB = C_3Q \cdot \overline{C_2Q} \cdot C_1Q \cdot \overline{C_0Q} \cdot W1$$

The FAB micro-operation occurs in word time 1 and has a duration of 16 bit times. The contents of the A-Register are shifted to a selected output channel while the contents of a selected input channel are simultaneously shifted into the A-Register. Executed operations are as follows:
(A)→I/O<D> at B15 thru B0.
(I/O<D>)→A at B15 thru B0.

$$FAC = C_3Q \cdot \overline{C_2Q} \cdot \overline{C_1Q} \cdot \overline{C_0Q} \cdot W1$$

The FAC micro-operation occurs at word time 1 and has a duration of 16 bit times. It is used to store the contents of the A-Register in an addressed SPM-Register. The executed operations are as follows:
(A)→SPM<D> at B15 thru B0.
(A)→A at B15 thru B0. The A-Register is recirculated.

Sn[A]→K₁ at B0. The sign of the operand stored in the A-Register, which is the most significant bit, is placed in the K₁ flip-flop but not used.

$$FAD = C_3Q \cdot \overline{C_2Q} \cdot \overline{C_1Q} \cdot C_0Q \cdot \overline{K_{11}Q} \cdot W1$$

The FAC micro-operation occurs in word time 1 and has a duration of 16 bit times. It is used for a shift lift operation on the A-Register and is implemented by extending the least significant portion of the A-Register with flip-flops K₂, K₃, K₄ and K₅. The A-Register is then shifted right for 16 bit times through these extra four flip-flops. The number of shifts left is selected and implemented by recirculating the output from a selected K flip-flop back to the input of the A-Register. This effectively increases the recirculation path by the required number of bit time delays thereby implementing a left shift after the 16 clock pulses. For instance, if the output of the second flip-flop (K₃Q) is selected, the contents will be shifted left two positions, and if the third flip-flop (K₄) is selected, the output will be shifted left three positions. For the left shift, the sign bit is shifted into the least significant bit of the A-Register by preloading the K₂-K₅ flip-flops with the sign bit contained in the K₁ flip flop. The executed operations are as follows:
(K₁Q)→K₂-K₅ at B15.
(A$_i$)→A$_i$−1 at B15 thru B0.
(A₀Q)→K₂ at B15 thru B0.
(K₂Q)→K₃ at B15 thru B0.
(K₃Q)→K₄ at B15 thru B0.
(K₄Q)→K₅ at B15 thru B0.
$\overline{D_1Q}, \overline{D_0Q}$:(K₂Q)→A at B15 thru B0.
$\overline{D_1Q}, D_0Q$:(K₃Q)→A at B15 thru B0.
$D_1Q, \overline{D_0Q}$:(K₄Q)→A at B15 thru B0.
$D_1Q, D_0Q$:(K₅Q)→A at B15 thru B0.

$$FAE = C_3Q \cdot \overline{C_2Q} \cdot \overline{C_1Q} \cdot C_0 \cdot K_{11}Q \cdot \overline{K_{10}Q} \cdot W1$$

The FAE micro-operation occurs in word time 1 and has a variable duration ranging from 1 to 16 bit times. It is used for a right shift and is implemented by preloading the bit counter with the contents of the D-Register. The bit counter 1 then clocks the A-Register for the selected number of shifts. For the right shift, the sign bit is shifted into the most significant portion of the accumulator. Executed operations are as follows:
(A$_i$)→A$_i$−1 at B<D₃,D₂,D₁,D₀> thru B0.
(K₁)→A₁₅ at B<D₃,D₂,D₁,D₀> thru B0. The sign bit is loaded into the A-Register.

$$FAF = C_3Q \cdot \overline{C_2Q} \cdot \overline{C_1Q} \cdot C_0Q \cdot K_{11}Q \cdot K_{10}Q \cdot W1$$

The FAF micro-operation occurs in word time 1 and has a variable duration from 1 to 16 bit times. It is used for end around shift. The D-Register is used to set the bit timer to the selected number of end around shifts. The bit timer then clocks the A-Register as it counts down. The sign bit is placed in the most significant bit position of the A-Register at B0. The executed operations are as follows:
(A$_i$)→A$_i$−1 at B<D₃,D₂,D₁,D₀> thru B0.
(A₀)→A₁₅ at B<D₃,D₂,D₁,D₀> thru B0.

$$FAG = C_3Q \cdot C_2Q \cdot C_1Q \cdot W1$$

The FAG micro-operation occurs in word time 1 and has a duration of 12 bit times. It is used for the skip on discrete instruction. If the selected discrete is true, the M-Register is clocked and incremented by three. If the selected discrete is false, the M-Register is not clocked and is therefore not incremented. The executed instructions are as follows:

DSI $<D>$:(M)+3→M at B11 thru B0.

0→$K_8$ at B0. The M carry flip-flop is used to increment the M-Register and reset at the end of the micro-operation.

$$FAH = C_3Q \cdot C_2Q \cdot \overline{C_1Q} \cdot W1$$

The FAH micro-operation occurs in word time 1 and has a duration of 12 bit times. It is used to implement the discrete output instruction. The operation executed is as follows:

1→DSO $<D>$ at B11 thru B0.

$$FAI = \overline{C_3Q} \cdot \overline{C_2Q} \cdot K_2Q \cdot \overline{K_1Q} \cdot W1$$

The FAI micro-operation occurs in word time 1 and has a duration of 12 bit times. It is used during the decrement and transfer instruction when the contents of a selected index register has been decremented to a negative number. It should be noted that an alternate path is taken when the contents of the selected index register remain positive. This alternate path is through the FL micro-operation as with other transfer type instructions. The executed operations are as follows:

(M)+2→M at B11 thru B0.

1→$C_2$ at B0.

0=$K_8$ at B0. The M-carry register is used to increment the M-Register and reset to zero at the end of the micro-operation.

$$FAH = L_1Q \cdot W3$$

The FAJ micro-operation occurs in word time 3 and has a duration of 16 bit times. It is entered for a turn-on interrupt (identified by the $L_1Q$ signal) and is, effectively, a no operation. The operations executed are:

0→$L_1$ at B0.

$$FAK = \overline{L_1Q} \cdot \overline{P89} \cdot Y7 \cdot W3$$

The FAK micro-operation occurs in word time 3 and has a duration of 16 bit times. It is used for external interrupts and is entered if there is an external interrupt, $\overline{P89}$, and there is no interrupt disable, $L_3Q$, or there is a preceding index instruction identified by $K_1Q$. It acts as a spacer for the word counter and no operations take place.

$$FAL = K_1Q \cdot W4$$

The FAL micro-operation occurs in word time 4 and has a duration of 16 bit times. It is used for the start of the interrupt routine, preloading the M-Register with memory address $040_{16}$ and storing the return address in the SPM-2 Register. Operations executed are as follows:

$040_{16}$→M at B15 thru B0.

(M)→SPM$<2>_{lsb}$ at B15 thru B0.

$$FAM = K_1Q \cdot W5$$

The FAM micro-operation occurs in word time 5 and has a duration of eight bit times. It is used to access the contents of the program memory portion of the memory at location $040_{16}$, which is the start of the interrupt routine. Operations executed are as follows:

Read Strobe at B7.

Restore Strobe at B3.

(PM $<M=64>$)→I at B7.

Op[I]→$C_3,C_2,C_1,C_0,K_{11},K_{10}$ at B0.

0→$L_3$ at B0. The interrupt disable flip-flop is cleared.

$$FAN = K_1Q \cdot W6$$

FAN is no-op.

$$FAO = K_1Q \cdot W7$$

The FAO micro-operation occurs in word time 7 and has a duration of 12 bit times. It is effectively a no op, merely setting the control flip-flops for a new word time cycle. Operations executed are:

0→$W_2,W_1,W_0$ at B0. The word counter is reset.

0→$K_5,K_4,K_3,K_2,K_1$ at B0.

$$FAP = \overline{C_3Q} \cdot C_2Q \cdot Y6 \cdot \overline{K_{10}Q} \cdot W1$$

FAP is no-op.

$$FAQ = C_1Q \cdot C_0Q \cdot Y39$$

The FAQ micro-operation occurs in word time 1 and has a duration of 16 bit times. The contents of the selected SPM Register is preserved by recirculation and also transfer to the A Register.

(SPM $<D>$)→SPM D at B15 thru B0.

(SPM $<D>$)→A at B15 thru B0.

Initialization

During initialization of the data processor 12, the following operations are executed:

1. $L_1$ is in the true state due to the power turn-on condition.

2. FAJ is always automatically entered for start-up to initialize the following functions:

A. The M-Register is preset to the PM address $040_{16}$ in FAL.

B. All SPM Registers are cleared under program control.

C. The D-Register is located from PM$<M>$ = $040_{16}$.

D. The C-Register ($C_3,C_2,C_1,C_0,K_{11},K_{10}$) is loaded from PM$<M>$ = 040.

E. The PM Read and Restore Strobes are generated in FAM.

F. The A-Register is cleared under program control.

G. The $K_1$ flip-flop is cleared in FAO.

H. The $K_2$ flip-flop is cleared in FAO.

I. Flip-flops $K_5,K_4,K_3$ are cleared in FAO.

J. Flip-flops $K_8,K_7$, the M-Register and A-Register carry flip-flops are reset at every B0.

Discrete Outputs

The data processor 12 can generate discrete outputs (DO) to meet specific requirements under program control. The DO assignments are:

DO-0 Set interrupt enable.

DO-1 Provide clock pulses to ASR-33 (TELETYPEWRITER).

DO-2 Provides a clock to set the power turn-on interrupt, $L_1$. A DO-2 instruction (1100–0010) will be contained in program memory location $40_{16}$ to reset $L_1$ during power turn-on.

DO-3 Iteration timer reset.

DO-4 Trigger to $I_2$ latch, the discrete input 4 (DI-4) toggle. The $I_2$ flip-flop is automatically zero set during the power on sequence.

DO-5 Trigger to $I_3$ latch, the discrete input-5 (DI-5) toggle. The $I_3$ flip-flop is automatically zero set during the power turn-on sequence.

DO-6 Trigger to the $I_4$ latch, the discrete input-6 (DI-6) toggle. The $I_4$ flip-flop is automatically zero set during the power turn-on sequence.

DO-7 Intensity control.

DO-8 Toggles the $I_1$ flip-flop causing scratch pad memory paging.

DO-9 Main memory paging.

DO-10 Spare.

DO-11 Servo set.

Discrete Inputs

The data processor 112 can operate on a discrete input (DI) with a skip-on-discrete instruction under program control. The discrete inputs are various low frequency digital signals. The purpose of the discrete inputs is to define a status or condition. The DI assignments are:

DI-0 Spare.
DI-1 Skip unconditional.
DI-2 Skip on ASR-33 (TELETYPEWRITER).
DI-3 Skip on the sign of (A).
DI-4 Skip on $I_2Q$ latch (DO-4 trigger).
DI-5 Skip on $I_3Q$ latch (DO-5 trigger).
DI-6 Skip on $I_4Q$ latch (DO-6 trigger).
DI-7 Skip on logical overflow in A-Register.
DI-8 Used for troubleshooting.
DI-9 Skip on arithmetic carry from A-Register.
DI-10 Skip on positive.
DI-11 Skip on servo ready.

Interrupts

Interrupts may be added virtually without limit. All interrupts are logically ORed together (X5) to transfer operation of the data processor 112 to an interrupt subroutine starting in memory location $040_{16}$. The return address is preserved in SPM-2. The interrupt subroutine will scan the discrete interrupt inputs and operate on each interrupt.

The interrupt enable flip-flop ($L_3$) will automatically disable interrupts within interrupts, but may be set with a DO-0 after the return address in SPM-2 has been stored elsewhere under program control, thereby permitting interrupts within interrupts. The end of the interrupt subroutine requires the transfer to the return address, the setting of the interrupt enable flip-flop ($L_3$) if required, and the transfer indirect (TI) to the return address contained in SPM-2.

The interrupt enable flip-flop ($L_3$) may be used to preserve the contents of SPM-2 against the contingency of an interrupt to permit time shared use of SPM-2.

Date-Save

The power supply generates a C signal which indicates the power supply is out of tolerance limits and requests the data processor 112 to generate a data-save signal in the event of a power dropout. Following a delay of sufficient duration to insure the completion of a memory cycle, the data processor generates a data-save signal ($\overline{L_2Q}$) in response to the C signal generated by the power supply. The delay will range from 20 nanoseconds to 35 microseconds and will have an average duration of 7 microseconds. The data-save operation constitutes the power turn-off interrupt, where the C signal will always initiate a data-save function which will terminate normal computer operation.

Adaptive Memory Control

The data processor 112 incorporates an adaptive memory control that adds additional memory protection to insure that the power turn-on condition does not cause detrimental system operation and provide protection from loss of program. In the data processor, this power condition is detected and used to initiate a power interrupt ($L_1Q$); which forces the data processor to look at a specific memory address (040 HEXADECIMAL) by preloading this address into the M-Register. The data processor will continue to access this address until the power interrupt condition is alleviated. In prior art systems, the power interrupt is eliminated when the voltages come within tolerance. In this invention, adaptive techniques are used that insures that not only are the voltages back into tolerance levels, but memory can be properly accessed. This technique is implemented with a memory access interlock implemented by requiring that an instruction that generates a discrete output (DO-2) be located in the first location of the power interrupt program in memory. This discrete output (DO-2) instruction provides the adaptive interlock to insure that memory cannot be accessed before the power interrupt is exited.

Memory Protect

A memory protect scheme greatly reduces problems with loss of program and protects against the program wiping out part of the program. This is accomplished by logically processing the memory address register outputs to produce a signal P110 (Table II) disabling the write mode (associated with the memory read-write logic) when the M-Register is addressing protected parts of the memory. This technique effectively permits an electrically alterable (core type) memory to be configured as a read-only memory in selected locations for additional protection of the program stored in that memory.

Instruction Repertoire

The program instructions for the numerical control system 110 are encoded as 8-bit bytes, each byte being stored in a different program memory location of the program memory. The instructions may have multiple bytes, but most have a length of only 1 byte. Each instruction contains an operation code in the most significant portion, and, when required, an operand address in the least significant portion. Indexing is achieved with an index functional modifier byte preceding the instruction whose operand address is to be indexed. Operands can be located in any of the SPM Registers, the constant memory part of the program memory, or in the two program memory bytes following an instruction (in line).

Functional Modifier

The program instructions follow a functional modifier concept which yields a high degree of flexibility and economy. This concept permits conservation of memory by the use of short instructions without sacrifice of flexibility or capability. As an example, extensive indexing capability is available when required even though an index field is not required in an instruction.

This indexing capability is implemented by programming an index functional modifier prior to an instruction to be indexed. This functional modifier indicates that the following instruction is to be indexed and identifies the location of the index. A functional modifier may also be used to make available double precision shifting capability. The short instruction word length which is configured for efficient use of memory permits only enough instructions for single percision shifting operations. A double precision shift capability is implemented by preceding the shift instructions with a fundamental modifier to indicate that the subsequent shift instruction is a double precision shift. Thus, both single and double precision shifting capability may be implemented without use of excessively long instruction words.

Detailed Description of Instructions

For convenience of discussion, the instructions are divided into four categories A, B, C, and D. During the execution of Group A instructions, operands are obtained from the constant memory portion of the main memory with SPM-2 used as an intermediate working register. Therefore, SPM-2 contents must be expendable when using Group A instructions. The operand address pertains to the corresponding locations in the constant memory portion of the main memory, and are defined as double byte locations 0 through 15, but are indexable through many additional pages of double byte locations. Double byte operands are used because two 8-bit bytes are used for each 16 bit operand, each memory location storing one byte. Therefore operand word address 0 defines memory byte address locations 0 and 1, operand word address 1 defines memory byte address locations 2 and 3. Thus, twice the operand word address defines the first of the two operand byte address locations. Certain operand addresses pertain to the two bytes following the instruction. Constants and parameters can be stored in the main memory with the least significant half (msh) of a word in the second byte. The constant memory portion of the main memory is composed of many 16 word pages where each word is composed of two 8-bit bytes. The Group A instructions can be indexed to select required constants or parameters.

The Group A instructions are as follows:

1. LS (load SPM-2 with next two bytes) 0010-0001.

This is a three-byte instruction having the above operation code contained in the zero byte. It causes the subsequent byte 1 and byte 2 containing the least significant half and most significant half, respectively, of an in line operand to be loaded into SPM-2. This instruction is not indexable, it uses micro-operations FA, FL, FM, FN, FO, FP, FQ, FJ, FAP, and FZ.

2. ST (store (A) in PM) 0010-0101.

This is a one byte instruction having the above operation code. It causes a two-byte operand previously stored in the A-Register to be stored in a main memory location whose address is stored in the 12 least significant bits of the SPM-2 register. The first byte (lsh) of the operand is loaded into the memory location addressed by SPM-2 and the second byte (msh) of the operand is loaded into the memory location following the first byte. The operand is also preserved in A. The operand address is incremented twice, identifying the memory location following the second byte, and returned to SPM-2 where it is preserved. This permits a second operand to be loaded into the A-Register and then transferred to the next-in-line memory location with a second ST instruction. The next instruction address is also preserved and can be used to access the next instruction. The micro-operations used during this instruction are FA, FD, FE, FG, FF, FH, FI, FJ, FY, and FZ.

3. TX (decrement and transfer on non-negative) 0010-0110.

This may be either a three or a four-byte instruction. The first byte is an optional index byte and defines an index register. The absence of an index byte defines the SPM-0 Register. The second byte contains the above operation code and the third and fourth bytes define a transfer address. A non-negative decremented number will cause the next instruction to be accessed from the transfer address location defined by the last two bytes of this instruction. The return address is stored in the SPM-2 Register.

A negative decremented number will cause the next instruction to be accessed from the byte following the last byte (address byte 2). The transfer address (which is not used) is preserved in SPM-2.

This instruction is used to guide the data processor through a loop one or more times. The desired number of transfers, less one is initially loaded into the appropriate index register. This number will then be decremented through zero to a negative number before the loop is exited.

As long as the decremented number is non-negative, the TX instruction goes through micro-operations FC, FL, FM, FN, FO, FP, FQ, FJ, FY and FZ.

As soon as the decremented number becomes negative, the TX instruction goes through micro-operations FC, FAI, and FZ.

4. TR (unconditional transfer) 0010-0111.

This is a three-byte instruction in which the above operation code is contained in the first byte and a transfer address defined by the second and third bytes. This instruction will cause the next instruction to be accessed from the transfer address location defined by the second and third bytes. The return address is preserved in SPM-2. This instruction goes through micro-operations FA, FL, FM, FN, FO, FP, FQ, FJ, FY and FZ.

5. IP (index) 0010-1$I_2I_1I_0$.

This is a one-byte indexable functional modifier containing the operation code in the five most significant bits and an operand address in the three least significant bits. A first index (IP or IS) instruction preceding a second index (IP or IS) instruction will cause the operand address of the second index (IP or IS) instruction to be indexed by the operand of the first index (IP or IS). Thus, multilevel indexing is permissible without limit and index parameters can be obtained from locations throughout the memory.

This instruction goes through micro-operations FA, FK, FM, FN, FO, FP, FQ, FR, FV, and FZ.

6. IP-7 (index) 0010-1111.

When an index instruction identifies address location 111 it becomes a three-byte non-indexable instruction wherein an operand is contained in the second and third bytes. The operand is transferred to the SPM-2 Register. This instruction goes through micro-operations FA, FL, FM, FN, FO, FP, FQ, FS, FV and FZ.

7. DP (Add) 0001-$I_3I_2I_1I_0$.

This is a one-byte indexable instruction wherein the operation code is stored in the first four bits and an operand address is stored in the last four bits. This instruction causes the contents of an SPM-Register identified by the address portion to be added to the contents of the A-Register and the results stored in the A-Register. This instruction goes through micro-operations FA, FK, FM, FN, FO, FP, FQ, FR, FT and FZ.

8. DP-15 (Add) 0001-1111.

When a DP instruction identifies address location 1111 it becomes a three-byte non-indexable instruction with the second and third bytes containing an operand. This operand is added to the contents of the A-Register and the results stored in the A-Register. This instruction goes through micro-operations FA, FL, FM, FN, FO, FP, FQ, FS, FT, and FZ.

9. BP (subtract) 0011-$I_3I_2I_1I_0$.

This is a one-byte indexable instruction wherein the operation code is contained within the first four bits and an operand address is identified by the second four bits. It causes an operand stored in an SPM-Register defined by the operand address to be subtracted from the contents of the A-Register and the results stored in the A-Register. This instruction goes through micro-operations FA, FK, FM, FN, FO, FP, FQ, FR, FU, and FZ.

10. BP-15 (subtract) 0011-1111.

When the operand address defined by a BP instruction is 1111 it becomes a three-byte non-indexable instruction. The second and third bytes contain an operand which is subtracted from the contents of the A-Register and the difference stored in the A-Register. This instruction goes through micro-operations FA, FL, FM, FN, FO, FP, FQ, FS, FU and FZ.

11. XP (exclusive-OR) 0000-0$I_2I_1I_0$.

This is a one-byte indexable instruction in which the operation code is contained in the five most significant bits and an SPM-Register containing an operand is defined by the three least significant bits. The operand is exclusive-ORed with the contents of the A-Register and the result is stored in the A-Register. This instruction goes through micro-operations FA, FK, FM, FN, FO, FP, FQ, FR, FX and FZ.

12. XP-7 (exclusive-OR) 0000-0111.

When an XP instruction defines operand address 111, it becomes a three-byte non-indexable instruction containing an operand in the second and third bytes. This operand is exclusive-ORed with the contents of the A-Register and the result is stored in the A-Register. This instruction goes through micro-operations FA, FL, FM, FN, FO, FP, FQ, FR, FX and FZ.

13. AP (logical AND) 0000-1$I_2I_1I_0$.

This is a one-byte indexable instruction wherein the operation code is contained in the five most significant bits and an SPM-Register address containing an operand is defined by the three least significant bits. The operand contained in the addressed SPM-Register is logical ANDed with the contents of the A-Register and the result is stored in the A-Register. A logical AND with a 0 operand is used to clear the A-Register. This instruction goes through micro-operations FA, FK, FM, FN, FO, FP, FQ, FR, FW, and FZ.

14. AP-7 (logical AND) 0000-1111.

When the address defined by an AP instruction is 111, it becomes a three-byte non-indexable instruction having an operand contained in the second and third bytes. The operand is logical ANDed with the contents of the A-Register and the result is stored in the A-Register. This instruction goes through micro-operations FA, FL, FM, FN, FO, FP, FQ, FS, FW and FZ.

Group B instructions obtain all operands from the scratch pad memory. Each SPM page consists of 16 registers with indexing permitted between the two SPM pages. Caution is required when using SPM-2 because an interrupt will replace the contents of SPM-2 with a return address. This can be circumvented with the use of an interrupt disable discrete. In addition, the use of a Group A instruction will replace the contents of the SPM-2 Register with either data or a return address, requiring the transfer of SPM-2 data to another SPM-Register before a Group A instruction is used if the data is to be preserved.

15. TI (transfer indirect) 0110-0111.

This is a one-byte non-indexable instruction having the above operation code. It causes the address of the next instruction to be obtained from SPM-2 and the return address stored in SPM-2. It goes through micro-operations FA, FY and FZ.

16. IS (index) 0110-1$I_2I_1I_0$.

This is a one-byte indexable functional modifier having the operation code contained in the five most significant bits and an address defining an SPM-Register containing an operand contained in the three least significant bits. A first index (IP or IS) instruction following a second index (IP or IS) instruction will cause the operand address of the second index (IP or IS) instruction to be indexed by the operand of the first index (IP or IS) instruction. Multilevel indexing is thus permissible without limit. Only SPM-Registers 0 through 7 of each SPM page may be used as index registers. This is a single byte functional modifier programmed immediately prior to an instruction to be indexed. This instruction goes through micro-operations FA, FV and FZ.

17. DS (Add) 0101-$I_3I_2I_1I_0$.

This is a one-byte indexable instruction wherein the four most significant bits define the operation code and the four least significant bits define an SPM-Register address containing an operand. The operand in the addressed SPM-Register is added to the contents of the A-Register and the sum is stored in the A-Register. This introduction goes through micro-operations FA, FT and FZ.

18. BS (subtract) 0111-$I_3I_2I_1I_0$.

This is a one-byte indexable instruction wherein the four most significant bits define the operation code and the four least significant bits define a scratch pad memory address containing an operand. The addressed operand is subtracted from the contents of the A-Register and the difference is stored in the A-Register. This introduction goes through micro-operations FA, FU and FZ.

19. XS (exclusive-OR) 0100-0$I_2I_1I_0$.

This is a one-byte indexable instruction wherein the five most significant bits define the operation code and the three least significant bits define an SPM address containing an operand. The operand is exclusive-ORed with the contents of the A-Register and the result is stored in the A-Register. This instruction goes through micro-operations FA, FX and FZ.

20. AS (logical AND) 0100-1$I_2I_1I_0$.

This is a one-byte indexable instruction wherein the five most significant bits define the operation code and the three least significant bits define an SPM address containing an operand. The addressed operand is logical ANDed with the contents of the A-Register and the result is stored in the A-Register. This instruction goes through micro-operations FA, FW and FZ.

The following Group C type instructions relate to operations generally involving the A-Register.

21. SS (store (A) in SPM) 1000-$I_3I_2I_1I_0$.

This is a one-byte indexable instruction wherein the four most significant bits identify the operation code and the four least significant bits define an SPM address. The contents of the A-Register are placed in the addressed SPM-Register and also preserved in the A-Register. This instruction uses micro-operations FA, FAC and FZ.

22. SL (shift left) 1001-00$I_1I_0$.

This is a one-byte non-indexable instruction wherein the six most significant bits define the operation code and the two least significant bits define the number of shifts. The contents of the A-Register are shifted left by the binary number defined by $(I_1I_0)+1$. In other words, $\overline{I_1},\overline{I_0}=1$ shift, $\overline{I_1}I_0=2$ shifts, $I_1\overline{I_0}=3$ shifts, and $I_1I_0=4$ shifts. 0's are shifted into the vacated least significant bits of the A-Register. This instruction goes through micro-operations FA, FAD and FZ.

23. SE (shift end around) 1001-11$I_1I_0$.

This is a one-byte indexable instruction wherein the six most significant bits identify the operation code and the two least significant bits identify a number of shifts. The number of bits shifted can be indexed up to a maximum of 16 bits. The contents of the A-Register are shifted by the binary number represented by $(I_1I_0)+1$. That is, $\overline{I_1},\overline{I_0}=1$ shift, $\overline{I_1}I_0=2$ shifts, $I_1\overline{I_0}=3$ shifts, and $I_1I_0=4$ shifts. Additional shifts are accomplished by indexing. The end around shift is effectively a right shift where the least significant bit is shifted out of the A-Register and recirculated into the most significant bit position of the A-Register. This instruction goes through micro-operations FA, FAF and FZ.

24. SR (shift right) 1001-10$I_1I_0$.

This is a one-byte indexable instruction wherein the six most significant bits identify the operation code and the two least significant bits identify a number of shifts. The number of bits shifted can be indexed up to a maximum of 16 bits. The contents of the A-Register are shifted right as indexed or by a number of bits equal to the binary number defined by $(I_1I_0)+1$. That is, $\overline{I_1},\overline{I_0}=1$ shift, $\overline{I_1}I_0=2$ shifts, $I_1\overline{I_0}=3$ shifts, and $I_1I_0=4$ shifts. The sign bit of the A-Register is continuously shifted into the most significant bit position. This instruction goes through micro-operations FA, FAE and FZ.

25. EX (input/output word) 1010-$I_3I_2I_1I_0$.

This is a one-byte indexable instruction wherein the four most significant bits identify the operation code and the four least significant bits identify an I/O channel address. The contents of the A-Register are output to the addressed channel while the contents of the addressed channel are simultaneously loaded into the A-Register. A shift enable signal is output to gate 16 clock pulses to the selected channel. This instruction goes through micro-operations FA, FAB, and FZ.

26. EX-15 (input/output word) 1010-1111.

This instruction clears the A-Register by shifting in the contents of a non-existent input channel which are all zeros. This instruction goes through micro-operations FA, FAB and FZ.

27. LD (load accumulator) 1011-$I_3I_2I_1I_0$.

This is a one-byte indexable instruction wherein the four most significant bits identify the operation code and the four least significant bits identify an SPM address containing an operand. The operand in the addressed SPM-REgister is loaded into the A-Register. This instruction goes through micro-operations FA, FAQ and FZ.

Group D instructions relate to the discretes.

28. DC (discrete output) 110$I_4$-$I_3I_2I_1I_0$.

This is a one-byte indexable instruction wherein the three most significant bits define the operation code and the five least significant bits define an output channel address. A discrete output signal, an inverted 3 microsecond pulse is generated on the addressed output channel. This instruction goes through micro-operations FA, FH and FZ.

29. SK (skip on discrete) 111$I_4$-$I_3I_2I_1I_0$.

This is a one-byte indexable instruction wherein the three most significant bits identify the operationcode and the five least significant bits identify a discrete input channel address. If a discrete exists on the addressed channel, three bytes (usually a transfer instruction) are skipped and the next instruction is obtained from the fourth byte following the skip on discrete instruction. If a discrete does not exist on the addressed channel, the next instruction (usually a three-byte transfer instruction) is obtained from the three bytes immediately following the skip on discrete instruction. This instruction goes through micro-operations FA, FAG and FZ.

Two rules create exceptions to the above micro operation flow paths.

1. When an interrupt occurs during the execution of an instruction, the instruction will not terminate with the FZ micro-operation but instead will continue through the FAK, FAL, FAM, FAN, FAO micro-operations.

2. Whenever an instruction normally going through the FA micro-operation is preceded by an index functional modifier (ID or IP) it will go through FB in lieu of FA.

Schematic Diagrams

As previously noted the data processor is physically layed out on a series of printed circuit boards interconnected by a Mother board. The schematic drawings in FIGS. 9-10 show columns of numbers and letters representing plug interconnections and common signal connections, which are summarized in Table IV. The registers and logic gates are implemented with SN 7400 series integrated circuits. The registers and flip flops are shown in detail in FIGS. 9-10 and the various logical equations such as the inputs to these elements are defined in Table I and Table II. Although the illustrated registers and flip flops, combined with the equations in Table I, Table II, and Table III are sufficient to completely define the operation of the data processor 112 (FIG. 1A), groups of logical functions have been shown on the printed circuit boards on which they are actually implemented. It should be understood, however, that the location of gates developing logical signals is largely determined by availability of space and primary or intermediary subsignals and may or may not be related to the ultimate use of a particular logical signal.

The numerous computer signals are defined with both, letters and numbers. The signal definitions in FIGS. 9 thru 10 correspond with the signal definitions in the logical equations and with the micro-operation designations. Each logic card shown in FIGS. 9 thru 10 have pin designations that correspond to the signals on that logic card, with those pin designations repeated for each card. The signals for each logic card and the pin designation that corresponds to that signal on that card are shown in Table IV. The pin designations are listed in the left hand column, while the signals corresponding to those pin designations are listed in columns under the card designations (such as cards A, B, C, etc) and the Figure references (such as FIGS. 9A, 9B, 9C, 9D, etc).

As shown in FIGS. 9A and 9B the A-Logic printed circuit board includes the A-Register 930, its associated full adder 932 and and A carry flip-flop K₇ 938. Also shown is the M-Register 172, its associated full adder 939, and the carry flip-flop 940. The A-Register overflow detector flip-flop OF₁ 934 and logic dates 935 are also located on the A-Logic board.

As shown in FIG. 9C the B-Logic printed circuit board includes the bit counter, flip-flop B₀ 950, B₁ 952, B₂ 954 and B₃ 956. Flip-flops B₄ 958, B₅ 960, B₆ 962 and B₇ 964 produce the asymmetric main clock signal P3. Also included on this board is the bit time decode logic 966, logic gates 968 and various other logic gates.

As shown in FIG. 9D the C-Logic printed circuit board includes various logic gates 917 as well as the C-Register which includes flip-flops C₃ 972, C₂ 974, C₁ 976, C₀ 978, K₁₁ 980 and K₁₀ 982.

Figure 9E:
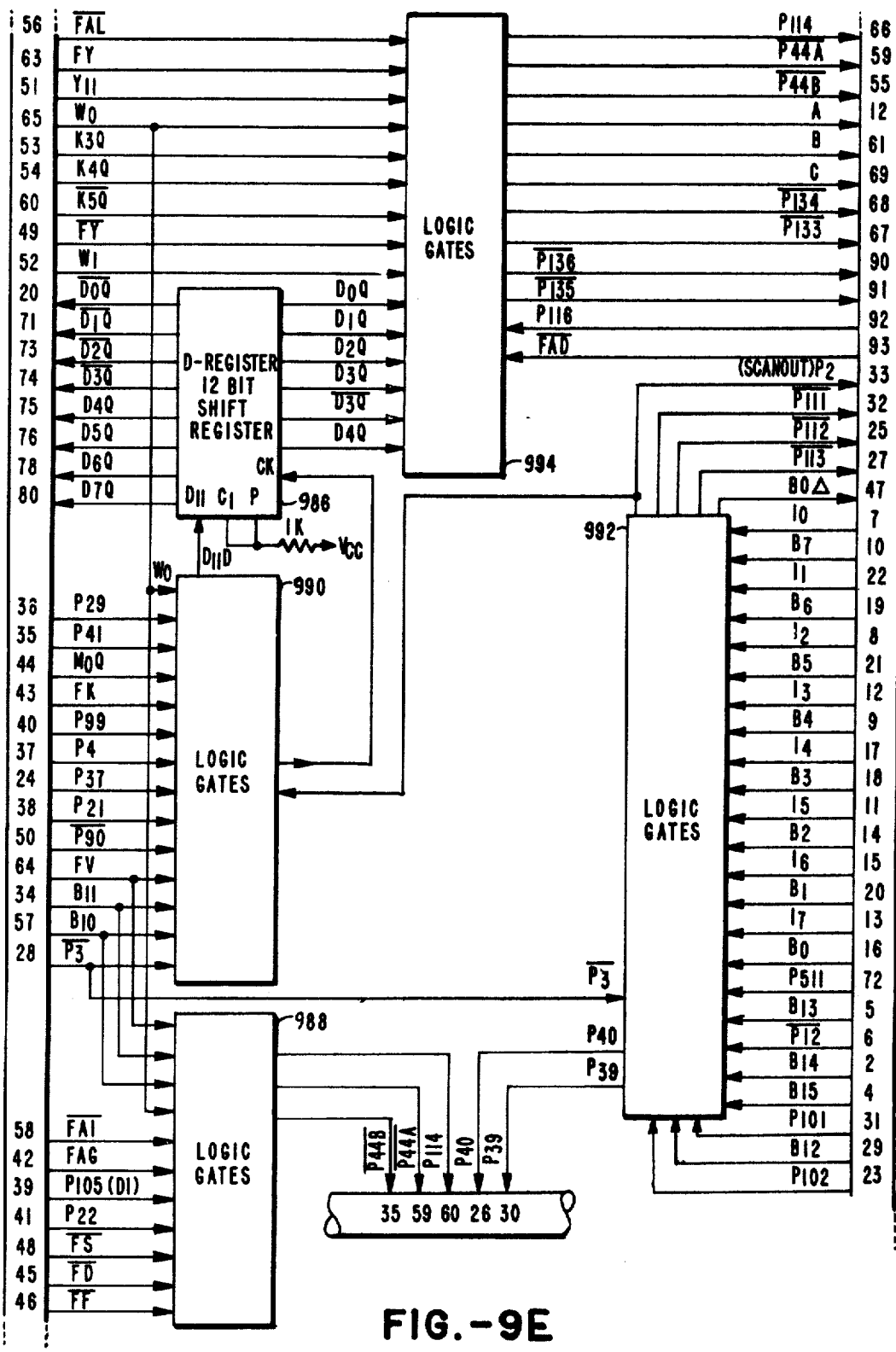
FIG. 9E is a schematic and block diagram representation of the D logic circuit board.

As shown in FIG. 9E the D-Logic printed circuit board includes the D-Register 986 as well as various logic gates 988, 990, 992 and 994.

Figure 9F:
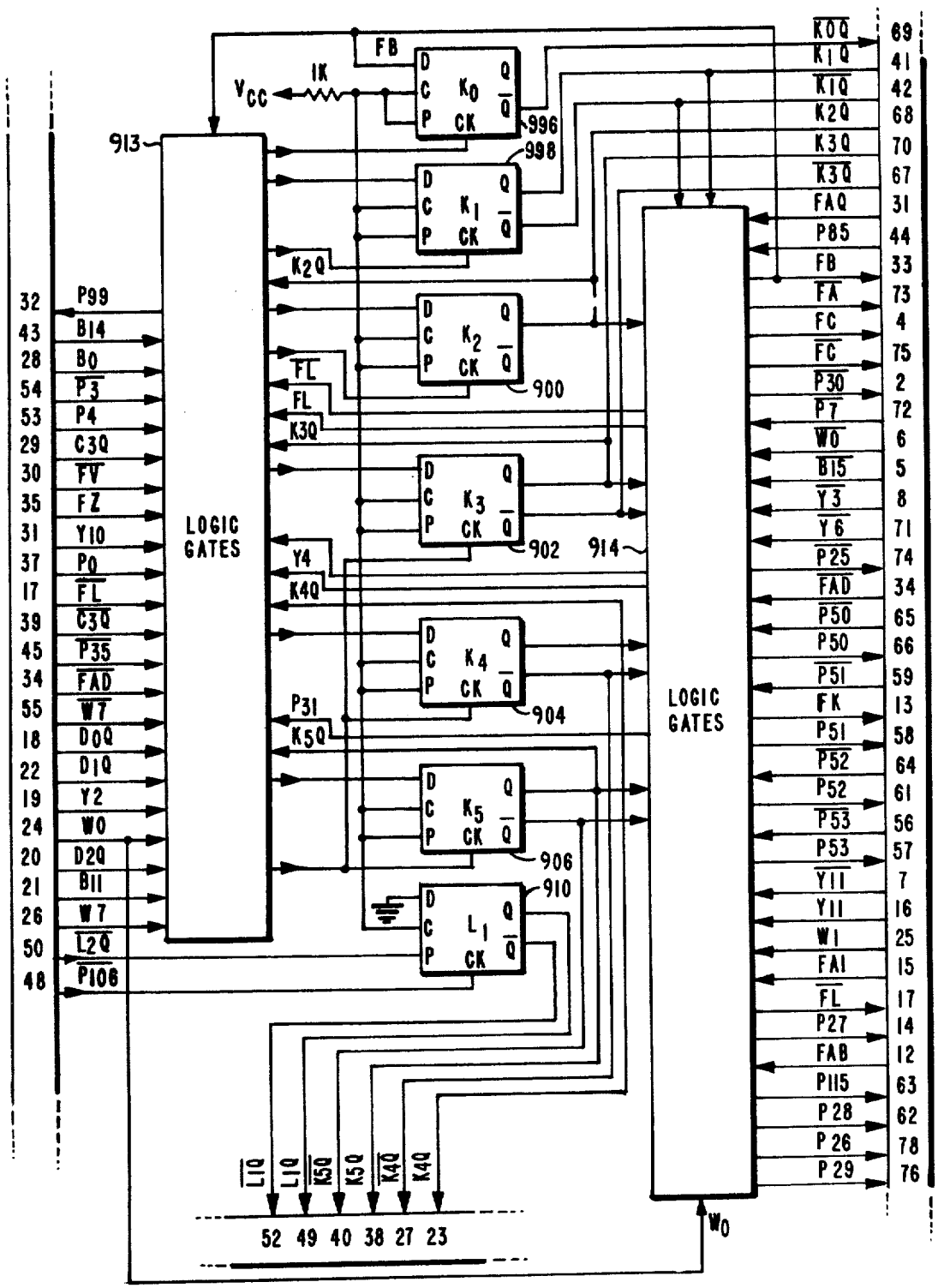
FIG. 9F is a schematic and block diagram representation of the K logic circuit board.
Figure 9G:
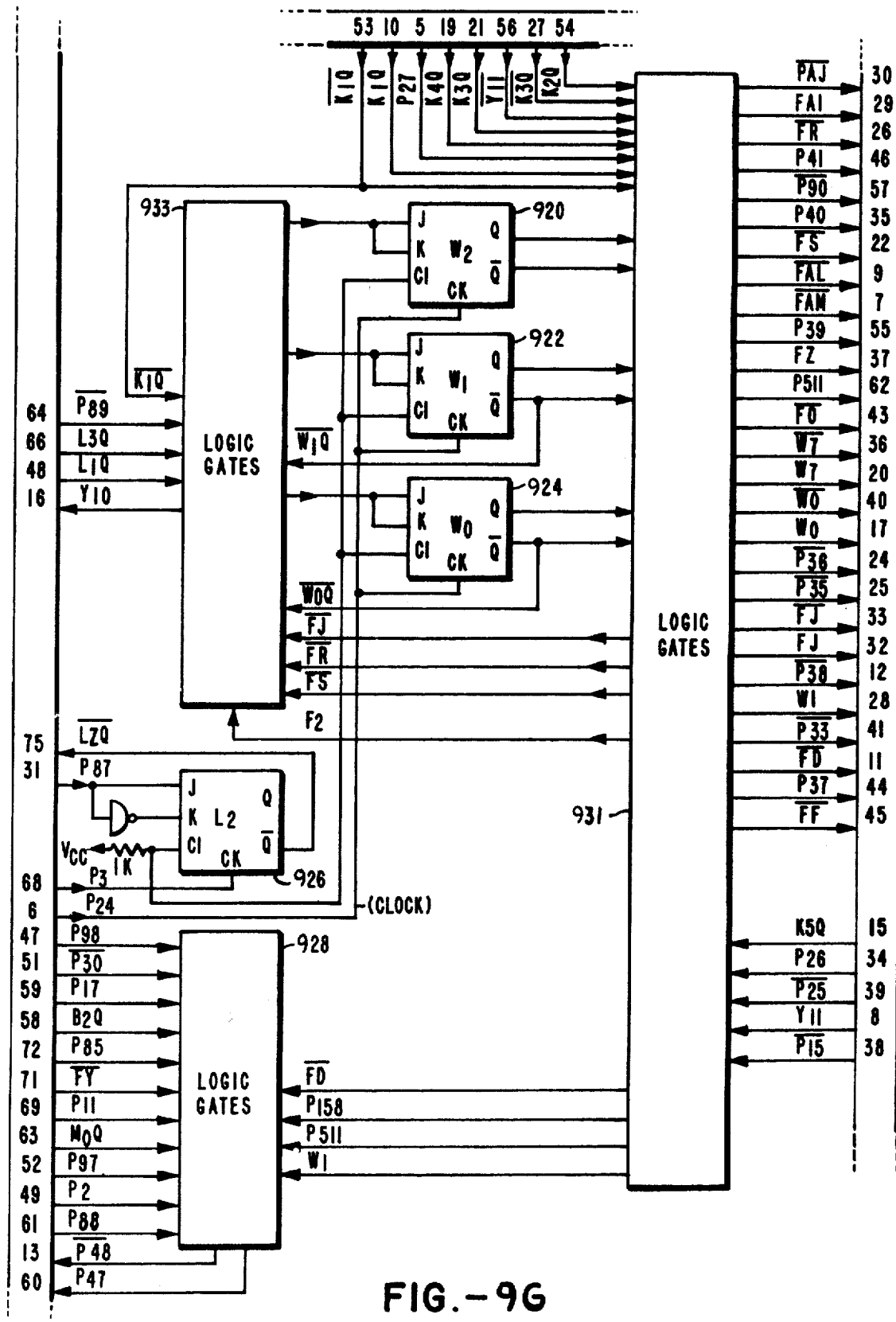
FIG. 9G is a schematic and block diagram representation of the W logic circuit board.

As shown in FIG. 9F the K-Logic printed circuit board includes flip-flops K₀ 996, K₁ 998, K₂ 900, K₃ 902, K₄ 904, K₅ 906, and L₁ 910. Also included are various logic gates 913 and 914.

As shown in FIG. 9G the W-Logic printed circuit board includes the word counter composed of flip-flops W₂ 920, W₁ 922 and W₀ 924 as well as the flip-flop L₂ 926. Also included are various logic gates 928, 931 and 933.

Figure 9H:
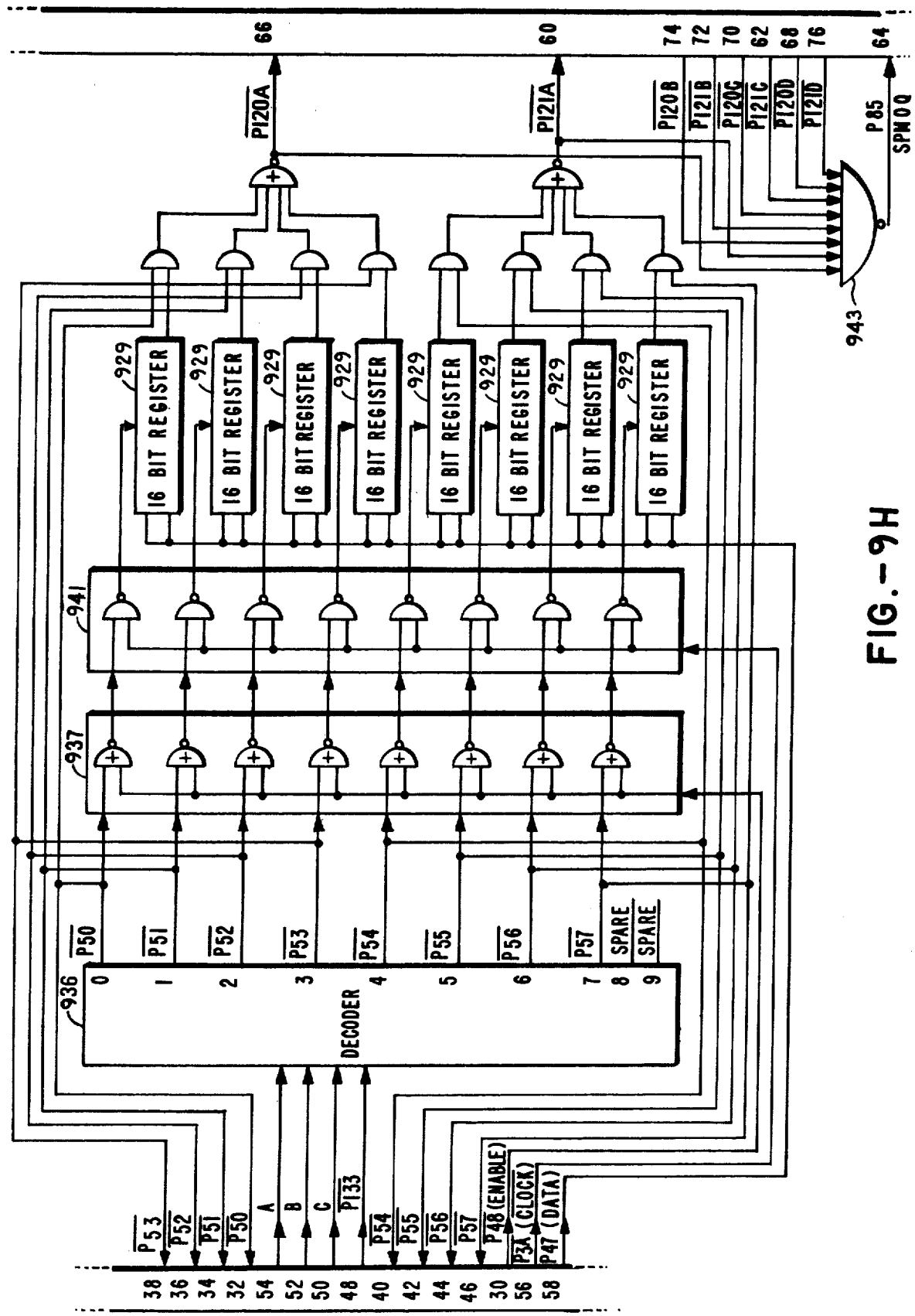
FIG. 9H is a schematic and block diagram representation of the SPM circuit board.

As shown in FIG. 9H an A section Scratch Pad Memory printed circuit board includes eight pairs of integrated circuit shift registers 929. A binary coded decimal to decimal decoder 936 generates memory select signals $\overline{P50}$ through $\overline{P57}$ which is gated through a first series of gates 937. This first gated signal in turn gates a clock signal $\overline{P3A}$ through a second series of gates 941 to clock a selected one of the registers. The outputs from the registers 929 are multiplexed into signals $\overline{P120A}$ and $\overline{P121A}$, each carrying outputs from four of the registers. Three additional scratch pad memory sections B, C and D, identical with A shown in FIG. 9H provide corresponding output signals $\overline{P120B}$, 121B, 120C, 121C, 120D and 121D. These in turn are multiplexed by NAND gate 943 into a single output signal P85. The signals in the B, C and D sections correspond to those of the A section and are defined according to terminal numbers as follows:

| Terminal No. | A | B | C | D |
|---|---|---|---|---|
| 30 | $\overline{P48}$ | $\overline{P48}$ | $\overline{P48}$ | $\overline{P48}$ |
| 32 | $\overline{P50}$ | $\overline{P58}$ | $\overline{P66}$ | $\overline{P74}$ |
| 34 | $\overline{P51}$ | $\overline{P59}$ | $\overline{P67}$ | $\overline{P75}$ |
| 36 | $\overline{P52}$ | $\overline{P60}$ | $\overline{P68}$ | $\overline{P76}$ |
| 38 | $\overline{P53}$ | $\overline{P61}$ | $\overline{P69}$ | $\overline{P77}$ |
| 40 | $\overline{P54}$ | $\overline{P62}$ | $\overline{P70}$ | $\overline{P78}$ |
| 42 | $\overline{P55}$ | $\overline{P63}$ | $\overline{P71}$ | $\overline{P79}$ |
| 44 | $\overline{P56}$ | $\overline{P64}$ | $\overline{P72}$ | $\overline{P80}$ |
| 46 | $\overline{P57}$ | $\overline{P65}$ | $\overline{P73}$ | $\overline{P81}$ |
| 48 | $\overline{P133}$ | $\overline{P134}$ | $\overline{P135}$ | $\overline{P136}$ |
| 50 | C | C | C | C |
| 52 | B | B | B | B |
| 54 | A | A | A | A |
| 56 | $\overline{P3A}$ | $\overline{P3B}$ | $\overline{P3C}$ | $\overline{P3D}$ |
| 58 | P47 | P47 | P47 | P47 |
| 60 | $\overline{P121A}$ | $\overline{P121B}$ | $\overline{P121C}$ | $\overline{P121D}$ |
| 62 | $\overline{P121C}$ | | | |
| 64 | P85 | | | |
| 66 | $\overline{P120A}$ | $\overline{P120B}$ | $\overline{P120C}$ | $\overline{P120D}$ |
| 68 | $\overline{P120D}$ | | | |
| 70 | $\overline{P120C}$ | | | |
| 72 | $\overline{P121B}$ | | | |
| 74 | $\overline{P120B}$ | | | |
| 76 | $\overline{P121D}$ | | | |

Figure 9I:
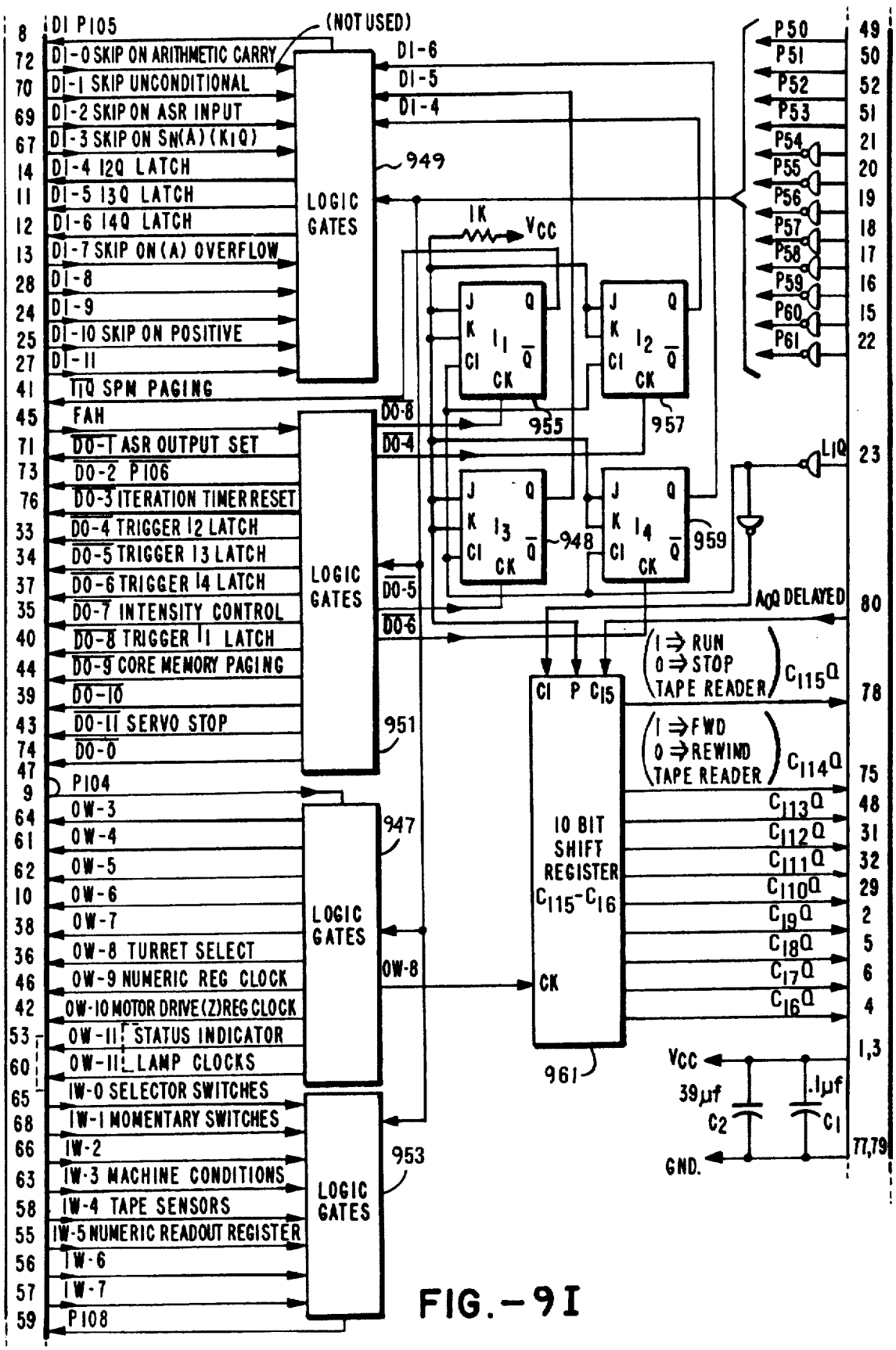
FIG. 9I is a schematic and block diagram representation of the IFA-1 circuit board.

As shown in FIG. 9I the IFA-1 printed circuit board contains logic gates 949, 951, 947 and 953 providing input/output functions. The IFA-1 board accepts input and output type instruction micro-operation signals as well as address signals to encode or decode the various inputs and outputs. The input and output words are exchanged with the A-Register in the data processor 112 (FIG. 1B). The input words (IW) are multiplexed by logic gates 953 into signal P108 which is input to the A-Register. Information is output from the A-Register to the various entities by connecting the entities to A₀Q and clocking a selected entity with a gated clock P104 as determined by logic gates 947, shown as output word (OW) signals. Discrete input signals are multiplexed into signal P105 by logic gates 949. Discrete output signals (DO) are decoded and gated by logic gates 951. Micro-operation FAH provides the gating signal. The discrete input signals are accessed with skip on discrete decision instructions, and each discrete output signal (DO) provides a short negative going pulse when selected with a discrete output instruction. The I-Register flip-flops 955, 957, 948, and 959 perform the function of latches toggled or set with the discrete outputs. The I₁ flip-flop 955 is used to directly provide a Scratch Pad Memory paging function. Outputs from the flip flops I₂ 957, I₃ 948 and I₄ 959 become discrete inputs. A C_I-Register 961 is loaded with output word 8 and used for general system functions. This interface C-Register shown in FIGS. 9I and 9L will be referred to as the C_I-Register hereafter to distinguish it from the data processor C-Register shown in FIG. 9D. The signals P50-P61 are decoded operand addresses from the data processor.

As shown in FIG. 9I, the $C_I$-Register 961 contains a plurality of discrete commands $C_{I15}Q$-$C_{16}Q$, where the command conditions are packed together in the data processor A-Register using well known programming methods. This packed word is then output to the $C_I$ register 961 with an EX-8 instruction generating the OW-8 gated clock from logic gates 947 to the clock input CK of the $C_I$ register 961. The contents of the A-Register are shifted into the $C_{I15}$ input to the $C_I$ register 961 as the $A_0Q$ signal on pin 80. The data processor packs a tape reader run/stop bit into the most significant bit position corresponding to the $C_{I15}Q$ bit shown on pin 78, where a logical one commands the tape reader 116 to run and a logical zero commands the tape reader 116 to stop. The data processor packs a tape reader forward/rewind bit in the next mostsignificant bit position corresponding to the $C_{I14}Q$ bit shown on pin 75, where a logical one commands the tape reader 116 to run forward and a logical zero commands the tape reader 116 to rewind under control of the tape reader run/stop command $C_{I15}Q$ on pin 78. These tape reader controls are described in detail in the technical manual for the Remex tape reader previously referenced herein. Other discrete commands from the data processor are shown as signals $C_{I13}Q$-$C_{I6}Q$ on pins 75, 48, 31, 32, 29, 2, 5, 6 and 4 respectively and are used for controlling other system operations such as shown in FIG. 1A as machine auxiliary control signals 126A and 126B for direct control of various machine operations as described previously.

Figure 9J:
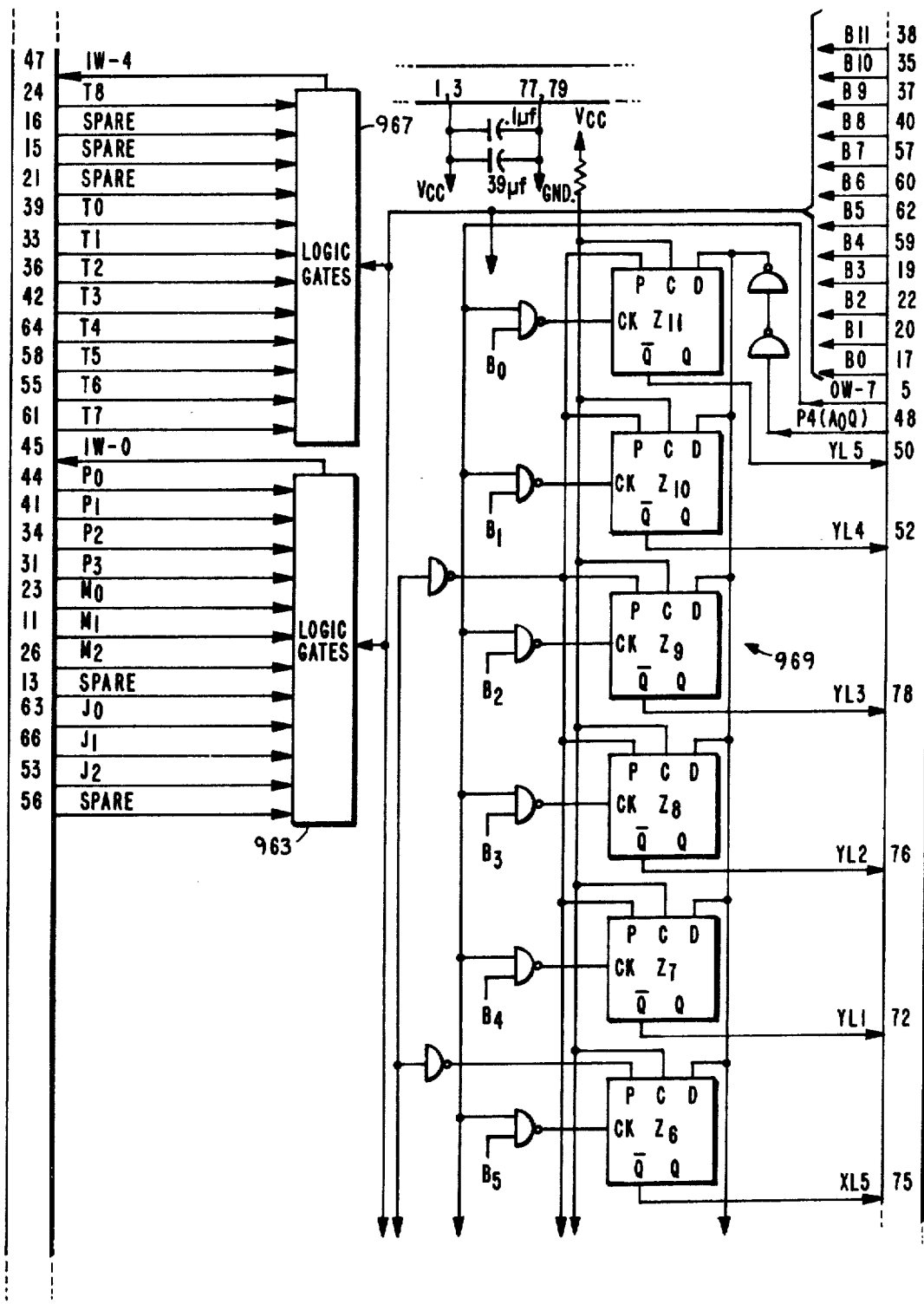
FIGS. 9J and 9K is a schematic and block diagram representation of the IFA-2 circuit board and tape reader input arrangement.
Figure 9K:
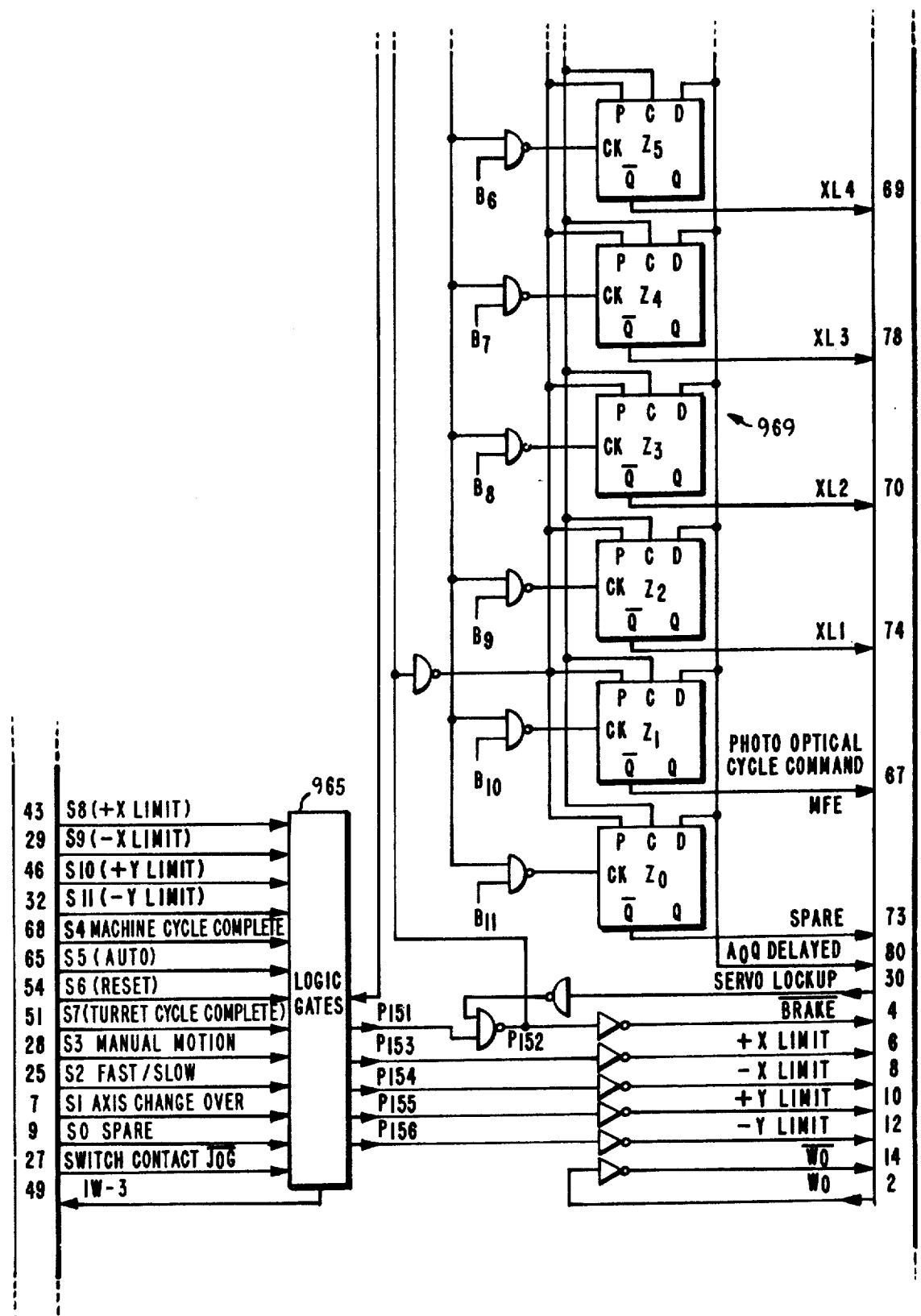

As shown in FIGS. 9J and 9K, the IFA-2 printed circuit board provides for the scan-in of input words "zero", "three", and "four" to convert the parallel input lines to a serial input that can be processed with the input word multiplexer on the IFA-1 card. Logic gates 963 scan control panel selector switch signals into input word −0, logic gates 965 scan non-system adapted machine auxiliary control signals 126A and 126B (FIG. 1A) into input word −3 and logic gates 967 scan rudimentary intrinsic tape reader input signals into input word −4.

These machine auxiliary control signals are scanned into the data processor A-Register with logic gates 965 as serial word IW-3 shown on pin 49 upon execution of an EX-3 instruction. Machine limit switch signals S8-S11 shown on pins 43, 29, 46, and 32 respectively are received for examination by the data processor to interlock motion. Machine Cycle Complete signal S4 shown on pin 68 is received for use by the data processor to determine if a machine command such as a discrete command has been executed to interlock machine operations. Turret Cycle Complete signal S7 shown on pin 51 is received by the data processor to determine if a turret command such as described herein has been executed to interlock machine operations. Operator control signals such as the Switch Contact Jog signal shown on pin 27 is received from machine mounted operator control devices and is used in parallel with operator control devices on the panel 14 such as Jog switches 241 and 252 (FIG. 2) through interpretation by the data processor under program control as discussed previously for the switches mounted on the control panel 114 (FIG. 1A). Other machine auxiliary control signals such as signals S5, S6, S3, S2, S1, and S0 shown on pins 65, 54, 28, 25, 7, and 9 respectively are examined by the data processor to determine machine conditions.

The Z-Register 969 includes flip-flops $Z_{11}$ through $Z_0$ and is a static register loaded with output word −7 to set system discrete conditions such as for machine control. It should be noted that this register does not have ambiguous outputs during the shift frame due to selective clocking of the flip-flops in this register. The Z-Register 969 contains a plurality of discrete commands shown as YL5-YL1, XL5-XL1, MFE and $\overline{Z_0Q}$ which are packed together in the data processor A-Register using well known programming methods. The packed word is then output to the Z-Register 969 with an EX-7 instruction generating the OW-7 gated clock shown on pin 5 from logic gates 947 (FIG. 9I) to clock flip-flops $Z_{11}$-$Z_0$ as selected with bit time signals shown as $B_0$-$B_{11}$ respectively to the two-input NAND gates with outputs shown connected to the clock inputs CK of the Z-Register flip-flops. Discrete commands from the data processor are shown as signals YL5-YL1, XL5-XL1, MFE, and $\overline{Z_0Q}$ to pins 50, 52, 78, 76, 72, 75, 69, 78, 70, 74, 67, and 73 respectively and are used for controlling various system operations such as shown in FIG. 1A as machine auxiliary control signals 126A and 126B for direct control of various machine operations as described previously. For example, a Photo Optical Cycle Command signal MFE is shown on pin 67 to control a photo machine operation.

Figure 9L:
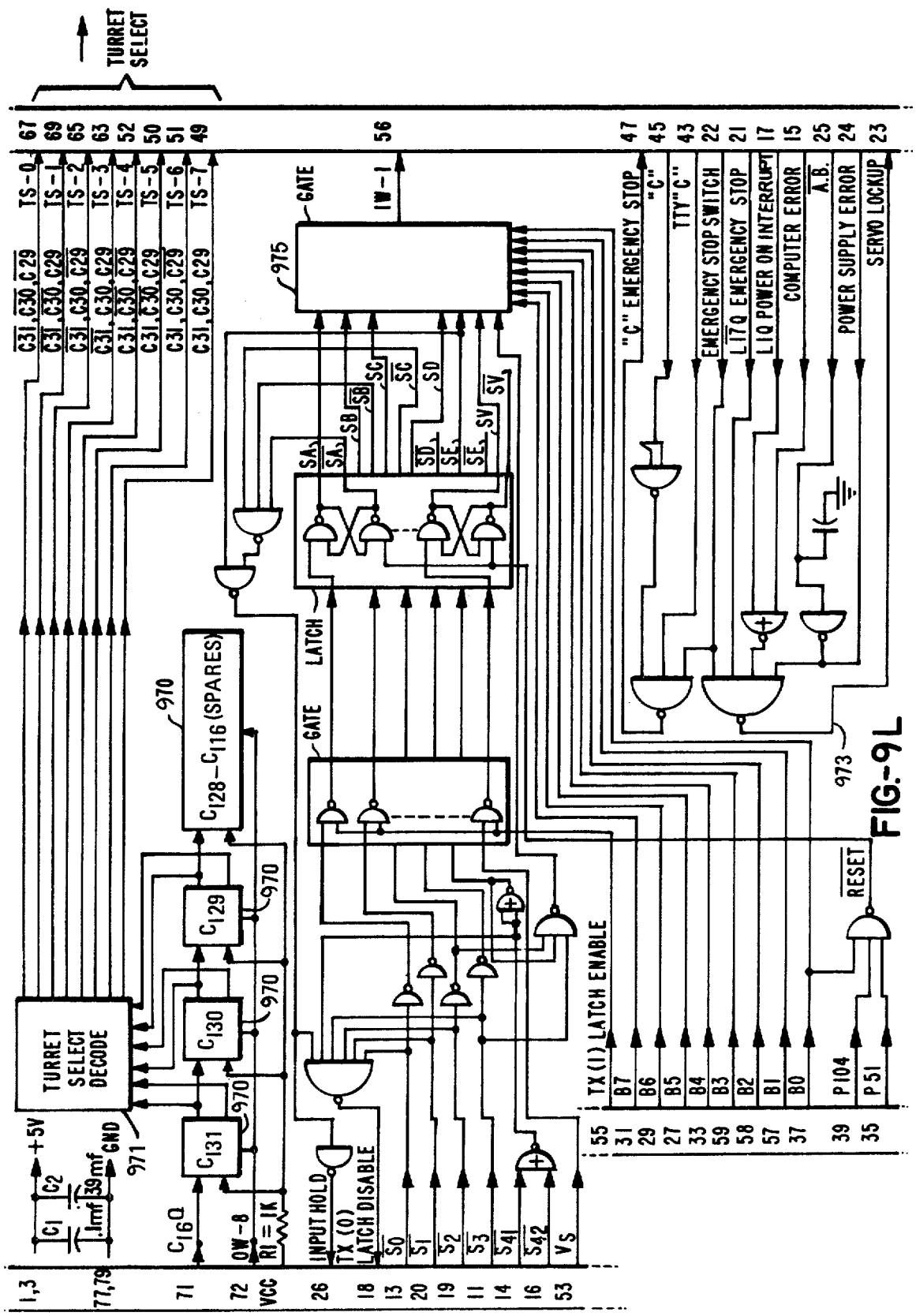
FIG. 9L is a schematic and block diagram representation of the IFA-3 circuit board.

As shown in FIG. 9L, the IFA-3 printed circuit board provides an extension 970 ($C_{I31}$ through $C_{I16}$) to the C-Register on IFA-1 (FIG. 9I) and performs the auxiliary function of decoding some of the discrete conditions for machine turret select 971. The data processor packs a turret select code into the word output to the $C_I$-Register in positions corresponding to the $C_{I31}$, $C_{I30}$, and $C_{I29}$ stages of $C_I$-Register extension 970 to excite the Turret Select Decode for generating turret select signals TS-0 through TS-7. Turret change can be enabled with discrete command signals such as previously described. The data processor can monitor the Turret Cycle Complete signal S7 on pin 51 (FIG. 9K) to determine when the turret has been properly repositioned for interlocking system operations. Logic gates 975 provide the input gating, latching and logical functions associated with the momentary switch logic inputs from the control panel and multiplex them into input word −1. In addition, special gating for computer interrupts is provided and the servo lockup signal 973 is used to disable the machine drives when a detrimental condition is sensed.

The interface assembly (IFA-1, IFA-2 and IFA-3) is not an interface in the conventional sense but constitutes a distributed group of functions that are normally associated with the data processor or the various system entitles. The interface assembly also performs the function of signal distribution between the data processor and various system extremities.

Figure 10A:
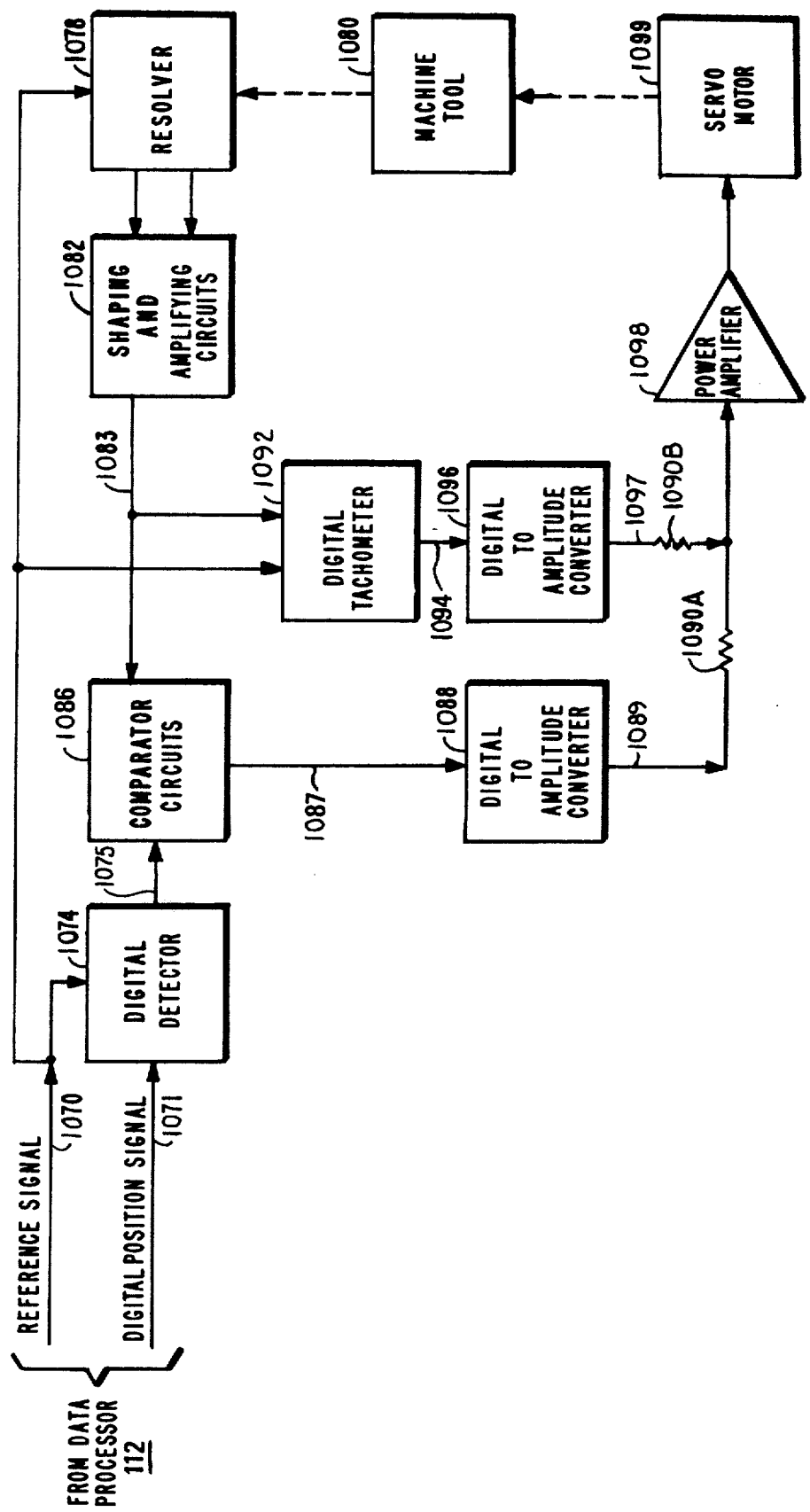
FIG. 10 comprising FIG. 10A showing block diagram representation of the servos, FIGS. 10B and 10C showing a schematic and block diagram representation of the servo common board circuit board, FIGS. 10D and 10E showing a schematic and block diagram representation of the servo channel board circuit board, FIG. 10F showing a schematic and block diagram representation of an error detector generally shown in FIG. 10D, and FIG. 10G showing a schematic and block diagram representation of a digital tachometer shown generally in FIG. 10D.
Figure 10B:
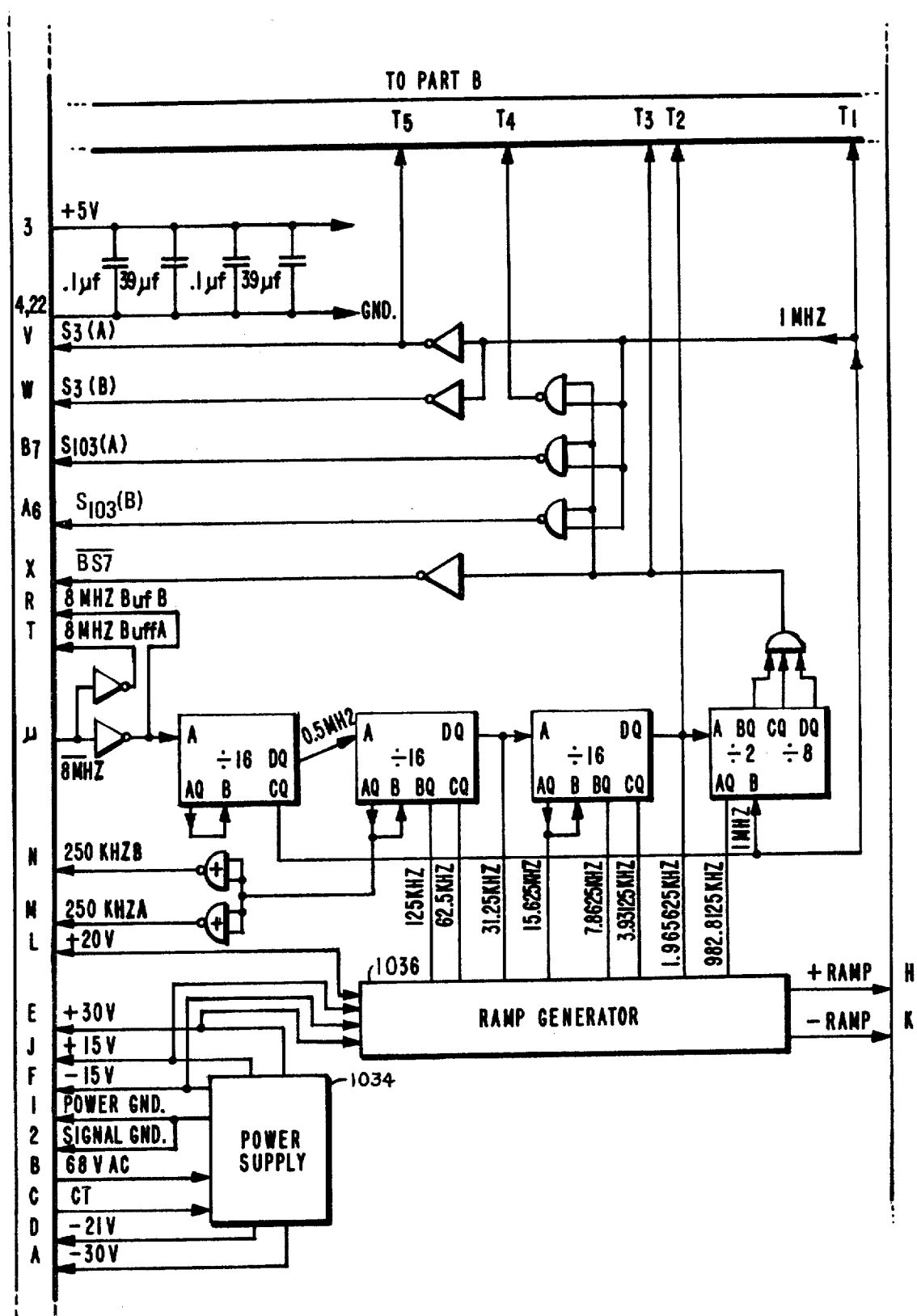
Figure 10C:
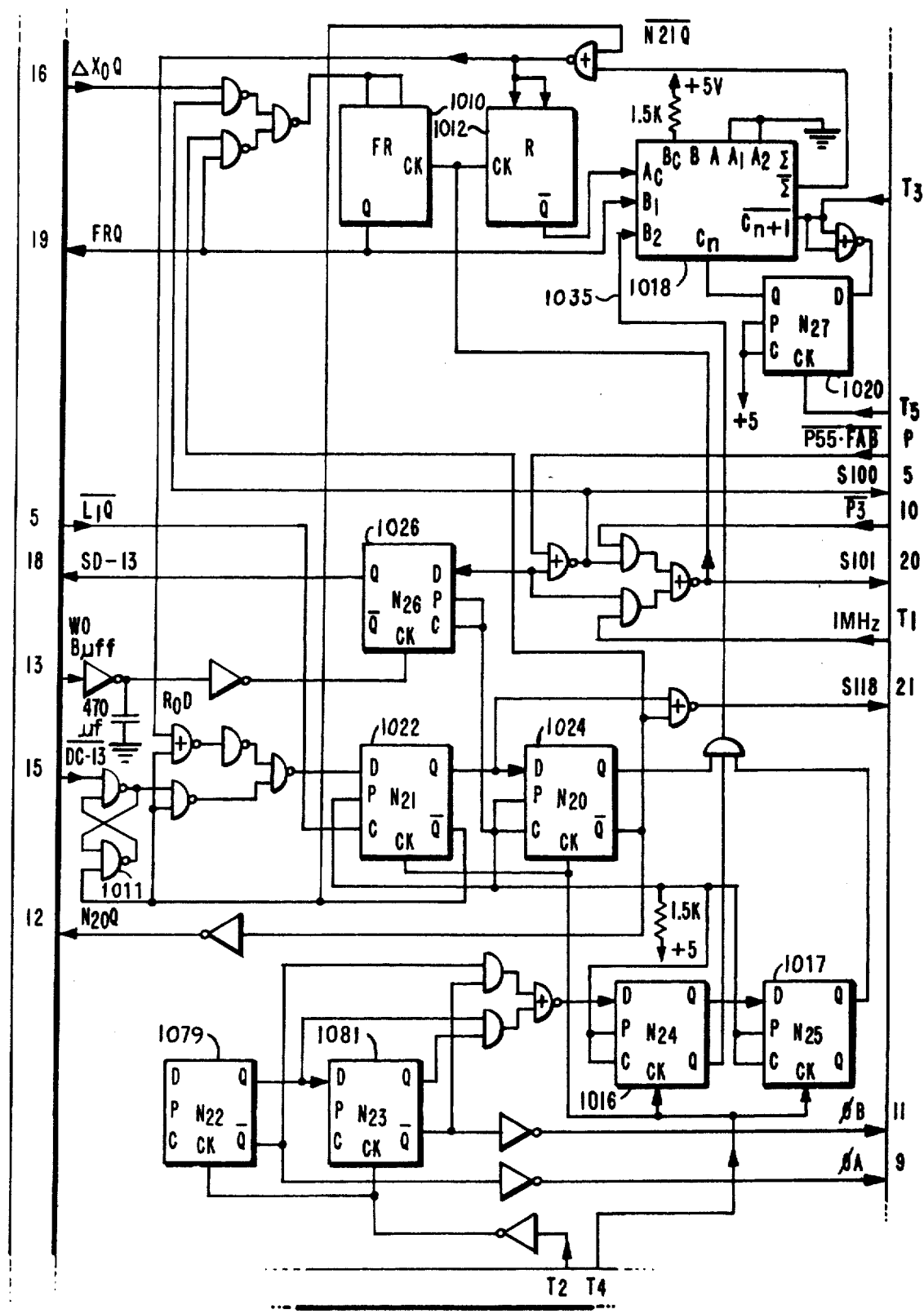
Figure 10D:
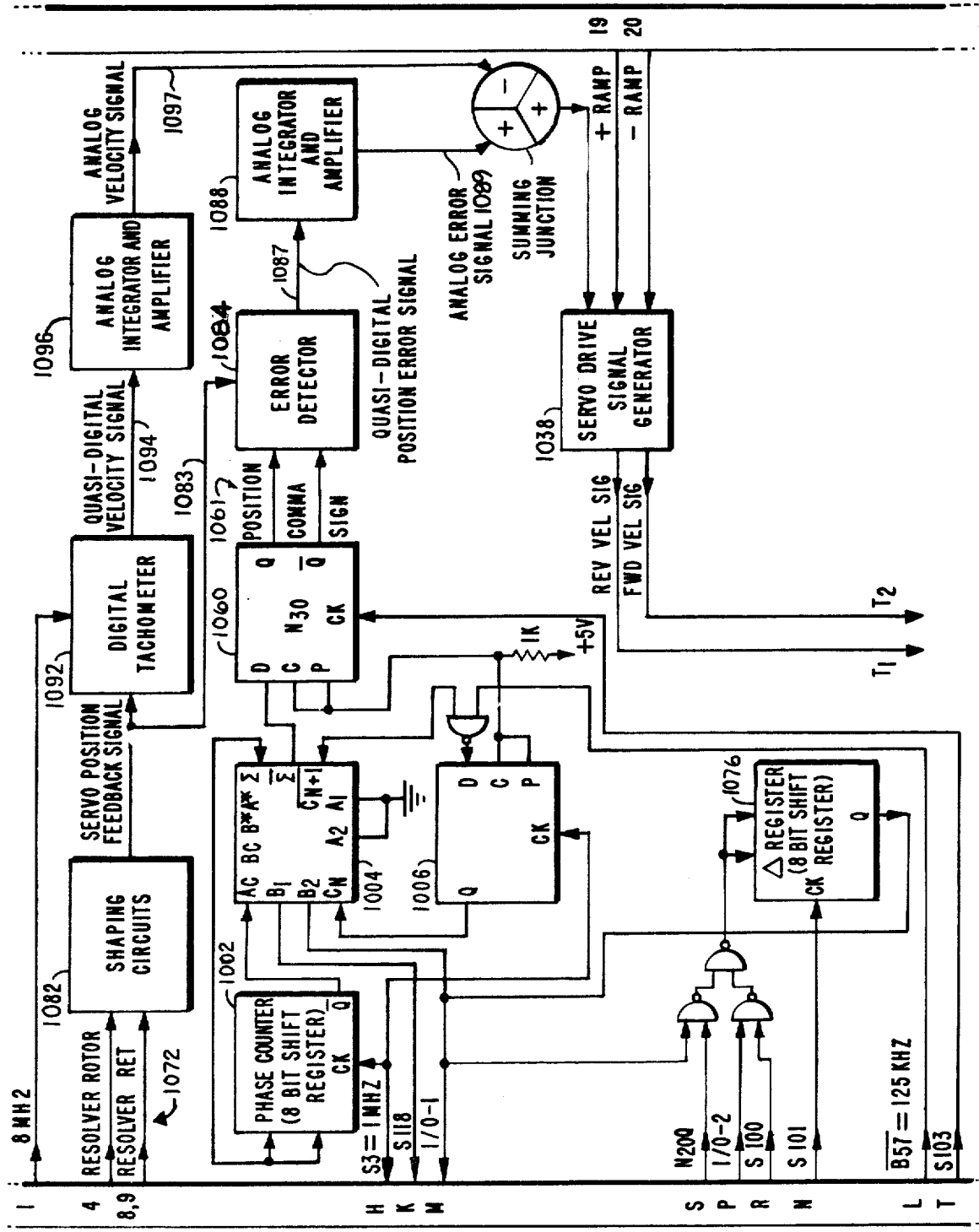
Figure 10E:
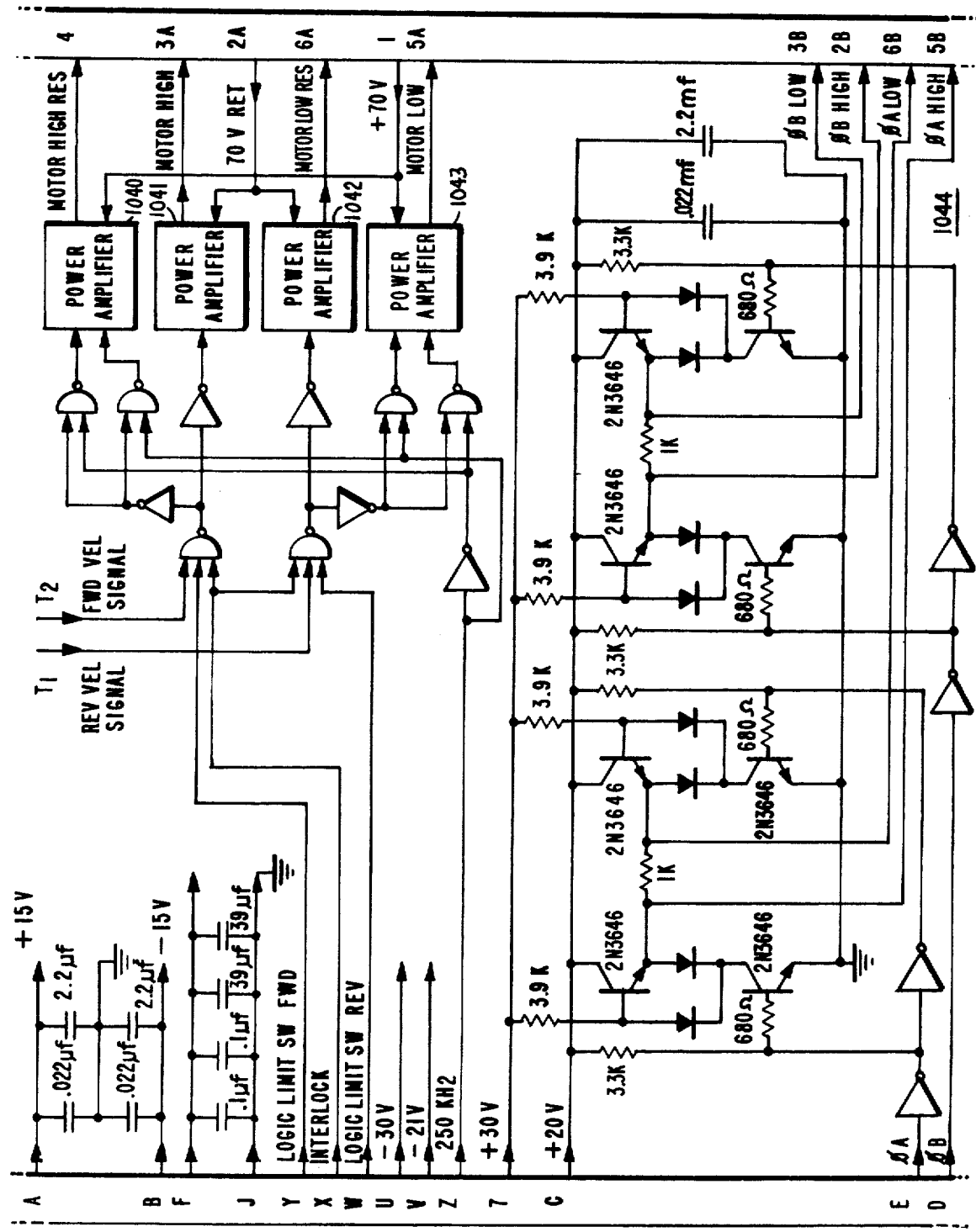

As shown in FIGS. 10B and 10C the servo common board provides control signals for servo operation and updating. The three servos 120, 121 and 122 (FIG. 1A) are identical in this embodiment of the invention and exemplified by the X-axis servo 120 as shown in FIGS. 10D and 10E. The three servo channel boards, the servo common board and the A-Register are serially connected in a loop. Data passes from the A-Register and is input to a Δ-Register 1076 (FIG. 10D) on the X-axis servo board via I/O channel-2. Data then passes from the X-axis channel board via I/O channel-1 to the I/O channel-2 of the Y-axis servo board (not shown). Similarly, data passes out of the Y-axis servo board into the Z-axis servo board (not shown) and out of the Z-axis servo board to the common board F-Register 1010 and back to the A-Register. Thus, communication is provided between the data processor, the three servo channel boards and the servo common board.

The servo drives generate control signals to position the servo motors in response to these commands transferred from the data processor. A resolver 1078 (FIG. 10A) is used to provide a closed servo feedback loop. Resolvers are excited with digital square waves generated on the common board by a flip flop counter, $N_{22}$ 1079 and $N_{23}$ 1081. The resolver output signal is a square wave that is processed on the servo board with shaping circuits 1082 and applied to an error detector 1048 which also receives command signals from a flip-flop $N_{30}$ 1060. A quasi-digital position error signal 1087 from the error detector 1084 is connected to an analog error signal by an analog integrator and amplifier 1088. The command signals, which is a square wave, is generated by the phase counter 1002, which is continually incremented to form a square wave, where the phase of that square wave is changed by a number in the Δ-Register 1076 with a full adder 1004 and carry flip-flop 1006. The command signal 1061 is a square wave with a phase that is advanced or retarded wtih a positive or negative Δ command number. The phase counter sign bit $N_{30}$ 1060 provides a command square wave which is compared with the resolver feedback square wave 1083 in the error detector 1084 to generate an error signal. As shown in FIG. 10F this error signal has a polarity defined by the $N_{31}$ flip-flop 1050 which defines whether the feedback signal leads or lags the command signal. NAND gates 1093 provide an exclusive or function defining the out-of-phase condition of the feedback and command square waves with an output pulse 1054 having a width that is proportional to the magnitude of the error. The error signal is actually a two wire ternary signal, wherein the line 1056 or 1058 that contains the pulse defines the polarity and the width of the pulse defines the magnitude.

The contour commands are provided to the servos 120, 121, and 122 by the data processor 112 under program control. They are generated successively in real time at an elemental device determined rate and consist of whole number delta commands for each of the servos to command intermediate path defining points along the contour, known to those skilled in the art as interpolation commands. These commands are provided in real time under data processor program control, wherein real time is herein intended to mean having a time characteristic associated with the time related response of the elemental extremity.

As shown in FIGS. 10D and 10E and more particularly in FIG. 10G the feedback signal is processed with a digital tachometer 1092 which compares the input square wave 1083 from the resolver 1078 with a reference square wave generated in the tachometer 1092. Flip flops $N_{32}$ 1005 and $N_{33}$ 1007 synchronize the reference square wave counter 1003 with the feedback signal 1083, while the output gates 1008 detect the pulse width difference between the reference and feedback square waves as indicative of velocity. The polarity of this velocity is defined by whether the reference square wave is of a greater or lesser period than the feedback square wave.

The calculations for the commands which are loaded into the Δ register 1076 (FIGS. 17A and 17B) are performed in the data processor under program control. This capability eliminates the need for the digital differential analyzer computational elements typically used for contouring. The relative magnitudes of the Δ parameters loaded into the plurality of channel card Δ registers define the relative position commands or, as a function of time, the relative velocity commands of the plurality of servo channels. As these commands are executed, the three servo axes are driven relative to each other to provide fully synchronized operation controlled through the computations in the data processor.

As shown in FIGS. 10B and 10C, the data processor also controls the speed at which the Δ parameters increment the phase counter. The data processor loads a number into the FR-Register 1010, and this number is added to the R-Register 1012 every half cycle, as controlled by the signal 1035 from the excitation counter composed of flip-flops $N_{25}$ 1017 and $N_{24}$ 1016. When the R-Register 1012 overflows, an update is commanded causing adder 1018 and associated carry flip-flop $N_{27}$ 1020 to add the contents of the Δ-Register 1076 to the phase counter 1002 (FIG. 10D) to execute the contour command. The mode control flip flops $N_{21}$ 1022 and $N_{20}$ 1024 are reset to request additional contour information from the data processor through the $N_{26}$ flip flop 1026 and its SD 13 output signal. It should be noted that this SD-13 (hexadecimal) is the same as the previously described SD-11 (decimal), where hexadecimal and decimal numbers may in general be interchanged herein. After loading new contour command, the data processor will generate the $\overline{DC13}$ signal to initiate another contour step.

An alternate technique would replace the $N_{30}$ flip-flop 1016 (FIG. 10D) with a toggle flip flop which would be clocked by a data processor discrete output command at appropriate times thereby generating an output square wave with the timing of that discrete output command controlling the phase and thereby defining the whole number position command. This controlled square wave is an intrinsic signal form which is used directly by the servos in the error detector 1084 (FIG. 10D) as the command input. It is generated directly by the data processor with a precisely timed discrete output under program control as defined by the contouring computations.

The data processor can operate interactively in conjunction with the servo intrinsic signal forms where the square wave servo has parameters such as velocity 1094, position 1083, and position error 1087 available in square wave form. The data processor can interrogate these square wave signals as discrete inputs with the skip on discrete instructions and derive the parameter from the pulse width or phase of the square waves.

As shown in FIG. 10B the common board further includes a power supply 1034, a ramp generator 1036 generating ramp functions used by a servo drive signal generator 1083 (FIG. 10D), and counters generating signals used by the ramp generator.

As shown in FIG. 10E, the channel board further includes motor drive power amplifier 1000, 1041, 1042 and 1043 as well as resolver excitation 1044.

TABLE I

A-Register $A_{15}D = FAD \cdot [(K_2Q \cdot P50) + (K_3 \cdot Q \cdot P51) + (K_4Q \cdot P52) + (K_5Q \cdot P53)] + (FAQ \cdot SPM_0Q) + (FAB \cdot P108) + (FAE \cdot K_1Q) + A_0Q \cdot FW \cdot SPM_0 \cdot Q + A_0Q[FAC + FAF + W0 + (FD + F \cdot G) \cdot (B_3Q + B_2Q)] + (FT + FU + FX) (\Sigma A)$ $\overline{A_N}$ Clock = $P_3 \cdot [FAQ + FAB + FAE + FW + FAC + FAD + FAF + W0 + FT + FU + FX + (FD + FG) \cdot (B_3Q + B_2Q)]$

A-Adder $\Sigma A = [(P2 \cdot FB) + (FT + FU + FX) \cdot A_0Q + FC] \oplus [FU \oplus SPM_0Q] \oplus [K_7Q + FU \cdot B15]$
$\overline{A_C} = A_0Q \cdot P18 + FB \cdot P2$
$A^* = FC$
$A_1 = A_2 = B_1 = B_2 =$ Ground
$\overline{B_C} = P85 + FU$
$C_N = K_7Q + FU \cdot B15$
$C_{N+1}A = [(P2 \cdot FB) + (FT + FU + FX) \cdot A_0Q + FC] \cdot [FU \oplus SPM_0Q] + [(P2 \cdot FB) + (FT + FU + FX) \cdot A_0Q + FC] \cdot [(K_7Q + FU \cdot B15] + [FU \oplus SPM_0Q] \cdot [K_7Q + FU \cdot B15]$

B Flip Flops $B_0T = B0[\overline{D_0Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH]$
$B_0$ Clock = $\overline{P3\Delta}$
$B_1T = B_0Q + B0 \cdot [\overline{D_1Q} \cdot (C_3Q \cdot \overline{C_2Q} \cdot \overline{C_1Q} \cdot C_0Q \cdot K_{11}Q \cdot W0)] + \overline{Y6} \cdot W1 \cdot \overline{C_3Q} \cdot C_2Q + FAB + FAC + FAD + FAH]$
$B_1$ Clock = $\overline{P3\Delta}$
$B_2T = B_0Q + B_1Q + B0 \cdot [\overline{D_2Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH + W3 \cdot \overline{Y11} + C_2Q \cdot C_3Q \cdot W0 + K_2Q \cdot \overline{K_1Q} \cdot W0 + \overline{Y11} \cdot W0 + W6]$
$B_2$ Clock = $\overline{P3\Delta}$
$B_3T = B_0Q + B_1Q + B_2Q + B0 \cdot [\overline{D_3Q} \cdot (C_3Q \cdot \overline{C_2Q} \cdot \overline{C_1Q} \cdot C_0Q \cdot K_{11}Q \cdot W0) + \overline{Y6} \cdot W1 \cdot \overline{C_3Q} \cdot C_2Q + FAB + FAC + FAD + FAH + W1 + W4 + W5 + FE + FM]$
$B_3$ Clock = $\overline{P3\Delta}$

C-Register $C_0D = I4$
$\overline{C_0 \text{ Clock}} = \overline{P3} \cdot B0 \cdot (FAM + FZ)$
$C_1D = I5$
$\overline{C_1 \text{ Clock}} = \overline{P3} \cdot B0 \cdot (FAM + FZ)$
$C_2D = \overline{I6} \cdot (FAM + FZ)$
$\overline{C_2 \text{ Clock}} = \overline{P3} \cdot B0 \cdot (FR + FS + FAI + FJ + FAM + FZ)$
$C_3D = I7$
$\overline{C_3 \text{ Clock}} = \overline{P3} \cdot B0 \cdot (FAM + FZ)$

D-Register $D_{11}D = P2 \cdot (FA + FC) + B11 \cdot FJ + B10 \cdot (FR + FS) + M_0Q \cdot FK + \Sigma A \cdot FB + (FD + FG)(B_3Q + B_2Q) \cdot A_0Q$
$\overline{D_N}$ Clock = $\overline{P3}[FJ + FK + FR + FS + FD + FG \cdot (B_3Q + B_2Q) \cdot W0]$

M-Register $M_{11}D = P43 = B9 \cdot FAL + (FD + FY) \cdot SPM_0Q + D_0Q \cdot FR + FK \cdot K_7Q + (\Sigma M \cdot B10) \cdot (FAI + FAG \cdot P105) + (\Sigma M \cdot B11) \cdot [FAG \cdot P105 + (\overline{B_3Q} + \overline{B_2Q}) \cdot W0 + FS + FO + FG + FJ]$
$\overline{M_N}$ Clock = $\overline{P42} = \overline{P3} \cdot [(B_3Q + B_2Q) \cdot (FAL + FY) + FK + FR + FD + FAI + FAG \cdot P105 + (\overline{B_3Q} + \overline{B_2Q}) \cdot W0 + FS + FO + FG + FJ]$

M-Adder $\Sigma M = M_0Q \oplus K_8Q \oplus P44$
$A_1 = A_2 = B_1 = B_2 =$ Ground
$C_N = K_8Q$
$C_{N+1}M = (M_0Q \cdot K_8Q) + (M_0Q \cdot P43) + (K_8Q \cdot P43)$
$\overline{A_C} = M_0Q$
$\overline{B_C} = P_{44}A$
$\overline{B^*} = P_{44}B$

W Flip Flops $W_0T = FR + FS + FJ + [FZ \cdot \overline{L_1Q} \cdot (\text{interrupt} + K_1Q)]$
$W_0$ Clock = $P3 \cdot B0$
$W_1T = W_0Q + FZ \cdot Y10$
$W_1$ Clock = $P3 \cdot B0$
$W_2T = W_0Q \cdot W_1Q$
$W_2$ Clock = $P3 \cdot B0$

Z-Register $Z_ND = A_0Q$ (Delayed)
$\overline{Z_N \text{ Clock}} = OW\text{-}7 \cdot Bi$, where $i = 11\text{-}N$

$C_{15\text{-}6}$-Register $C_{15}D = A_0Q$ (Delayed)
$C_N$ Clock = OW-8 (Turret Select)

K-Register $K_0D = FB$
$\overline{K_0 \text{ Clock}} = \overline{P3} \cdot B14$
$K_1D = (FA + FB) \cdot C_3Q \cdot A_0Q + FV + \overline{Y10} \cdot FZ + FC \cdot \Sigma A$
$\overline{K_1}$ Clock = $\overline{P3} \cdot B0 \cdot [FV + FL + W0 + W7 + (\overline{Y10} + C_3Q) \cdot FZ]$
$K_2D = FAD \cdot A_0Q + FC$
$\overline{K_2 \text{ Clock}} = \overline{P3} \cdot (FZ + FAD + W7 + FC)$
$K_3D = FAD \cdot K_2Q + FL + FV \cdot D_0Q$
$\overline{K_3}$ Clock = $\overline{P3} \cdot [C_3Q \cdot FZ + FL \cdot B11 + B0 \cdot W0 + B0 \cdot W7 + FV + FAD]$
$K_4D = FL \cdot Y4 + FV \cdot D_1Q + FAD \cdot K_3Q$
$\overline{K_4}$ Clock = $\overline{P3} \cdot [C_3Q \cdot FZ + FL \cdot B11 + B0 \cdot W0 + B0 \cdot W7 + FV + FAD]$
$K_5D = Y2 \cdot W0 + FV \cdot D_2Q + FAD \cdot K_4Q + FL \cdot K_5Q$
$\overline{K_5}$ Clock = $\overline{P3} \cdot [C_3Q \cdot FZ + FL \cdot B11 + B0 \cdot W0 + B0 \cdot W7 + FV + FAD]$
$\overline{K_7}D = [C_{N+1}A \cdot \overline{B0} \cdot \overline{FK} \cdot \overline{FX} + FK \cdot D_0Q]$
$\overline{K_7}$ Clock = $\overline{P3} \cdot [FK + FAQ + FAB + FAE + FW + FAC + FAF + FAD + FT + FU + FX + W0 + (FD + FG) \cdot (B_3Q + B_2Q)]$
$K_8D = C_{N+1}M \cdot \overline{B0}$
$\overline{K_8}$ Clock = $\overline{P3} \cdot [(B_3Q + B_2Q) \cdot (FAL + FY) + FK + FR + FD + FAI + FAG \cdot P105 + (\overline{B_3Q} + \overline{B_2Q}) \cdot W0 + FS + FO + FG + FJ]$
$K_{10}D = I2$
$\overline{K_{10} \text{ Clock}} = \overline{P3} \cdot B0 \cdot (FAM + FZ)$
$K_{11}D = I3$
$\overline{K_{11} \text{ Clock}} = \overline{P3} \cdot B0 \cdot (FAM + FZ)$

I Flip-Flops (FIG. 9I)

$I_1T = V_{CC}$
$\overline{I_1 \text{ Clock}} = D0\text{-}8$
$I_2T = V_{CC}$
$\overline{I_2 \text{ Clock}} = D0\text{-}4$
$I_3T = V_{CC}$
$\overline{I_3 \text{ Clock}} = D0\text{-}5$
$I_4T = V_{CC}$
$\overline{I_4 \text{ Clock}} = D0\text{-}6$

L-Register $L_1D = 0$
$L_1P = \overline{L_2Q}$ (Power Supply Active Signal)
$L_1$ Clock = $\overline{P106} =$ Discrete Output 2
$L_2D = P87$
$L_2$ Clock = W0

A Overflow Flip-Flop (OF$_i$)

$OF_iD = (\overline{A_0Q \cdot P18}) \cdot (\overline{FB \quad P2}) \cdot (P85 \oplus FU) \cdot K_7Q + A_0Q \cdot P18 + FB \cdot P2 \cdot (P85 \oplus FU) \cdot \overline{K_7Q}$ $\overline{OF_i}$ Clock $= (FT + FU) \cdot \overline{P3}$ Lamp Display Register ($L_3$-$L_{15}$)

$L_{15}D = A_0Q$
$L_N$ Clock $= OW$-11

Numeric display Register ($N_0$-$N_{15}$)

$N_{15}D = A_0Q$
$N_N$ Clock $= OW$-9

TABLE II

P Terms $P0 = \Sigma A$
$P1 = \Sigma M$
$P2 = [I0 \cdot B7 + I1 \cdot B\text{-}6 + I2 \cdot B5 + I3 \cdot B4 + I4 \cdot B3 + I5 \cdot B2 + I6 \cdot B\text{-}1 + I7 \cdot B0] \cdot [FN + FQ] + (B13 \cdot I2) \cdot (\overline{C_3Q} + C_2Q + \overline{C_0Q}) + I1 \cdot B14 + I0 \cdot B15 + I4 \cdot B11 \cdot C_3Q \cdot C_2Q + (I3 \cdot B1\text{-}2) \cdot [(\overline{C_3Q} + \overline{C_0Q}) + (C_3Q \cdot C_2Q \cdot C_1Q \cdot C_0Q)]$
$P3 = \overline{P109 \cdot B_4Q} = (B_5Q \cdot B15 - 8 \quad mc \cdot \overline{B15}) \cdot B_4Q = $ Master Clock
$P3\Delta = P3$ delayed clock
$P4 = A_0Q$
$P7 = (\overline{C_1Q} \ \overline{C_0Q} + K_{11}Q)K_{10}Q \ \overline{K_0Q} \ D_1Q \ D_2Q$
$P11 = \overline{C_3Q} \cdot C_2Q$
$P12 = C_0Q \cdot \overline{C_1Q} \cdot \overline{C_2Q} \cdot C_3Q$
$P14 = C_3Q \cdot \overline{C_2Q} \cdot \overline{C_1Q} \cdot C_0Q \cdot K_{11}Q \cdot W0$
$P15 = C_2Q \cdot C_3Q$
$P16 = Y38 \cdot C_0Q \rightarrow FT + FU$
$P17 = FW + FX + FU + FT + FAC + FAQ$
$P18 = FT + FU + FX$
$P21 = B_2Q + B_3Q$
$P22 = \overline{B_2Q} + \overline{B_3Q}$
$P24 = B0 \cdot \overline{P3} = B0 (\text{Early Clock})$
$P25 = \overline{K_1Q} \cdot K_2Q$
$P26 = K_4Q + K_5Q$
$P27 = \overline{Y11} \cdot \overline{K_5Q} \cdot \overline{K_1Q}$
$P28 = FAD \cdot (K_2Q \cdot P50 + K_3Q \cdot P51 + K_4Q \cdot P52 + K_5Q \cdot P53) + FAQ \cdot P85$
$P29 = FA + FC$
$P30' = FC + FB$
$P31 = FA + FB$
$P33 = W3 \cdot \overline{Y11} + (C_2Q \cdot C_3Q + \overline{K_1Q} \cdot K_2Q + \overline{Y11})W0 + W6$
$P35 = W0 + W7$
$P36 = W2 + W5$
$P37 = FD + FG$
$P38 = W1 + W4 + W5 + W2 \cdot \overline{Y11}$
$P39 = FAM + FZ$
$P40 = (FR + FS + FAI + FJ) + (FAM + FZ)$
$P41 = FR + FS$
$P42 = \overline{P3} \cdot [(B_3Q + B_2Q) \cdot (FAL + FY) + FK + FR + FD + FAI + FAG \cdot P105 + (\overline{B_3Q} + \overline{B_2Q}) \cdot W0 + FS + F0 + FG + FJ]$
$P44 = P44A + P44B = B10 \cdot (FAI + FAG \cdot P105) + B11 \cdot (FAG \cdot P105 + \overline{B_2Q} \cdot W0 + \overline{B_3Q} \cdot W0 + FS + F0 + FG + FJ)$
$P44A = (FAI + FAG \cdot P105)B10$
$P44B = (FAG \cdot P10530 (\overline{B_2Q} + \overline{B_3Q})W0 + FS + F0 + FG + FJ)B11$
$P47 = W1 \cdot SPM_0Q \cdot \overline{FY} \cdot \overline{C_3Q} \cdot C_2Q + P2 \cdot (FN + F0) + [FD + (B_3Q + B_2Q) \cdot (FAL + FY)(B_3Q + B_2Q)]M_0Q + P88$
$P48 = FAL + FY + FN + FQ + B_2Q \cdot FE + FW + FX + FU + FT + FAC + FC + FB + FD + FAQ$
$P50 = P133 \cdot \overline{A} \cdot \overline{B} \cdot \overline{C}$
$P51 = P133 \cdot \overline{A} \cdot \overline{B} \cdot C$
$P52 = P133 \cdot \overline{A} \cdot B \cdot \overline{C}$
$P53 = P133 \cdot \overline{A} \cdot B \cdot C$
$P54 = P133 \cdot A \cdot \overline{B} \cdot \overline{C}$
$P55 = P133 \cdot A \cdot \overline{B} \cdot C$
$P56 = P133 \cdot A \cdot B \cdot \overline{C}$
$P57 = P133 \cdot A \cdot B \cdot C$
$P58 = P134 \cdot \overline{A} \cdot \overline{B} \cdot \overline{C}$
$P59 = P134 \cdot \overline{A} \cdot \overline{B} \cdot C$
$P60 = P134 \cdot \overline{A} \cdot B \cdot \overline{C}$
$P61 = P134 \cdot \overline{A} \cdot B \cdot C$
$P62 = P134 \cdot A \cdot \overline{B} \cdot \overline{C}$
$P63 = P134 \cdot A \cdot \overline{B} \cdot C$
$P64 = P134 \cdot A \cdot B \cdot \overline{C}$
$P65 = P134 \cdot A \cdot B \cdot C$
$A = FAL + W0 \cdot K_3Q + Y11 \cdot \overline{FY} \cdot W1 \cdot D_0Q$
$B = W0 \cdot K_4Q + Y11 \cdot \overline{FY} \cdot W1 \cdot D_1Q + FY + \overline{Y11} \cdot \overline{W0}$
$C = W0 \cdot K_5Q + Y11 \cdot \overline{FY} \cdot W1 \cdot D_2Q$
$P85 = SPM_0Q$ (all registers)
$P87 = $ External interrupt
$P88 = FAQ \cdot SPM_0Q + FB \cdot SPM_0Q + FC \cdot \Sigma A + FAC \cdot A_0Q$
$P89 = $ External interrupt
$P90 = (FR + FS) + (FD + FG)$
$P91 = Y6 \cdot W1 \cdot \overline{C_3Q} \cdot C_2Q + FAB + FAC + FAD + FAH$
$P92 = B7 \cdot B_4Q \cdot (P36 + P91) = $ Cycle initiate command
$P93 = B3 \cdot B_4Q \cdot (P36 + P91) = $ Restore command
$\overline{P97} = (FAL + FY)(B_3Q + B_2Q)$
$P98 = FAL + FY$
$P99 = \Sigma A \cdot \overline{FB}$
$P101 = \overline{B11 \cdot I4 \cdot C_2Q \cdot C_3Q}$
$P102 = (\overline{C_0Q \cdot C_3Q}) + (C_0Q \cdot \overline{C_1Q} \cdot \overline{C_2Q} \cdot C_3Q)$
$P103 = (\overline{K_5Q \cdot Y11})(M_9Q + \overline{M_{10}Q} + \overline{M_{11}Q}) = $ RW Mode
$P104 = \overline{P3} \cdot FAB$
$P105 = P50 \cdot DI\text{-}0 + P51 \cdot DI\text{-}1 + P52 \cdot DI\text{-}2 + P53 \cdot DI\text{-}3 + P54 \cdot DI\text{-}4 + P55 \cdot DI\text{-}5 + P56 \cdot DI\text{-}6 + P57 \cdot DI\text{-}7 + P58 \cdot DI\text{-}8 + P59 \cdot DI\text{-}9 + P60 \cdot DI\text{-}10 P61 \cdot DI\text{-}11$ (Discrete input DI-n To Data Processor)
$P106 = FAH \cdot P51 = DO\text{-}2$ (Resets $L_1$ flip flop during power turn-on)
$P108 = IW\text{-}0 \cdot P50 + IW\text{-}1 \cdot P51 + IW\text{-}2 \cdot P52 + IW\text{-}3 \cdot P53 + IW\text{-}4 \cdot P54 + IW\text{-}5 \cdot P55 + IW\text{-}6 \cdot P56 + IW\text{-}7 \cdot P57$
$P109 = B_5Q \cdot B15 + 8mc \cdot \overline{B15}$
$P110 = \overline{M_9Q + \overline{M_{10}Q} + \overline{M_{11}Q}}$
$P111 = \overline{I6} \cdot P59 = \overline{I6}(FAM + FZ)$
$P112 = (FR + FS + FAI + FJ + FAM + FZ)B0 \cdot P3$
$P113 = (FAM + FZ)B0 \cdot P3$
$\overline{P114} = FAI + FAG \cdot P105 + (\overline{B_3Q} + \overline{B_2Q}) \cdot W0 + FS + F0 + FG + FJ$
$P115 = FAQ + FAB$
$P116 = (\overline{FAB + FAG + FAH})I_1Q$
$P120 = SPM_0Q$ (4 registers)
$P121 = SPM_0Q$ (4 registers)
$\overline{P133} = Y11 \cdot \overline{FY} \cdot W1 \cdot \overline{D_4Q} \cdot \overline{D_3Q}$
$\overline{P134} = Y11 \cdot \overline{FY} \cdot W1 \cdot \overline{D_4Q} \cdot D_3 \cdot Q$
$\overline{P135} = Y11 \cdot \overline{FY} \cdot W1 \cdot D_4Q \cdot \overline{D_3Q}$
$\overline{P136} = Y11 \cdot \overline{FY} \cdot W1 \cdot D_4 \cdot Q \cdot D_3Q$
$\overline{P151} = \overline{JOG} \cdot (S8 + S9 + S10 + S11)$
$P152 = $ Servo Lockup $+ \overline{JOG} \cdot (\overline{S8} + \overline{S9} + \overline{S10} + \overline{S11})$
$P153 = \overline{S8}$
$P154 = \overline{S9}$
$P155 = \overline{S10}$
$P156 = \overline{S11}$
$P158 = \overline{Y11} \cdot K_5Q \cdot W2$
$P511 = FN + FQ$ Memory Output Lines $I_7$—Most Significant Bit
$I_6$—Second Significant Bit $I_5$—Third Significant Bit
$I_4$—Fourth Significant Bit
$I_3$—Fifth Significant Bit
$I_2$—Sixth Significant Bit
$I_1$—Seventh Significant Bit
$I_0$—Least Significant Bit

Y Terms $Y1 = (\overline{C_1Q} \cdot \overline{C_0Q} + K_{11}Q) K_{10}Q \cdot \overline{K_0Q} \cdot D_1Q \cdot D_0Q + Y6 + K_1Q \cdot K_2Q$
$Y2 = \overline{Y11} \cdot \overline{K_{11}Q} \cdot K_{10}Q \cdot C_1Q \cdot \overline{C_0Q} \cdot \overline{D_1Q} \cdot D_0Q$
$Y3 = \overline{C_3Q} \cdot \overline{C_2Q} \cdot C_1Q \cdot \overline{C_0Q} \cdot K_{11}Q \cdot K_{10}Q \cdot I_1 \cdot \overline{I_0}$
$Y4 = K_1Q \cdot K_2Q + Y6$
$Y5 = Y3 + K_2Q$
$Y6 = C_1Q \cdot \overline{C_0Q} \cdot \overline{K_{11}Q} \cdot D_0Q$
$Y7 = \overline{L_3Q} + K_1Q$
$Y10 = (P89 + Y7)\overline{L_1Q}$
$Y11 = C_2Q + C_3Q$
$Y38 = \overline{Y6} \cdot W1 \cdot C_3Q \cdot C_2Q$
$Y39 = C_3Q \cdot \overline{C_2Q} \cdot W1$

B Terms $B0 = \overline{B_3Q} \cdot \overline{B_2Q} \cdot \overline{B_1Q} \cdot \overline{B_0Q}$
$B1 = \overline{B_3Q} \cdot \overline{B_2Q} \cdot \overline{B_1Q} \cdot B_0Q$
$B2 = \overline{B_3Q} \cdot \overline{B_2Q} \cdot B_1Q \cdot \overline{B_0Q}$
$B3 = \overline{B_3Q} \cdot \overline{B_2Q} \cdot B_1Q \cdot B_0Q$
$B4 = \overline{B_3Q} \cdot B_2Q \cdot \overline{B_1Q} \cdot \overline{B_0Q}$
$B5 = \overline{B_3Q} \cdot B_2Q \cdot \overline{B_1Q} \cdot B_0Q$
$B6 = \overline{B_3Q} \cdot B_2Q \cdot B_1Q \cdot \overline{B_0Q}$
$B7 = \overline{B_3Q} \cdot B_2Q \cdot B_1Q \cdot B_0Q$
$B8 = B_3Q \cdot \overline{B_2Q} \cdot \overline{B_1Q} \cdot \overline{B_0Q}$
$B9 = B_3Q \cdot \overline{B_2Q} \cdot \overline{B_1Q} \cdot B_0Q$
$B10 = B_3Q \cdot \overline{B_2Q} \cdot B_1Q \cdot \overline{B_0Q}$
$B11 = B_3Q \cdot \overline{B_2Q} \cdot B_1Q \cdot B_0Q$
$B12 = B_3Q \cdot B_2Q \cdot \overline{B_1Q} \cdot \overline{B_0Q}$
$B13 = B_3Q \cdot B_2Q \cdot \overline{B_1Q} \cdot B_0Q$
$B14 = B_3Q \cdot B_2Q \cdot B_1Q \cdot \overline{B_0Q}$
$B15 = B_3Q \cdot B_2Q \cdot B_1Q \cdot B_0Q$

W Terms $W0 = \overline{W_2Q} \cdot \overline{W_1Q} \cdot \overline{W_0Q}$
$W1 = \overline{W_2Q} \cdot \overline{W_1Q} \cdot W_0Q$
$W2 = \overline{W_2Q} \cdot W_1Q \cdot \overline{W_0Q}$
$W3 = \overline{W_2Q} \cdot W_1Q \cdot W_0Q$
$W4 = W_2Q \cdot \overline{W_1Q} \cdot \overline{W_0Q}$
$W5 = W_2Q \cdot \overline{W_1Q} \cdot W_0Q$
$W6 = W_2Q \cdot W_1Q \cdot \overline{W_0Q}$
$W7 = W_2Q \cdot W_1Q \cdot W_0Q$

Input Words

IW-0 = B11·P3 + B10·P2 + B9·P1 + B8·P0 + B7·Spare + B6·J2 + B5·J130   B4·J0 + B3·M2 + B2·M1 + B1·M0 + B0·Spare (Selector Switch Scanout and Input Channel-0)

IW-1 = B7·SA + B6·SB + B5·SC + B4·SD + B3·SE + B2·Spare + B1·SV + B0·$\overline{SJ}$ (Momentary Switch Scanout and Input Channel-1)

IW-2 = Spare

IW-3 = B11·S11 + B10·S10 + B9·S9 + B8·S8 + B7·S7 + B6·S6 + B5·S5 + B4·S4 + B3·S3 + B2·S2 + B1·S1 + B0·Spare (Auxiliary Control Signals)

IW-4 = B11·T0 + B10·T1 + B9·T2 + B8·T3 + B7·T4 + B6·T5 + B5·T6 + B4·T7 + B3·Spare + B2·Spare + B1·Spare + B0·T8 (Elemental Tape Reader Inputs)

IW-5 = $NRR_0Q$ (Numeric Display Register)

IW-6 = Spare

IW-7 = Spare

Output Words $OW\text{-}3 = \overline{P53} \cdot \overline{P104}$
$OW\text{-}4 = \overline{P54} \cdot \overline{P104}$
$OW\text{-}5 = \overline{P55} \cdot \overline{P104}$
$OW\text{-}6 = \overline{P56} \cdot \overline{P104}$
$OW\text{-}7 = \overline{P57} \cdot \overline{P104}$
$OW\text{-}8 = \overline{P58} \cdot \overline{P104}$
$OW\text{-}9 = \overline{P59} \cdot \overline{P104}$
$OW\text{-}10 = \overline{P60} \cdot \overline{P104}$
$OW\text{-}11 = \overline{P61} \cdot \overline{P104}$

Discrete Outputs $D0\text{-}0 = FAH \cdot P50$
$D0\text{-}1 = FAH \cdot P51$
$D0\text{-}2 = FAH \cdot P52$
$D0\text{-}3 = FAH \cdot P53$
$D0\text{-}4 = FAH \cdot P54$
$D0\text{-}5 = FAH \cdot P55$
$D0\text{-}6 = FAH \cdot P56$
$D0\text{-}7 = FAH \cdot P57$
$D0\text{-}8 = FAH \cdot P58$
$D0\text{-}9 = FAH \cdot P59$
$D0\text{-}10 = FAH \cdot P60$
$D0\text{-}11 = FAH \cdot P61$

S Terms $S3 = 1$ MHZ
$S100 = FAB \cdot \overline{N_{20}Q}$
$S101 = \overline{S100} + S3 \cdot N_{20}Q$
$S103 = \overline{S3} \cdot BS7$
$BS7 = $ Bit time 7 in the servo bit time counter
$S118 = N_{20}Q \cdot \overline{N_{21}Q}$
$\phi A = N_{22}Q$
$\phi B = N_{23}Q$

TABLE III $FA = W0 \cdot \overline{K_1Q} \cdot (\overline{B15} \cdot Y3 + K_2Q)$
$FB = W0 \cdot K_1Q \cdot (\overline{B15} \cdot Y3 + K_2Q)$
$FC = W0 \cdot (B15 \cdot \overline{C_3Q} \cdot \overline{C_2Q} \cdot C_1Q \cdot C_0 \cdot \overline{K_{11}Q} \cdot K_{10}Q \cdot I_1 \cdot \overline{I_0} + K_2Q)$
$FD = \overline{C_3Q} \cdot \overline{C_2Q} \cdot K_5Q \cdot W1$
$FE = \overline{C_3Q} \cdot \overline{C_2Q} \cdot K_5Q \cdot W2$
$FF = \overline{C_3Q} \cdot \overline{C_2Q} \cdot K_5Q \cdot W3$
$FG = \overline{C_3Q} \cdot \overline{C_2Q} \cdot K_5Q \cdot W4$
$FH = \overline{C_3Q} \cdot \overline{C_2Q} \cdot K_5Q \cdot W5$
$FI = \overline{C_3Q} \cdot \overline{C_2Q} \cdot K_5Q \cdot W6$
$FJ = \overline{C_3Q} \cdot \overline{C_2Q} \cdot (K_4Q + K_5Q) \cdot W7$
$FK = \overline{C_3Q} \cdot \overline{C_2Q} \cdot K_5Q \cdot (B11 \cdot Y1 + K_3Q) \cdot \overline{FAI}$
$FL = \overline{C_3Q} \cdot \overline{C_2Q} \cdot K_5Q \cdot (B11 \cdot Y1 + K_3Q) \cdot W1$
$FM = \overline{C_3Q} \cdot \overline{C_2Q} \cdot \overline{K_5Q} \cdot \overline{K_1Q} \cdot W2$
$FN = \overline{C_3Q} \cdot \overline{C_2Q} \cdot \overline{K_5Q} \cdot \overline{K_1Q} \cdot W3$
$FO = \overline{C_3Q} \cdot \overline{C_2Q} \cdot \overline{K_5Q} \cdot \overline{K_1Q} \cdot W4$
$FP = \overline{C_3Q} \cdot \overline{C_2Q} \cdot \overline{K_5Q} \cdot \overline{K_1Q} \cdot W5$
$FQ = \overline{C_3Q} \cdot \overline{C_2Q} \cdot \overline{K_5Q} \cdot \overline{K_1Q} \cdot W6$
$FR = \overline{C_3Q} \cdot \overline{C_2Q} \cdot \overline{K_5Q} \cdot K_4Q \cdot \overline{K_3Q} \cdot \overline{K_1Q} \cdot W7$
$FS = \overline{C_3Q} \cdot \overline{C_2Q} \cdot \overline{K_5Q} \cdot K_4Q \cdot K_3Q \cdot \overline{K_1Q} \cdot W7$
$FT = Y38 \cdot \overline{C_1Q} \cdot C_0Q$
$FU = Y38 \cdot C_1Q \cdot C_0Q$
$FV = Y38 \cdot C_1Q \cdot \overline{C_0Q}$
$FW = Y38 \cdot \overline{C_1Q} \cdot \overline{C_0Q} \cdot K_{11}Q$
$FX = Y38 \cdot \overline{C_1Q} \cdot \overline{C_0Q} \cdot \overline{K_{11}Q}$
$FY = \overline{C_3Q} \cdot C_2Q \cdot C_1Q \cdot \overline{C_0Q} \cdot \overline{K_{11}Q} \cdot K_{10}Q \cdot D_0Q \cdot W1$
$FZ = (C_3Q + C_2Q)W2$
$FAB = C_3Q \cdot \overline{C_2Q} \cdot C_1Q \cdot \overline{C_0Q} \cdot W1$
$FAC = C_3Q \cdot \overline{C_2Q} \cdot \overline{C_1Q} \cdot \overline{C_0Q} \cdot W1$
$FAD = C_3Q \cdot \overline{C_2Q} \cdot \overline{C_1Q} \cdot C_0Q \cdot \overline{K_{11}Q} \cdot W1$
$FAE = C_3Q \cdot \overline{C_2Q} \cdot \overline{C_1Q} \cdot C_0Q \cdot \overline{K_{11}Q} \cdot K_{10}Q \cdot W1$ $FAF = C_3Q \cdot \overline{C_2Q} \cdot \overline{C_1Q} \cdot C_0Q \cdot K_{11}Q \cdot K_{10}Q \cdot W1$
$FAG = C_3Q \cdot C_2Q \cdot C_1Q \cdot W1$
$FAH = \overline{C_3Q \cdot C_2Q \cdot \overline{C_1Q} \cdot W1}$
$FAI = \overline{C_3Q} \cdot \overline{C_2Q} \cdot K_2Q \cdot K_1Q \cdot W1$
$FAJ = L_1Q \cdot W3$
$FAK = \overline{L_1Q \cdot \overline{P89} \cdot Y7 \cdot W3}$ $FAL = K_1Q \cdot W4$
$FAM = K_1Q \cdot W5$
$FAN = K_1Q \cdot W6$
$FAO = K_1Q \cdot W7$
$FAP = \overline{C_3Q} \cdot C_2Q \cdot Y6 \cdot \overline{K_{10}Q} \cdot W1$
$FAQ = C_1Q \cdot C_0Q \cdot Y39$

TABLE IV

| | Logic Card | | | | | | | | | |
|---|---|---|---|---|---|---|---|---|---|---|
| | A | B | C | D | K | W | SPM | IFA-1 | IFA-2 | IFA-3 |
| | Reference Figure | | | | | | | | | |
| Pin | 6 | 7 | 8 | 9 | 10 | 11 | 12 | 13 | 14 | 15 |
| 1 | Vcc | Vcc | Vcc | Vcc | Vcc | Vcc | Vcc | Vcc | Vcc | Vcc |
| 2 | — | — | — | B14 | $\overline{P30}$ | — | — | C9Q | W0 | — |
| 3 | Vcc | Vcc | Vcc | Vcc | Vcc | Vcc | Vcc | Vcc | Vcc | Vcc |
| 4 | $M_6Q$ | — | — | B15 | FC | — | — | C6Q | — | — |
| 5 | $M_8Q$ | — | — | B13 | $\overline{B15}$ | P27 | — | C8Q | OW-7 | — |
| 6 | $M_7Q$ | B9 | — | $\overline{P12}$ | $\overline{W0}$ | P24 | — | C7Q | — | — |
| 7 | $\overline{M_{10}Q}$ | 8MHZ | I2 | I0 | $\overline{Y11}$ | $\overline{FAM}$ | — | — | S1 | — |
| 8 | $M_9Q$ | B8 | — | I2 | $\overline{Y3}$ | Y11 | — | P105 | — | — |
| 9 | $\overline{M_{11}Q}$ | — | I3 | B4 | — | $\overline{FAL}$ | — | P104 | S0 | — |
| 10 | — | B6 | I4 | B7 | — | K1Q | — | OW-6 | — | — |
| 11 | P110 | — | I5 | I5 | — | $\overline{FD}$ | — | DI-5 | M1 | $\overline{S3}$ |
| 12 | $\overline{P110}$ | B5 | I7 | A | FAB | $\overline{P38}$ | — | DI-6 | — | — |
| 13 | — | — | $\overline{P113}$ | I7 | FK | P48 | — | DI-7 | — | $\overline{S0}$ |
| 14 | P110 | B4 | $\overline{P111}$ | B2 | P27 | — | — | DI-4 | $\overline{W0}$ | $\overline{S41}$ |
| 15 | FK | — | $\overline{P112}$ | I6 | FA1 | K5Q | — | P60 | — | — |
| 16 | FW | B3 | FAG | B0 | Y11 | Y10 | — | P59 | — | $\overline{S42}$ |
| 17 | — | — | $\overline{FV}$ | I4 | FL | W0 | — | P58 | B0 | — |
| 18 | W0 | B2 | P17 | B3 | D0Q | — | — | P57 | — | — |
| 19 | $\overline{FAD}$ | B0 | $\overline{FAH}$ | B6 | Y2 | K4Q | — | P56 | B3 | $\overline{S2}$ |
| 20 | $\overline{FAF}$ | B1 | W1 | $\overline{D0Q}$ | D2Q | W7 | — | P55 | B1 | $\overline{S1}$ |
| 21 | P16 | $\overline{P3}$ | C3Q | B5 | B11 | K3Q | — | P54 | — | — |
| 22 | P115 | — | P16 | I1 | D1Q | $\overline{FS}$ | — | P61 | B2 | — |
| 23 | $\overline{FAC}$ | B4Q | $\overline{K0Q}$ | P102 | — | — | — | L1Q | M0 | — |
| 24 | $\overline{FR}$ | — | $\overline{P7}$ | P37 | W0 | $\overline{P36}$ | — | DI-9 | T8 | — |
| 25 | D0Q | P93 | D1Q | $\overline{P112}$ | W1 | $\overline{P35}$ | — | DI-10 | S2 | — |
| 26 | P97 | — | — | P40 | W7 | $\overline{FR}$ | — | — | M2 | TX(0) |
| 27 | P114 | B7 | Y6 | $\overline{P113}$ | — | K3Q | — | DI-11 | — | B5 |
| 28 | $\overline{FY}$ | P92 | $\overline{FAC}$ | $\overline{P3}$ | B0 | W1 | — | DI-8 | S3 | — |

TABLE IV-continued

| | Logic Card | | | | | | | | |
|---|---|---|---|---|---|---|---|---|---|
| | A | B | C | D | K | W | SPM | IFA-1 | IFA-2 | IFA-3 |
| | | | | | Reference Figure | | | | | |
| Pin | 6 | 7 | 8 | 9 | 10 | 11 | 12 | 13 | 14 | 15 |
| 29 | P98 | — | $\overline{FU}$ | B12 | C3Q | FA1 | — | C10Q | S9 | B6 |
| 30 | — | — | FU | P39 | $\overline{FV}$ | $\overline{PAJ}$ | $\overline{P48}$ | — | — | — |
| 31 | FAB | P3 | Y2 | P101 | Y10 | P87 | — | C12Q | P3 | B |
| 32 | P108 | — | $\overline{FAB}$ | $\overline{P111}$ | P99 | FJ | $\overline{P50}$ | C11Q | S11 | — |
| 33 | FAE | — | FY | P2 | FB | $\overline{FJ}$ | — | $\overline{D0\text{-}4}$ | T1 | B4 |
| 34 | $K_1Q$ | B15 | FY | B11 | $\overline{FAD}$ | P26 | $\overline{P51}$ | $\overline{D0\text{-}5}$ | P2 | — |
| 35 | FC | $\overline{P36}$ | I0 | P41 | FZ | P40 | — | $\overline{D0\text{-}7}$ | B10 | P51 |
| 36 | P28 | $\overline{B15}$ | — | P29 | — | $\overline{W7}$ | $\overline{P52}$ | OW-8 | T2 | — |
| 37 | $\overline{B0}$ | P109 | $\overline{FAF}$ | P4 | P0 | FZ | — | $\overline{D0\text{-}6}$ | B9 | B0 |
| 38 | FAQ | — | — | P21 | — | $\overline{P15}$ | $\overline{P53}$ | OW-7 | B11 | — |
| 39 | $\overline{FAL}$ | — | FAQ | P105 | $\overline{C3Q}$ | $\overline{P25}$ | — | $\overline{D0\text{-}10}$ | T0 | P104 |
| 40 | $\overline{P88}$ | P22 | $\overline{P12}$ | P99 | — | $\overline{W0}$ | $\overline{P54}$ | $\overline{D0\text{-}8}$ | $B_8$ | — |
| 41 | P21 | — | $\overline{D1Q}$ | P22 | $\overline{K1Q}$ | $\overline{P33}$ | — | $\overline{I1Q}$ | P1 | — |
| 42 | B9 | — | — | FAG | $\overline{K1Q}$ | — | $\overline{P55}$ | OW10 | T3 | — |
| 43 | FX | P21 | D0Q | FK | B14 | $\overline{F0}$ | — | $\overline{D0\text{-}11}$ | S8 | TTY"C" |
| 44 | P37 | $\overline{B0}$ | — | M0Q | P85 | P37 | $\overline{P56}$ | $\overline{D0\text{-}9}$ | P0 | — |
| 45 | $\overline{K_5Q}$ | — | FAB | $\overline{FD}$ | $\overline{P35}$ | $\overline{FF}$ | — | FAH | IW-0 | "C" |
| 46 | — | P24 | — | $\overline{FF}$ | — | P41 | $\overline{P57}$ | DW-9 | S10 | — |
| 47 | $\overline{FD}$ | — | $\overline{C3Q}$ | B0Δ | — | P98 | — | P104 | IW-4 | "C" |
| 48 | Y11 | $\overline{P38}$ | — | $\overline{FS}$ | $\overline{P106}$ | L1Q | $\overline{P133}$ | C13Q | P4 | — |
| 49 | B0 | — | P102 | $\overline{FY}$ | — | P2 | — | P50 | IW-3 | TS-7 |
| 50 | — | $\overline{D3Q}$ | — | $\overline{P90}$ | $\overline{L2Q}$ | — | C | P51 | YL5 | TS-5 |
| 51 | FU | — | — | Y11 | — | $\overline{P30}$ | — | P53 | S7 | TS-6 |
| 52 | — | $\overline{D2Q}$ | — | W1 | — | P97 | B | P52 | YL4 | TS-4 |
| 53 | B15 | — | — | K3Q | P4 | $\overline{K1Q}$ | — | OW-11 | J2 | $V_S$ |
| 54 | $\overline{P4}$ | $\overline{D1Q}$ | — | K4Q | $\overline{P3}$ | K2Q | A | — | S6 | — |
| 55 | P103 | — | I1 | $\overline{P443}$ | $\overline{W7}$ | P39 | — | IW-5 | T6 | TX(1) |
| 56 | $\overline{P110}$ | $\overline{D_0Q}$ | — | $\overline{FAL}$ | $\overline{P53}$ | Y11 | $\overline{P3A}$ | IW-6 | — | IW-1 |
| 57 | $K_5Q \cdot \overline{Y11}$ | — | — | B10 | P53 | $\overline{P90}$ | — | IW-7 | B7 | B1 |

TABLE IV-continued

| | | | | Logic Card | | | | | |
|---|---|---|---|---|---|---|---|---|---|
| | A | B | C | D | K | W | SPM | IFA-1 | IFA-2 | IFA-3 |
| | | | | | Reference Figure | | | | | |
| Pin | 6 | 7 | 8 | 9 | 10 | 11 | 12 | 13 | 14 | 15 |
| 58 | — | P14 | — | $\overline{FA1}$ | P51 | B2Q | P47 | IW-4 | T5 | B2 |
| 59 | — | $\overline{P91}$ | Y11 | P44A | P51 | P17 | — | P108 | B4 | B3 |
| 60 | P85 | $\overline{P33}$ | — | $\overline{K5Q}$ | — | P47 | — | OW-11 | 36 | — |
| 61 | $\overline{P3C}$ | — | — | B | P52 | P88 | — | OW-4 | T7 | — |
| 62 | P2 | — | — | — | P28 | P511 | $\overline{P121C}$ | OW-5 | B5 | — |
| 63 | $\overline{FC}$ | — | $\overline{P91}$ | FY | P115 | M0Q | — | W-3 | J0 | TS-3 |
| 64 | F3 | B14 | — | FV | $\overline{P52}$ | $\overline{P89}$ | P85 | OW-3 | T4 | — |
| 65 | P0 | — | $\overline{P15}$ | W0 | $\overline{P50}$ | — | — | IW-0 | S5 | TS-2 |
| 66 | P4 | B13 | $\overline{Y3}$ | P114 | P50 | L3Q | — | IW-2 | J1 | — |
| 67 | D1-7 | — | $\overline{FAD}$ | $\overline{P133}$ | $\overline{K3Q}$ | — | — | D1-3 | MFE | TS-0 |
| 68 | $\overline{P44A}$ | B12 | FX | $\overline{P134}$ | K2Q | P3 | $\overline{P120D}$ | IW-1 | S4 | — |
| 69 | $\overline{P44B}$ | — | FW | C | $\overline{K0Q}$ | P11 | — | D1-2 | XL4 | TS-1 |
| 70 | M$_1$Q | B11 | FAE | — | D3Q | — | $\overline{P120C}$ | D1-1 | XL2 | — |
| 71 | M$_0$Q | — | — | $\overline{D1Q}$ | $\overline{Y6}$ | $\overline{FY}$ | — | $\overline{D0\text{-}1}$ | — | C14Q |
| 72 | M$_2$Q | B2Q | Y11 | P511 | P7 | P85 | $\overline{P121B}$ | D1-0 | YL1 | OW-8 |
| 73 | M$_3$Q | — | $\overline{Y11}$ | $\overline{D2Q}$ | $\overline{FA}$ | — | — | $\overline{D0\text{-}2}$ | — | — |
| 74 | FT | B10 | W0 | $\overline{D3Q}$ | $\overline{P25}$ | — | $\overline{P120B}$ | $\overline{D0\text{-}0}$ | XL1 | — |
| 75 | M$_4$Q | — | P14 | $\overline{D4Q}$ | $\overline{FC}$ | $\overline{LZQ}$ | — | C14Q | XL5 | — |
| 76 | M$_5$Q | — | B11 | D5Q | P26 | — | $\overline{P121D}$ | $\overline{D0\text{-}3}$ | YL2 | — |
| 77 | GRD | GRD | GRD | GRD | GRD | GRD | GRD | GRD | GRD | GRD |
| 78 | — | — | P101 | D6Q | P26 | — | — | C15Q | YL3 | — |
| 79 | GRD | GRD | GRD | GRD | GRD | GRD | GRD | GRD | GRD | GRD |
| 80 | — | — | — | D7Q | — | — | — | A0Q | — | — |
| 90 | — | — | — | $\overline{P136}$ | — | — | — | — | — | — |
| 91 | — | — | — | $\overline{P135}$ | — | — | — | — | — | — |
| 92 | — | — | — | P116 | — | — | — | — | — | — |
| 93 | — | — | — | $\overline{FAD}$ | — | — | — | — | — | — |

TABLE IV, Cont.

| | Logic Card | |
|---|---|---|
| | Servo Common | Servo Channel |
| | | Reference Figure |
| Pin | 16 | 17 |
| 1 | GND | 8MHZ |

TABLE IV, Cont.-continued

| | Logic Card | |
|---|---|---|
| | Servo Common | Servo Channel |
| | | Reference Figure |
| Pin | 16 | 17 |
| 2 | GND | — |

TABLE IV, Cont.-continued

| | Logic Card | |
|---|---|---|
| | Servo Common | Servo Channel |
| Pin | Reference Figure | |
| Pin | 16 | 17 |
| 3 | — | — |
| 4 | — | Resolver Rotor |
| 5 | $\overline{L_1Q}$ | — |
| 6 | — | — |
| 7 | — | +30V |
| 8 | — | Resolver Ret. |
| 9 | φA | Resolver Ret. |
| 10 | $\overline{P3}$ | — |
| 11 | φB | — |
| 12 | N20Q | — |
| 13 | W₀ | — |
| 14 | — | — |
| 15 | $\overline{DC\text{-}13}$ | — |
| 16 | ΔX0Q | — |
| 17 | — | — |
| 18 | SD-13 | — |
| 19 | FRQ | +Ramp |
| 20 | S101 | −Ramp |
| 21 | S118 | — |
| A | −30V | — |
| B | 68 VAC | — |
| C | CT | +20 V |
| D | −21V | φB |
| E | +30V | φA |
| F | −15V | — |
| G | — | — |
| H | +Ramp | S3=1MHZ |
| I | — | +70V |
| J | +15 V | — |
| K | −RAMP | S118 |
| L | +20V | $\overline{BS7}$ = 125KH7 |
| M | 250 KHZ | 1/0-1 |
| N | 250 KHZ | S101 |
| O | — | — |
| P | $\overline{FAB}$ | 1/0-2 |
| Q | — | — |
| R | 8MHZ | S100 |
| S | — | N20Q |
| T | 8MHZ | S103 |
| U | — | +30V |
| V | S3 | −21V |
| W | S3 | — |
| X | $\overline{BS7}$ | — |
| Y | — | — |
| Z | — | 250 KHZ |
| 2A | — | 70 V Ret |
| 3A | — | Motor High |
| 4A | — | — |
| 5A | — | Motor Low |
| 6A | — | Motor Low Res. |
| 2B | — | φB |
| 3B | — | φB |
| 4B | — | — |
| 5B | — | φA |
| 6B | — | φA |
| A6 | S104(B) | — |
| B7 | S103(B) | — |
| T1 | 1MH₂ | — |
| T5 | — | — |
| μ | 8MHZ | — |

TABLE V

| Micro Operation | Word Time | Bit Times |
|---|---|---|
| FA | 0 | 16 |
| FB | 0 | 16 |
| FC | 0 | 16 |
| FD | 1 | 12 |
| FE | 2 | 8 |
| FF | 3 | 1 |
| FG | 4 | 12 |
| FH | 5 | 8 |
| FI | 6 | 8 |
| FJ | 7 | 12 |
| FK | 1 | 12 |
| FL | 1 | 1 |
| FM | 2 | 8 |
| FN | 3 | 8 |
| FO | 4 | 12 |
| FP | 5 | 8 |
| FQ | 6 | 8 |
| FR | 7 | 12 |
| FS | 7 | 12 |
| FT | 1 | 16 |
| FU | 1 | 16 |
| FV | 1 | 16 |
| FW | 1 | 16 |
| FX | 1 | 16 |
| FY | 1 | 16 |
| FZ | 2 | 8 |
| FAA | — | — |
| FAB | 1 | 16 |
| FAC | 1 | 16 |
| FAD | 1 | 16 |
| FAE | 1 | 1-16 |
| FAF | 1 | 1-16 |
| FAG | 1 | 12 |
| FAH | 1 | 12 |
| FAI | 1 | 12 |
| FAJ | 3 | 16 |
| FAK | 3 | 16 |
| FAL | 4 | 16 |
| FAM | 5 | 8 |
| FAN | 6 | — |
| FAO | 7 | 12 |
| FAP | — | — |
| FAQ | 1 | 16 |

Operation

The operation of the CNC system will be generally described with reference to the previously referenced applications Ser. Nos. 101,881; 230,872; and 101,449. Operation is determined by modes, conditions, and commands such as defined by the control panel 114, display panel 118, source of parts programs such as the tape reader 116, and other devices.

Preparatory (g) and miscellaneous (m) commands are parts program auxiliary commands used to set internal control conditions and external machine conditions, respectively. The g and m commands are defined in Table VI and described hereafter. The data processor 112 receives these auxiliary commands from a source of parts program commands such as the tape reader 116, parts program memory 130, control panel 114, auxiliary I/O channels 128, or other sources. The data processor 112 sets operating conditions such as packing discrete bits into a digital word or other well known techniques to set the system conditions, providing available system condition information for executing these commands when required. Nomenclature used in Table VI is defined, hereafter. The "COMMAND" column defines the command symbol. The "RELATED" column defines the relation between these commands and implies whether they are mutually-exclusive, resulting in the reset of the command. The "EXECUTE" column defines whether this particular command is executed immediately or at the end of a block. If executed immediately the motion commands in that block will be executed in conjunction with this new auxiliary command. If executed at the end of that block, the motion commands in the block will be executed as if this new auxiliary command had not been programmed. This new command will then be executed at the completion of the other commands in that block. The "MODAL" column defines whether the command is modal or not modal. If the command is only used in that block, it is automatically reset after the execution of the block and must be reprogrammed in subsequent blocks when required. If the command is modal, it is stored until changed; where it will operate on every subsequent block of commands until it is changed. The "INITIALIZE" column identifies the condition of this command when the system is turned-on, identified with the INITIALIZE light. The "NOTES" column briefly describes the operations of these commands. The commands defined in Table VI are described in the referenced EIA Standards. Many of these commands are defined in greater detail hereafter to illustrate the operation of this CNC system.

The machine home position is a fixed absolute position on the machine that may be used as an absolute position reference. The ability of the data processor 112 to sense the absolute position of the machine axes such as described in the previously referenced applications Ser. No. 101,881 and Ser. No. 134,958 permits the data processor 112 to keep track of the precise positions of the machine axes. The data processor senses the machine axes conditions from servos 120, 121, and 122 with signals 123 or directly with signals 126, then controls the machine 124 to perform the commanded operations. In one embodiment, the machine home position is an absolute position point, the general location of the home position is defined by a switch on each axis and the precise location of which is defined by the pickoff null. The data processor will drive the selected axes with command signals 123 until the switch closure is detected with signals 123 or 126, then the data processor will creep the selected axes into the pickoff null positions. The machine home position is commanded with m codes. Various parameters are selectable with the data processor stored program, such as axes (with associated m codes), direction of slew for each axis, slew velocity, and home position coordinates.

TABLE VI

| COMMAND RELATED | | EXECUTE IMMED. | AT END OF BLOCK | MODAL | INITIALIZE | NOTES |
|---|---|---|---|---|---|---|
| g01 | A | Yes | — | Yes | 1 | Linear Interpolation |
| g02 | A | Yes | — | Yes | 0 | Circular Interpolation CW |
| g03 | A | Yes | — | Yes | 0 | Circular Interpolation CCW |
| g04 | — | Yes | — | No | | Dwell From Tape |
| g07 | — | Yes | — | No | 0 | Rapid Traverse |
| g08 | B | Yes | — | No | 0 | Acceleration |
| g09 | B | — | Yes | No | 0 | Deceleration |
| g12 | | Yes | — | No | 0 | Full Circle In One Block |
| g17 | D | Yes | — | Yes | 1 | Circular Interpolation, xy Plane |
| g18 | D | Yes | — | Yes | 0 | Circular Interpolation, zx Plane |
| g19 | D | Yes | — | Yes | 0 | Circular Interpolation, yz Plane |
| g27 | — | Yes | — | No | | Floating Zero Definition |
| g28 | R | Yes | — | Yes | 0 | Axis Rotation On |
| g29 | R | Yes | — | Yes | 1 | Axis Rotation Off |
| g33 | J | Yes | — | No | 0 | Threading |
| g40 | C | Yes | — | Yes | 1 | Cutter Compensation Cancel |
| g41 | C | Yes | — | Yes | 0 | Cutter Compensation Left |
| g42 | C | Yes | — | Yes | 0 | Cutter Compensation Right |
| g50 | V | Yes | — | Yes | 1 | Absolute-All axes |
| g51 | V | Yes | — | Yes | 0 | Incremental-All Axes |
| g52 | V | Yes | — | Yes | 0 | Incremental-x axis |
| g53 | V | Yes | — | Yes | 0 | Incremental-y axis |
| g54 | V | Yes | — | Yes | 0 | Incremental-z axis |
| g55 | V | Yes | — | Yes | 0 | Incremental-b axis |
| g80 | W | Yes | — | Yes | 1 | Canned Cycle Cancel |
| g81-89 | W | Yes | — | Yes | 0 | Canned Cycle Select |
| g90 | H, | Yes | — | Yes | 1 | IPM Feedrate |
| g91 | H,J | Yes | — | Yes | 0 | IPR Feedrate |
| g92 | H,J | Yes | — | Yes | 0 | RPI Feedrate |
| m00 | g | — | Yes | No | 0 | Program Stop |
| m01 | g | — | Yes | No | 0 | Optional Stop |
| m02 | g | — | Yes | No | 0 | End of Program |
| m03 | e | Yes | — | Yes | 0 | Spindle CW |
| m04 | e | Yes | — | Yes | 0 | Spindle CCW |
| m05 | e,g | — | Yes | Yes | 1 | Spindle Off |
| m07 | f | Yes | — | Yes | 0 | Coolant 2 On |
| m08 | f | Yes | — | Yes | 0 | Coolant 1 On |
| m09 | f | Yes | — | Yes | 1 | Coolant Off |
| m21 | k | Yes | — | No | 0 | x Axis Home Position |
| m22 | k | Yes | — | No | 0 | y Axis Home Position |
| m23 | k | Yes | — | No | 0 | z Axis Home Position |
| m24 | k | Yes | — | No | 0 | 4th Axis Home Position |
| m25 | k | Yes | — | No | 0 | 5th Axis Home Position |

TABLE VI-continued

| COMMAND RELATED | | EXECUTE | | MODAL | INITIALIZE | NOTES |
| --- | --- | --- | --- | --- | --- | --- |
| | | IMMED. | AT END OF BLOCK | | | |
| m30 | g | — | Yes | No | 0 | End of Tape |
| x | — | Yes | — | Yes | +00.00000 | x Absolute Position |
| y | — | Yes | — | Yes | +00.00000 | y Absolute Position |
| z | — | Yes | — | Yes | +00.00000 | z Absolute Position |
| b | — | Yes | — | Yes | +00.00000 | b Absolute Position |
| t | — | Yes | — | Yes | 00 | Tool Change |
| s | — | Yes | — | Yes | 0000 | Spindle Speed |
| f | — | Yes | — | Yes | 30.00 | Feedrate |
| FRO | — | Yes | — | Yes | 100% | Feedrate Override |
| a | — | Yes | — | Yes | 5 | Acceleration Ramp |
| d | — | Yes | — | Yes | 5 | Deceleration Ramp |
| | | — | Yes | — | Selected | Cycle Off |
| | | Yes | — | — | Not Selected | Cycle On |
| | | — | — | — | Selected | Initialize |
| | | — | — | Yes | Not Selected | Mirror Image |
| | | — | — | Yes | Not Selected | CNC |
| | | — | — | Yes | Not Selected | Block Delete |
| | | — | — | Yes | Not Selected | Optional Stop |
| | | — | — | — | — | Spindle Interlock |
| | | — | — | — | — | Drive Interlock |
| | | Yes | — | — | ASCII | Tape Code |

The data processor 112 executes the slew routine to drive the selected axes with signals 123 in the specified direction at the specified velocity, with continued testing of the home position switch signals 126 to define the stopping point. A drive resolution of 0.004 inches or better is required to insure repeatable detection of the home position switch closure condition. Acceleration and deceleration are often not required, where the specified velocity is usually low enough to permit velocity step functions without loss of synchronization. The slew feedrate is conveniently modifiable under stored program control to accomodate different machine characteristics. When the home position switch is detected, zero synchronization is initiated to position the axis to the precise resolver null. Because the applicability of this feature is a function of the type of machine, it is programmed as a subroutine for ease of incorporation or deletion. Program execution speed is of little consequence so memory utilization is a primary consideration. An automatic fixed cycle is provided to selectively return each machine axis to the home position. The home position fixed cycle is initiated with m commands m21 through m25 (defined in Table VI), where each m command will cause the associated axis to translate to the home position for that axis. Caution should be exercised by an operator to prevent interference between the tool, workpiece, and machine during this positioning operation.

Zero synchronization is used to automatically drive the selected axis to a commanded position of the pickoff. This may be a fixed position as with the home position or may be a position defined by the operator. Feedback from the axes servos 120, 121, and 122 is provided thru signals 123 and 126. Because of the multiple uses for this zero synchronization routine, it is programmed as a subroutine that accepts a modifiable predefined position. Program execution speed is of little consequence so memory utilization is a primary consideration.

Continuous parts program execution can be discontinued with programmed stop (m00), optional stop (m01), end of program (m02), and end of tape (m30) commands. A programmed stop command (m00) will cause the data processor to enter a programmed stop condition. An optional stop command (m01) will cause the data processor to conditionally enter a programmed stop condition. The conditional aspect is based on whether the operator has selected the optional stop condition on the control panel 114. If this condition is met and after the completion of all commands in that block, the spindle and coolant will be turned off and the system will enter the cycle stop condition. The optional stop switch 283 is used to command the data processor 112 to alternately enable and disable the optional stop command (m01) in a parts program. Alternate depressions of the optional stop switch 283 will command the data processor 112 to alternately toggle the optional stop lamp 200 on and off. When the optional stop lamp 200 is illuminated, the optional stop parts program command (m01) will be executed as a programmed stop command. When the optional stop lamp 200 is extinguished, the optional stop parts program command (m01) will be ignored. An end of program command (m02) will cause the data processor 112 to enter a programmed stop condition. An end of tape command (m30) will cause the data processor 112 to enter a programmed stop condition.

Spindle commands consist of spindle speed, spindle direction, and spindle off commands. These commands are modal, where they need not be reprogrammed until a new condition is required. Spindle speed is programmed directly in rpm (Table VI). All spindle speeds are accepted by the data processor regardless of the value. When a spindle speed can't be achieved due to speed range or discrete speed steps of the spindle control, the programmed speed is rounded-off by the data processor 112 to the speed that can be achieved immediately below the programmed speed. Spindle clockwise (CW) and counterclockwise (CCW) directions are commanded with an m03 and an m04, respectively, to start the spindle rotating in the commanded direction at the beginning of the block to which they are programmed, therefore permitting the spindle direction change to be programmed in the same block with the motion commands that require this new spindle direction. Spindle off is commanded with an m05 to stop the spindle from rotating at the completion of the block in which it is programmed so this spindle off command can be programmed in a block containing the last motion commands that require spindle motion.

Rapid traverse is the maximum normal velocity that the data processor 112 will command. This velocity is a programmable parameter that is optimized for the machine characteristics, which is 200 IPM for typical machine tools. All machine motions can be commanded at rapid traverse velocity, including complex contours. Rapid traverse is commanded with a g07 command, which applies only to the block in which it is programmed. Because rapid traverse can be a potentially dangerous condition if inadvertently commanded by a tape reader error or other such condition, the g07 command provides a unique, unambigious rapid traverse command that is interlocked to insure safe operation. The last programmed feedrate parameter will be preserved by the data processor 112 and automatically reused after the rapid traverse command has been executed. If that last feedrate command had been IPR (g91) or RPI (g92), the rapid traverse command will automatically set the IPM condition for execution of that set of commands, then resume IPR or RPI operation after the rapid traverse command had been executed. If a g07 command and an f command are programmed in the same block, the rapid traverse velocity would apply to that block while the f command would be preserved for subsequent blocks. The data processor 112 insures that full synchronization will be preserved, independent of the velocities programmed and axis servo characteristics. Acceleration and deceleration are automatically performed by the data processor 112 for rapid traverse conditions to achieve maximum velocities without loss of synchronization. Because of the requirements for acceleration and deceleration, rapid traverse (g07) will not be commanded for distances less than one inch.

A program dwell can be commanded with a g04 command, which applies only to the block in which it is commanded and must be repeated in every block that requires a dwell. A dwell command must not be programmed in a block that contains motion commands, although that block can contain all commands but motion commands. Dwell is programmed directly in seconds and decimal parts of a second. The dwell magnitude has a range of 00.001 seconds thru 99.999 seconds. The magnitude is programmed with an X address, where X+05.01000 g04 commands a 5.01 second dwell and X+00.001 g04 commands a one millisecond dwell. The data processor 112 will accept this g04 dwell command, verify that it is a legitimate command, then perform the required time delay.

CNC operations may use the operator panel controls such as the selector switches and momentary switches. The control panel 114 permits convenient addition of switches as described in the previously referenced application Ser. No. 101,881 particularly page 19 lines 24 through 28, page 29 lines 1 through 17, and other descriptions therein. The lamp and numeric displays inform the operator of the system conditions. Position of the mode selector switch 240 in conjunction with the CNC condition lamp displays 218 define the response of the data processor 112 to operator commands. Panel operations will now be described.

Many switches on the panel 114 are interlocked to protect the system from erroneous or inadvertent operator commands, where the data processor 112 will obey those switch commands only when the cycle off lamp 271 is illuminated and the mode selector switch 240 is in the keyboard position 284. The jog switches 252 are interlocked, where the data processor 112 will obey those commands only when the cycle off lamp 271 is illuminated and the mode selector switch 240 is in the jog position. The cycle start switch 246 is interlocked, where the data processor 112 will obey that command only when the cycle off lamp 271 is illuminated. Several switches are not interlocked, where the system will obey those commands under all conditions of operation.

When the cycle start switch 246 is depressed, the following operations are performed by the data processor 112: the cycle off lamp 271 is tested as an interlock; the cycle off lamp 271 is extinguished; the cycle on lamp 213 is illuminated; the acceleration condition is set; the deceleration condition is set if not in the continuous mode; the initialize lamp 215 is extinguished, and the slide hold lamp 212 is extinguished if in the continuous or block modes.

When the cycle stop switch 256 is depressed, the following operations are performed by the data processor 112: the cycle on lamp 213 is tested as an interlock; the deceleration condition is set; the cycle stop condition is set; the slide hold lamp 212 is extinguished and the slide hold storage is cleared if in the continuous or block modes.

Mirror image switches 262 and 263 permits the operator to command the data processor 112 to selectively reverse the direction of all axes commands in the parts program. Jog commands are not reversed by the mirror image control. The position readout displays reversed positions. In the index mode, the machine motion will be such as to drive to the actual floating zero point. In systems where tool offsets are provided, the offset directions will not be reversed. The mirror image switches 262 and 263 are interlocked, where the mirror image condition can only be changed with the mode selector switch 240 in the keyboard position 284, with the parameter selector switch 242 in an axis position 224, 225, 226 or 227 and with the cycle off lamp 271 illuminated. Under these conditions, the mirror image (axis reversal) condition can be changed by selecting the appropriate axis with the parameter selector switch 242, then toggling the axis reversal lamps 204, 205, 206, and 207 on or off with the mirror image switches 262 and 263. The mirror images switches 262 and 263 alternately enable and disable the mirror image function for each axis, selectively. Alternate depressions of the mirror image switch will alternately toggle the reversal lamp 204, 205, 206, or 207 corresponding to the selected axis on and off. When the reversal lamp 204, 205, 206, or 207 for an axis is extinguished, the parts program departure commands for that axis will be executed in the programmed direction. When the reversal lamp 204, 205, 206, or 207 for an axis is illuminated, the parts program departure commands for that axis will be executed in the reverse direction.

The EIA/ASCII tape code switch 287 is used to command the data processor to alternately select the format codes used for the input parts program. Alternate depressions of the EIA/ASCII switch 287 will alternately select the EIA lamp 208 and the ASCII lamp 209. When the EIA lamp 208 is illuminated, an EIA parts program code can be used. When the ASCII lamp 209 is illuminated, an ASCII parts program code can be used.

The emergency stop switch 258 is used to discontinue system operation under emergency conditions, overriding the data processor 112 and resetting the complete system to circumvent a system malfunction that might disable the normal system override controls. Following an emergency stop condition, the interrupted operation cannot be resumed. The initialize light 215 will be illuminated, identifying that the system must be initialized and operating conditions must be reestablished by the operator.

The initialize lamp 215 is used to alert the operator to the requirement to initialize the system. The initialize lamp 215 will be illuminated by the data processor 112 when any of several conditions occur, which include: power turn-on, line power drop-out, or emergency stop switch actuation. When the initialize lamp 215 is first illuminated, the system conditions are reset to the initial conditions by the data processor 112. The operator must extinguish the initialize lamp 215 prior to entering system commands so that he may be alerted if the commands are reset to the initial conditions by another initialize condition. The initialize lamp can be extinguished by placing the parameter selector switch 242 in any of the axis positions 224, 225, 226, or 227 with the mode selector switch 240 in the index position, then depressing the cycle start switch 246. If a line power drop-out or an emergency stop had caused the initialize lamp 215 to be illuminated, the interrupted operation cannot be resumed because the operating conditions are replaced with initial conditions. Therefore, it is necessary to re-initialize and again set-up for system operation.

The initial conditions discussed for system initialization are programmable parameters defined by the data processor. Many of these initial conditions are constants or fixed parameters as illustrated in Table VI. In some cases, these initial conditions may be set to the last condition commanded during operation; stored by the data processor 112 to define the new value of this initial condition. Various fixed constants can be changed in the stored program when programming the data processor to customize the initial conditions for an application.

Block delete provides for the conditional deletion of a group of characters in a parts program. A block delete character (/) in conjunction with an operator selected block delete condition will cause the data processor 112 to disregard all of the characters inbetween the block delete character and end-of-block character. If the operator does not select the block delete condition, the data processor 112 will ignore the block delete character. Tape validity checks, including the parity check, are disabled for the deleted characters. Block delete codes can be provided at the beginning of a block of commands to delete all commands in that block or within a block of commands to selectively delete only those commands or portions of commands following the block delete character. When illegal characters are punched on a tape leader, the affects of these characters can be disabled by providing a block delete code at the beginning of the tape and selecting the block delete condition thru the control panel 114 before initiating automatic operation.

The block delete switch 285 is used to command the data processor 112 to alternately enable and disable the block delete command in a parts program. Alternate depressions of the block delete switch 285 will alternately toggle the block delete lamp 201 on and off. When the block delete lamp 201 is illuminated, the block delete parts program command will be executed. When the block delete lamp 201 is extinguished, the block delete parts program command will be ignored.

The slide hold (rapid stop) switch 260 permits the operator to command the data processor 112 to bring the machine axes to a rapid but controlled stop during a contour. The slide hold lamp 212 is illuminated to define this slide hold condition. Slide hold is disabled for threading contours because of the danger of tool breakage. The interrupted contour can be resumed by depressing the cycle start switch 246. The contour will continue and the slide hold lamp 212 will be extinguished. The slide hold condition can be exited by depressing the cycle stop switch 256, which will cause the slide hold lamp 212 to be extinguished. This will permit operation to be resumed, but the interrupted contour will not be completed.

When the slide hold switch 260 is depressed, the data processor 112 will illuminate the slide hold lamp 212, decelerate the machine to a stop, calculate the distance-to-go (DTG) parameters for all axes and for a circle, calculate the arc center parameters, then store the above mentioned parameters in the slide hold buffer storage. This sequence is interlocked with the data processor 112 so it can be commanded only under proper conditions. Also, the slide hold condition is interlocked to prevent slide hold operations when threading, as defined by the g33 command. If the contour is near completion and deceleration is in process when the slide hold switch 260 is depressed, the data processor 112 will set the cycle stop condition, where the slide hold condition will not be entered in favor of the cycle stop condition. When in the continuous mode and the contour is near completion but past the point at which deceleration can be commanded, the slide hold condition is temporarily disregarded but preserved until the next contour is started, at which time the slide hold command can be executed to cause proper deceleration. The slide hold buffer storage contains incremental (DTG) commands to permit restart from wherever the operator repositioned the machine when in the slide hold condition. Auxiliary commands such as f, s, t, g, and m are preserved in active memory to permit these parameters to be changed by the operator thru the keyboard. The keyboard, jog, index, and search modes will operate independent of whether the slide hold lamp 212 is illuminated. The slide hold lamp 212 can't be extinguished and the slide hold buffer memory can't be modified in these modes. All command parameters can be modified in these modes including absolute position, with the exception of the commands in the slide hold buffer storage. When the slide hold lamp 212 is illuminated, the operator can exit the slide hold condition by depressing the cycle stop switch 256. This will extinguish the slide hold lamp 212, clear the slide hold buffer storage, and remain in the cycle stop condition. Continuation of the interrupted contour with a slide hold restart routine is initiated with the following conditions: the slide hold lamp 212 is illuminated, the mode selector switch 240 is in the block position 286 or continuous position 288, and the cycle start switch 246 is depressed by the operator. The data processor 112 will fetch the incremental DTG parameters (and, for a circle, the arc center parameters) from the slide hold buffer storage, clear the slide hold buffer storage, then post process these incremental parameters as if they were a new block of parts program commands. This insures that any keyboard changes such as feedrate will be executed for the continued contour. Depression of the cycle start switch 246 will command the data processor 112 to extinguish the slide hold lamp 212 and cycle off lamp 271 when in the continuous or block modes, illuminate the cycle on lamp 213, and set the acceleration command condition. Also, the cycle stop and deceleration conditions are set so the data processor 112 will decelerate to a stop.

Feedrate override permits the operator to command the data processor 112 to modify the programmed inch-per-minute (IPM) feedrate parameters in a parts program. It does not affect machine velocity for jog, rapid, traverse, IPR feedrate, and RPI feedrate programming. Feedrate override is programmed directly in percent of programmed feedrate and will range from as low as 1% thru 150% or more, depending on the value selected for the particular machine, in 1% resolution steps. A feedrate override of 027 represents 27% of the programmed feedrate and 112 represents 112% of the programmed feedrate. The feedrate override parameter can never be greater than the maximum value for the particular machine (typically 150%). Feedrate override commands entered outside of this range will automatically be rounded off by the data processor 112 to the closest command within this range. The feedrate override is entered by the operator with the keyboard 244 through the panel 114 using the parameter switch 242 in the feedrate override position 239.

The flexability in defining the operation of the control panel switches and the display panel lamps with the data processor under program control is described in the previously referenced application Ser. No. 101,881 particularly page 4 lines 29 through 30, page 5 lines 1 through 6, page 29 lines 1 through 17, page 19 lines 24 through 28 and other descriptions therein.

Feedrate Programming

Direct feedrate programming provides significant advantages including simplified parts programming, simplified program checkout, and reduced tape length. Direct inch-per-minute (IPM) feedrate programming, inch-per-revolution (IPR), and pitch or direct revolutions-per-inch (RPI) programming are provided for turning equipment, with switchable IPM, IPR and RPI programming for applications such as machining centers. Direct feedrate programming provides precise control of machine velocity without tedious programmer calculations. It simplifies parts programming, provides better machine performance, and reduces parts program length. Feedrate commands are modal, where the feedrate command applies to the block in which it is programmed and to all subsequent blocks until a new feedrate parameter is commanded. Therefore, a feedrate command should be programmed in or before the first block that contains a contour command, but need not be programmed again until a different feedrate command is required. This results in elimination of redundent calculations and a significant reduction in tape length.

Prior art non-computerized systems provide feedrate number (FRN) or V/D feedrate programming. This method requires that feedrate be modified from the machine-oriented IPM units to the hard-wired control oriented 1/seconds set of units. This conversion involves a complex computation to compensate for the difficulty that prior art non-computerized systems have in computing velocities. The computation requires division of the direct feedrate parameter by a vector distance, which is defined by: $\sqrt{(x^2+y^2+z^2+ \ldots )}$. In systems that use the feedrate number method, the direct feedrate parameter must be modified by the contour dimensions, where the resultant FRN parameter is different for each block of parts program commands even though the velocity remains constant. Therefore, parts programmers must perform the calculation for each block of commands. Parts program length is significantly increased by the redundant f commands in each block.

Computational capability of the CNC system of this invention provides relief for parts programmers by eliminating tedious operations, while enhancing overall system operation. Feedrate parameters are commanded directly in IPM, RPL or IPR; which are units directly associated with cutting operations. These units are modal and independent of the contour dimensions, permitting the required velocity to be programmed once, where it need never be reprogrammed until a change in velocity is required. In addition, rapid traverse and acceleration/deceleration preserves the programmed velocity parameters to minimize redundant programming. Simplification in parts programming is enhanced by the simplification in program checkout. Repeated FRN parameters that are always changing are a common source of program problems. Elimination of these problems results in rapid and economical changeover for new production runs with new parts programs. Also, reduction in program size results in a proportional decrease in punched tape length. This simplifies tape handling considerations, reduces tape reader maintenance, and decreases the possibility of a tape reader error. Short blocks of tape commands also reduce the requirements for buffer memory and enhance the internal parts program storage feature presented in the previously referenced application Ser. No. 230,872.

Three modes of feedrate programming are provided for turning machines, which are:
(1) Inch-Per-Minute (IPM)
(2) Inch-Per-Revolution (IPR)
(3) Revolutions-Per-Inch (RPI)
A comparison of all three modes is presented in Table VII.

TABLE VII

| FEEDRATE | SYM-BOL | Feedrate Modes FOR-MAT | SE-LECT | RESOLUTION RANGE | |
|---|---|---|---|---|---|
| Inch/Minute | IPM | f22 | g90 | 00.01 IPM | 99.99 IPM |
| Inch/Revolution | IPR | f13 | g91 | 0.001 IPR | 9.999 IPR |
| Revolutions/Inch (Pitch) | RPI | f22 | g92 | 00.01 RPI | 99.99 RPI |

Selection of IPM, IPR, and RPI feedrate modes is performed with g90, g91, and g92 commands, respectively. These g commands need only be programmed once for the particular mode and need not be programmed again until a new mode is required. If the feedrate parameter is changed but the mode is not changed, then the new feedrate parameter must be programmed but the g command does not have to be reprogrammed. Direct inches-per-minute (IPM) feedrate programming provides precise control of tool vector velocity without tedious calculations. Tool velocity is programmed directly in inches-per-minute, where the f22 format provides a resolution of 00.01 IPM with a range of 99.99 IPM. Direct inch-per-revolution (IPR) and revolutions-per-inch (RPI) feedrate programming provides precise control of tool velocity relative to the spindle speed without tedious calculations. Direct IPR programming has an f13 format, providing a resolution of 0.001 IPR with a range 9.999 IPR. Direct RPI programming has an f22 format providing a resolution of 00.01 RPI with a resolution of 99.99 RPI. The combined capability of RPI and IPR feedrate programming provides a maximum lead of 100 inches with 00.01 RPI and a minimum lead of 0.001 inches with 0.001 IPR. This wide dynamic range, in conjunction with the convenience of both IPR and RPI feedrate programming, adds simplicity and flexibility to turning operations. Direct IPR and RPI feedrate programming operate in the turning mode unless the threading mode is selected with a g33 command. Maximum machine utilization is achieved in the turning mode because the tool enters the part without an initial synchronization dwell and the velocity is not adjusted for spindle speed variation. In addition, greater velocities may be programmed for turning operations, as contrasted to threading operations. IPR and RPI unslaved operation generates a fixed contour velocity based upon the programmed spindle speed value, but does not compensate for variations in spindle speed from that programmed value. IPR and RPI unslaved operation is selected with g91 or g92 commands, respectively, with the appropriate feedrate parameter. The vector velocity corresponds to the programmed velocity, as related to the programmed spindle speed; where: IPM = w(IPR) and IPM = w/(RPI) and where w is the programmed spindle speed and IPM, IPR, and RPI are the units of the various velocity parameters. IPR and RPI slaved operation or threading slaves the instantaneous contour velocity to the instantaneous spindle speed to compensate for variations in spindle speed from the programmed value. IPR and RPI slaved operations are selected with a g33 command in addition to the g91 or g92 commands. For a turning machine, the Z axis velocity component corresponds to the programmed velocity, although the vector velocity can be provided as an alternative. Slaved operation is primarily used for threading, where the workpiece entry point and axes velocity are both slaved to the spindle for cut repeatability, independent of spindle speed variations. Although most threading operations are performed along the Z axis, a taper thread can be cut with a simultaneous linear contour in both X and Z dimensions. The IPR and RPI slaved or threading modes synchronize the contour velocity with the spindle velocity to insure the highest degree of repeatability between successive cuts. The data processor uses spindle feedback for synchronization, such as described for servo feedback in the previously referenced application, Control System and Method.

The combined capability of both, IPR and RPI feedrate programming, provides a resolution far exceeding the resolution of either parameter. As an example; a pitch of 12 can be programmed directly with RPI feedrate programming, yielding an IPR value of:

IPR = 1/RPI = 1/12 = 0.0833333 . . .

If only IPR feedrate programming were provided, the limited resolution would only permit a value of 0.083 to be programmed with a significant loss in resolution. An RPI value of 0.083 provides a pitch of 12.05, which causes an error of an extra thread for a 20 inch long threading contour.

An adaptive feedrate control feature is provided to automatically preclude loss of servo synchronization for high velocity conditions. This capability relieves the parts programmer and operator from the burden of computing the velocity components per axis to verify that it is within the required velocity envelope. Automatic feedrate control also compensates for variations in servo loop characteristics such as frictional and inertial parameters, servo loop gain, and motor torque. Operation is adaptively controlled to insure that under dynamic conditions such as acceleration and deceleration, full synchronization is maintained.

For automatic feedrate control, the data processor 112 monitors the steady state position error signals of the servos 120, 121, and 122 and overrides the programmed feedrate if any steady state position error exceeds a programmable value. The data processor monitoring of these signals is described in the previously referenced application Ser. No. 134,958.

Material Removal Calculations

Machine operations involve a definite amount of material removal that must be considered in the parts program to prevent severe dimensional errors. Radius of a cutter used on machine tools and width of the flame on flame cutter machines require dimensioning corrections; defined as cutter compensation and KERF corrections, respectively. Parts programming consideration for this material removal involves sophisticated calculations for all but the most trivial "picture frame" cuts. This computerized numerical control system provides full range cutter compensation and KERF correction to facilitate simplified parts programming, permitting programmers to dimension as defined in the part description, neglecting the complex calculations associated with material removal considerations.

An improvement for material removal processing will now be described. This improvement is described for cutter compensation for a milling machine but is intended to relate to a more generalized capability to modify a parts program to accomodate dimensional modifications.

Part surface coordinates 300 are convenient for a parts programmer to use to define tool motion. Unfortunately, a tool 302 has a finite diameter, where the cut interface is at the outer periphery of the cutter. Therefore, it is necessary to compensate the machine commands so the outer edge 300 not the center of the cutter 304 will trace out the required cut. The workpiece/cutter geometry is illustrated in FIGS. 3A and 3B. Cutter compensation is relatively straightforward to implement during a contour operation 306, but requires sophisticated computational capability to define the transition between two cuts 308. This transition involves complex geometric relationships when referenced to the part surface. Therefore, cutter compensation calculations are usually performed with the APT compiler program on a large scale computer prior to tape preparation.

In prior art systems, the parts program tape is punched with the fixed cutter compensation for the radius of a particular cutter. The prior art cutter compensation techniques present major problems that significantly hamper numerical control utility, where parts programs are difficult to prepare without the APT compiler and parts programs are cutter oriented, where the cutter radius must correspond with the parts program. Many smaller machine shops do not have access to the APT compiler to calculate the compensated part surface commands. Complex computations associated with the tool radius parameter substantially decrease the efficiency of the parts programmer when not assisted by an APT program.

The cutter compensation feature in the system of this invention has several significant considerations which include: minimized machine shop dependence on the availability of an APT computer and APT program; reduced cost associated with generating new program tapes; reduced requirements for the grinding of tools to achieve the programmed diameter; permitting a tool to be used as is, regardless of the programmed parameter; reduced machine down time when an APT computer is only available on a limited basis or when a tool must be specially ground to size; and reduced effort for the operator, using the automatic cutter compensation feature, and for the parts programmer, generating tapes without an APT compiler. With the cutter compensation feature of this invention, the full programmed accuracy is preserved along the cut 306 and at the transition between cuts 308. A parts program "look-ahead" feature is provided for compensated cuts that must be shorter than programmed, so they will not be degraded by too deep of a cut prior to compensation. This capability substantially reduces the set-up time for the workpiece, reduces the dependence on a compiler such as APT, and reduces the requirements to change tools or grind tools to match the particular parts program. This cutter compensation capability permits tapes to be programmed in part surface coordinates or any arbitrary tool radius parameter. The operator simply measures the diameter of the tool with a micrometer and inputs this parameter with the keyboard. The data processor 112 automatically calculates the compensated tool-center path commands from the tape commands, as modified by the cutter compensation parameter.

The data processor 112 accesses the parts program for the contour parameters and computes new contour parameters based upon the cutter compensation parameter and the boundary contours. The geometric relationships at the transition between cuts 308 are used to calculate the end point of the contour, where the compensated contour may be longer or shorter than the programmed contour. The geometric algorithms for these end point calculations are well known in the mathematical art.

Complex Contours

An automatic fairing capability is used to simplify parts programming and improve final part characteristics. The computational capability of the data processor permits automatic generation of a fairing contour 400, connecting two programmed boundary contours 402 and 404 with the best fit quadratic curve. Slope fitting is also provided to ensure a smooth transition between the fairing contour and each of the boundary contours 406 and 408. It is often necessary to connect two contours with a smooth curve to eliminate discontinuities which cause stress points, fatigue points, and imperfections in the finished part. Except for the trivial case of a right-angle circular fillet, the faired curve is not usually defined analytically. A parts programmer usually reduces a generalized fairing requirement to an analytic function that can be interpreted by a simple, non-computerized system. He is burdened with complex contour calculations to connect the two boundary contours without introducing discontinuities. The results are generally a poorly faired curve that required an excessive amount of parts programming effort which contains numerous discontinuities. Automatic fairing contours provided by the system of this invention are generally programmed within the EIA Standards for contouring systems. The fairing block of commands is inserted between the two blocks of commands for the boundary contours that must be faired together. This fairing contour is programmed simply with a g29 command, the coordinates of an intermediate point 410, and the coordinates of the final point which is the start point of the following contour. This provides not only curves that intersect the start point 408 and end points 406 of the respective contours, but also provides slopes of the two contours that are precisely duplicated by the start and stop points of the fairing. The data processor "remembers" the previous contour final slope 412 and "looks ahead" to define the subsequent contour initial slope 414, resulting in a perfect fairing to provide boundary slope fitting for a perfect transition between two arbitrary contours 406 and 408 with the elimination of discontinuities.

Curve fitting is used to contour a shape that is difficult to reduce to a series of linear and/or circular segments. The curve may be emperically derived or of a complex analytic nature. Curve fit contour capability provides all of the features described for the fairing contour plus the ability to define a large number of digitized points through which to generate the contour. Curve fit contours are composed of segments of many curves, selected to provide an optimum curve fit. These curves can include linear contours, circular contours, parabolic contours, and cubic contours. The optimum contour segments are automatically selected and the required initial conditions defined by the data processor.

Coordinate Resolution

Resolution of parts program commands is performed to adjust contour commands for special purposes; including scaling, axis alignment, inch/metric conversion and others. In order to preclude the accumulation of errors such as due to digital computation roundoff errors, error reduction processing may be used. One embodiment of such processing absolute position parameters and stores both, the unresolved and the resolved absolute position parameters for the required computations. The data processor 112 loads parts program contour commands from the tape reader 116 or other sources and processes these commands, as defined by the mode of operation commanded. The data processor converts incremental commands to absolute commands by adding the incremental parameter to the appropriate prior absolute position parameter, then processes these absolute coordinate commands as required. These absolute commands may be resolved such as for axis alignment and scaling, converted such as for English or metric unit conversion, or otherwise processed. After resolving parameters in absolute coordinates, the resolved incremental coordinates may be obtained for the contour computations by subtracting the new resolved absolute coordinates from the corresponding old resolved absolute coordinates.

Figure 5:
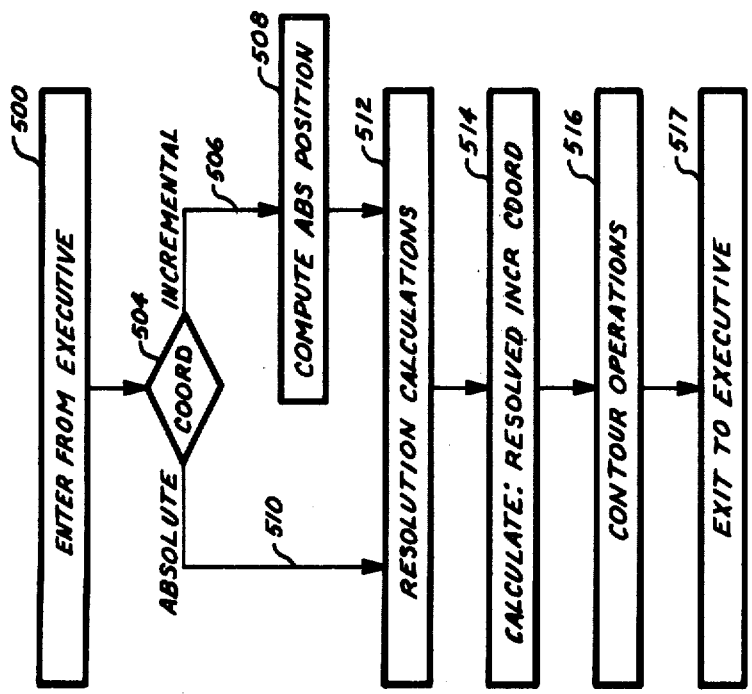
FIG. 5 is a program flow diagram of the coordinate resolution operation.

A program flow diagram for a preferred embodiment of the resolution processing is illustrated in FIG. 5, where the data processor enters the subroutine from the executive routine 500 and checks the dimensional commands in operation 504. If an incremental parameter is detected, the data processor branches along path 506 to operation 508, where the equivalent absolute position parameter is derived. If an absolute parameter is detected, the data processor branches along path 510 bypassing operation 508. The data processor next performs the resolution calculations in operation 512 to obtain the resolved absolute parameters and, if required, calculates the resolved incremental parameters in operation 514. The data processor performs the required contour operations in operation 516, then exits to the executive routine in operation 517.

The resolution operation is implemented by multiplying all translational departure and feedrate commands by the various resolution parameters. The resolution or absolute coordinate transform calculation is used for translational departure commands, but not necessarily for IPM feedrate commands which do not contribute to error accumulation. Other dimensional conversions such as axis alignment and cutter compensation are included in a composite absolute coordinate transform. The various resolution parameters are multiplied together to form a composite scale factor, which need not be recalculated until one of those resolution parameters are changed. The numerical scale factor is preserved for display purposes. Only translational departure commands and feedrate commands are resolved. Rotary departure commands (rotary axes) are not resolved. Feedrate commands are resolved to insure that IPR and RPI programming provides pitch units commensurate with the departure units. The IPM programming is resolved for compatability.

Conversion between English units and metric units is simplified with the metric unit conversion feature, where inputs and outputs can be in either unit system or a mixture of both unit systems. Parts programs are accepted in either system of units, thereby permitting the programmer to code directly from a blueprint, independent of the dimension units. English or metric units are defined with the g25 or g26 commands to permit programming flexibility. In addition, the control panel English/metric switch 289 and the English units and metric units lamps 210 and 211 permit manual control of units. This capability simplifies parts programming by eliminating the need to redimension drawings for different unit systems. Numeric readouts and manual data inputs are provided in either set of units by switch selection, independent of the units used by the parts programmer. This capability simplifies system operation, where the operator can work in units convenient for the particular job. Machine conversion for metric units is not necessary, where the lead screw pitch can be in metric or English units without restricting the parts programmer or operator.

Scaling can be used to proportionately increase or decrease the dimensions of contours such as to change the size of parts, adaptively adjust for thermal dimensional variations, provide mating oversized and undersized parts, roughing a part with a finish cut parts program, model scaling such as with digitizing or tracing an oversized model, and other such applications. Scale factors can be obtained with operator inputs through the panel keyboard 244, as generally described in the referenced application Ser. No. 101,881 from external inputs such as temperature sensors; from parts program commands; and from other sources that will become obvious to those knowledgeable in the art. In one embodiment, the scale factors apply to all translational departures and all feedrate commands. Rotary displacements are not affected by scale factors. Verification of the numerical scale factor can be accomplished by positioning the parameter selector switch 242 to the scale factor position 221 and observing the numeric displays. Modification of the numerical scale factor is accomplished by positioning the mode selector switch 240 to the keyboard position 284 and positioning the parameter selector switch 242 to the scale factor position 221 as an interlock against inadvertent modification. Modification of the numerical scale factor is accomplished thru the keyboard 244 as described for other keyboard entry parameters. Selection of the metric/English scale factor is accomplished by depressing the metric/English switch 289 to toggle the metric lamp 211 and English lamp 210 to change the commanded condition. The numerical scale factor and the metric/English scale factor can be changed together or independently. It is recommended that the floating zero point be redefined with the g27 command when a scale factor change is made to insure that the floating zero reference point is defined in the proper system of units. Application of the scale factor to the feedrate parameters insures consistancy in units, particularly with inches-per-revolution (IPR) and revolutions-per-inch (RPI) programming. IPR and RPI define the pitch of the cut, which is automatically converted to the system of units selected. Scale factors may be stored in the data processor core memory to be preserved for conditions such as power drop-out.

For a typical numerical control application, the workpiece is mounted on the machine tool bed 604; where the bed 604 is driven with the servos 120, 121, and 122 to move the workpiece past the cutter. Parts program commands are used to drive the bed 604, under the assumption that the workpiece 602 is aligned with the bed 604. If the workpiece 603 is misaligned, an incorrect cut 608 will be made. The misalignment angle 600 may be very small but still significant; where a one degree angular misalignment can introduce a cut error of approximately two tenths inches over a one foot workpiece. Therefore, a very small angular misalignment can introduce very large errors when compared to the 0.0001 inch resolution of the numerical control system. Workpiece setup is often a laborous operation, requiring precise positioning of the workpiece by a skilled operator. Optical and mechanical techniques are used to aid the operator, while expensive set up jigs and fixtures are frequently used. In addition, pre-machining of the workpiece is often required for reference surfaces. Axis alignment virtually eliminates laborous setup, expensive jigs and fixtures, pre-machining, and reduces the operator skill requirement. The data processor 113 computationally aligns the workpiece by resolving the parts program commands, which are in bed coordinates, into workpiece coordinates. The workpiece setup sequence permits the operator to place the workpiece 602 on the bed 604 in an arbitrary orientation, then "shoot in" the reference points for the usual floating zero definition. The data processor 112 derives the misalignment angle 600 from this standard operation and computationally aligns the workpiece as parts program commands are executed.

Figure 7:
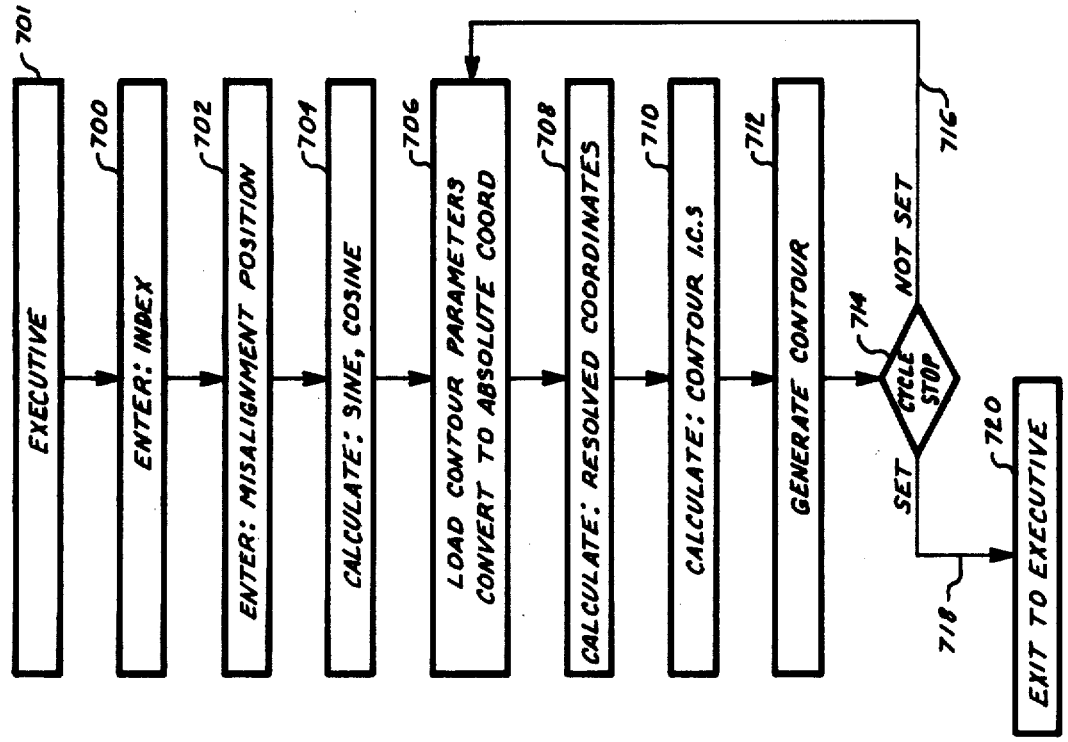
FIG. 7 is a flow diagram of a coordinate conversion program operation.

A program flow diagram for the axis alignment feature of this invention is shown in FIG. 7. The misalignment routine is entered from the executive routine 701. For the misalignment definition, the operator defines the floating zero point (0,0) 612 with the index control in operation 700, then repositions the machine to a second co-ordinate point 614 and depresses the enter misalignment switch 295, which enters these coordinates as $X_R$, $Y_R$ in operation 702. These coordinates are used to calculate the sine and cosine of the misalignment angle in operation 704. These sine and cosine terms are then used to resolve the misaligned contour 608 through the misalignment angle 600 to obtain the computationally aligned contour 610. The data processor next loads a set of contour parameters in operation 706, converts them to absolute coordinates if necessary, then resolves these contours with well known mathematical coordinate rotation techniques such as:

$$X_{R1} = X \cos \theta + Y \sin \theta$$

$$Y_{R2} = X \sin \theta - Y \cos \theta$$

in operation 708. The data processor derives the contour initial conditions in operation 710 and generates the contour in operation 712. The cycle stop condition is tested in operation 714. If the cycle stop condition is not set, the data processor loops back along path 716 to obtain the next set of parts program commands. If the cycle stop condition is set, the data processor exits to the executive routine 720 along path 718.

Dimensioning

An improvement for parts program dimensioning will now be described. Dimensioning of drawings typically follows classical drafting procedures, based upon drafting convenience and manual machining requirements, bearing little resemblance to techniques required for prior art numerical control systems. The system of this invention permits tailoring to the classical drafting procedures, so the parts programmer can dimension the program as the drawing or part description was dimensioned.

Drawings are often dimensioned from several reference points for drafting convenience. Parts programmers usually recalculate dimensions to convert between the various dimensioning techniques. With the system of this invention, the operator can program with any dimensioning scheme, incremental or absolute coordinates, and from any reference point merely be selecting the coordinates with a g command. He can redefine the floating zero point from the parts program to permit programming in absolute coordinates that are referenced to different points. The offset feature permits floating zero redefinition without requiring the programmer to physically reposition the machine to the new point, permitting zero points be defined that are physically inaccessible due to workpiece interferences or that are located off the workpiece or off the machine, such as on a skin mill or flame cutter where the datum point may be located at a remote reference point on the aircraft or ship. The ability to program both absolute and incremental dimensions on the same system gives the parts programmer another degree of freedom. In addition, the ability is provided to mix absolute and incremental dimensions in the same block of tape commands and to select the dimensioning scheme for each axis with g commands so the parts programmer can code directly from a drawing, selectively changing between incremental and absolute dimensions for each axis according to the dimensioning on the drawing.

The floating zero point represents the zero absolute position coordinate for all absolute position commands and for display parameters. When the system is initialized, the absolute position parameters for all axes are set to zero, thereby defining this initial machine position as the floating zero point. The floating zero point can be redefined by the parts programmer at any time in the parts program. The machine absolute position can be defined as the floating zero point or as an offset from that floating zero point. Programming of a g27 will cause the absolute zero point to be defined by the departures contained in that block relative to the machine absolute position. Axis departures that are not programmed in that block cause the floating zero point to remain unchanged relative to that axis position. If a zero axis departure is programmed, that axis position is defined to be offset from the floating zero coordinate by the magnitude of the programmed departure. A parts program block of commands such as g27xyzb defines that the present machine position is the floating zero point for all axes. A parts program block of commands such as g27x-02 defines that the present machine position is offset from the floating zero coordinate by −2 inches in the x axis, but the relation to the floating zero coordinates for the other axes remain unchanged.

Departures for linear contours can be programmed in absolute coordinates, incremental coordinates, or a combination of absolute and incremental coordinates at the same time. Auxiliary (g) commands are used to command the data processor to select the coordinate system, selectable on an individual axis basis. The auxiliary command assignments are: all axes absolute, g50; all axes incremental, g51; x axis incremental, g52; y axis incremental, g53; z axis incremental, g54; and b axis incremental, g55. These coordinate commands are modal, where the coordinate selection is applicable to the block in which it is programmed and to all subsequent blocks until changed. Circular contours, defined by G02 and G03 commands, are automatically programmed in incremental coordinates commensurate with the previously referenced EIA Standards. If a circular contour is programmed for an axis operating in absolute coordinates, the circular contour parameters are automatically treated as incremental coordinates. Absolute coordinate selection for the linear contours will be preserved and do not have to be redefined as absolute coordinates following the circular contour. Selection of all axes to be programmed in absolute coordinates is commanded with a g50. Absolute coordinate linear contours are programmed with the contour end point coordinates relative to the floating zero point. Selection of all axes to be programmed in incremental coordinates is commanded with a g51. Incremental coordinate linear contours are programmed with the contour end point coordinates relative to the initial position of the machine at the beginning of the contour. Selection of an axis to be programmed in incremental coordinates when it has previously been programmed in absolute coordinates requires the corresponding axis incremental g command, such as a g52 for the x axis. Selection of an axis to be programmed in absolute coordinates when it has previously been programmed in incremental coordinates requires a g50 command to set that axis (together with all other axes) to absolute coordinate programming. It is then necessary to selectively reset the axes that have been programmed and are to remain in incremental coordinates with the corresponding axis incremental g commands, such as a g52 for the x axis.

Ability to program many g commands in a single block is provided to simplify coordinate selection, where various combinations of incremental and absolute coordinate programming can be selected with a single block, independent of the quantity of g commands required. Absolute and incremental coordinates can be changed throughout the parts program without loss of position because the data processor 112 keeps track of the command absolute position of all axes including those selected for incremental coordinates.

Therefore selecting absolute coordinates for a previously incremental coordinate axis in the middle of the program is acceptable, where the command absolute coordinate positions for all axes are continuously updated. A variable block format is used for parts program inputs, where an axis that is not programmed in a block will hold position independent of the coordinate system selected. A fixed block format is used for the keyboard input, requiring all commands to be programmed. For the keyboard input, if an axis is in absolute coordinates and is to hold position, the displayed absolute position does not have to be changed. For the keyboard input, if an axis is in incremental coordinates and is to hold position, a zero position incremental command must be input and displayed.

Parameter Table

It is often desirable to access various parameters automatically, such as from the parts program. A parameter table is contained in memory and accessed by the data processor 112 as commanded. The parameters in the table may be tool offsets, compensation parameters, or other parameters.

A table of parameters can be loaded through the tape reader 116 using a parameter tape containing a g command, such as g70, to identify a parameter tape. A series of parameters are contained on the tape with the format:

g70
$PA_1A_2A_3A_4,B_1B_2B_3B_4B_5B_6$
$PA_1A_2A_3A_4,B_1B_2B_3B_4B_5B_6$
EOB where the P character defines a new parameter, the A characters define the particular parameter address in the table of parameters to be modified, the comma separates the address characters from the parameter characters, and the B characters define the parameter to be loaded into the selected table address. A parameter table can also be loaded with the control panel 114, as will be described hereafter for tool offsets, or with other sources that will become obvious to those knowledgeable in the art.

Individual tool parameters are stored in a "table" in memory such as the main memory 130 of the data processor 112. This memory in one embodiment is an electrically alterable and non-volatile core memory, so the parameters can be easily modified and are preserved even under conditions such as power turn-off or power drop-out. Tool parameters include tool offsets, tool history, tool life, and can include cutter radius and other such tool oriented parameters. These parameters can be verified with the numeric displays and modified with the keyboard. Tool offsets are usually provided for turning machines that have a tool change capability. Tool radii such as for cutter compensation are usually provided for milling machines, grinding machines, and flame cutting machines. Other selectable parameters can be provided as will be obvious to those knowledgeable in the art.

Operation will be discussed with reference to tool offsets for a lathe machine but this capability is intended to include all means and methods for processing multiple parameters for control of a machine as generally described herein. Tool history and tool life provide a degree of management reporting capability to aid in efficient system utilization. Tool offsets are accessed automatically with a t parts program command, where the machine is driven an amount equal to the algebraic difference between the old and the new tool offsets. The command absolute position is not updated for this motion, effectively offsetting the floating zero point to normalize the difference in tool positions. The tool history parameter for a specific tool is incremented each time the turret position for that tool is commanded, maintaining a historical record of the number of operations each tool has experienced. This capability is particularly useful for preventative maintenance, where it identifies the tool useage which can then be related to tool wear for tool replacement. During workpiece set-up, tool history parameters are checked to insure that the number of cycles on each tool is below the replacement number. The tool life parameter for each tool is automatically compared with the tool history parameter. Whenever the tool history parameter is equal-to or greater-than the tool life parameter, the tool replacement lamp 219 is illuminated and continuously flashed. When the tool replacement lamp 219 is flashing, the operator waits for a convenient time to change tools, such as the completion of the workpiece, then identifies and replaces the worn tool or tools. Identification is accomplished by displaying the tool history and tool life parameters for all tools and replacing the tools where the tool life parameter is equal-to or less-than the tool history parameter.

Tool parameters are verified and modified by positioning the parameter selector switch 242 to the tool position 222, positioning the mode selector switch 240 to the keyboard position 284, then sequencing thru the tool parameter table with the enter or op switch 254. Each time the op switch 254 is depressed, the next tool parameter in sequence is displayed. If a tool parameter is to be modified; that tool parameter should be accessed as described above, then cleared with the clear switch 250 and entered with the keyboard 244 switches to define the new tool parameter. Whenever a tool is changed, the tool offset parameters for that tool are redefined and that the tool history parameter is either zero set for a new tool or preset to a utilization quantity for a used tool. The tool parameter displayed is identified with the tool number in the most-significant-digit (left hand digit) and the parameter identification in the second-most-significant-digit. The tool number will range from 0 thru 9 for up to ten sets of tool parameters. The tool parameter will range from the axes offsets (x,y,z and b) thru the tool history and the tool life (h and l) parameters. The tool parameters are accessed in a sequence such as 0x, 0y, 0z, 0b, 0h, 0l, 1x, 1y, 1z, 1b, 1h, 1l, 2x, ... 9x, 9y, 9z, 9b, 9h, 9l, 0x, 0y ... for a four axes system with tool history and tool life parameters. Various types of parameters can be added or deleted as required by the application. Tool quantity can be increased from 10 to 100 merely by adding another tool identification character for the range of 00 through 99 tools. Also, selections other than for tools can be accomodated using the means and methods described above.

For the embodiment previously discussed, as applied to a lathe machine, ten turret position selection codes are provided in conjunction with ten x-z offset pair selection codes. Any one of ten offset pairs may be selected for any turret position; where a t command first executes the turret position command, then automatically executes the offset commands. The machine may not have ten turret positions, where only the actual turret positions provided with the machine are commanded with the parts program; but ten offsets pairs may be used for each turret position independent of the number of turret positions available. Timing and sequencing associated with turret repositioning is performed automatically with the data processor 112. The t command initiates a data processor canned cycle to reposition the turret, with time delays and interlocks that insure proper operation. Therefore, a t command can be programmed without the need for a dwell or other such command. The t command has a t2 format, where the least significant character defines the offset pair and the most significant character defines the turret position. For example, a t25 command selects offset pair 5 to be used in conjunction with the tool in turret position 2. A t command may be programmed in a block with other commands, including s commands and machine motion commands. The t command will be executed after the execution of the s command but prior to the execution of all motion commands.

Special Features

Incorporation of a form of post processor in the data processor program permits a degree of tape interchangeability previously not available. This capability permits the system to emulate (operate in a manner similar to) a prior art non-computerized system for full tape interchangeability. Shop logistic considerations are enhanced with the ability to accept the tape input formats of other controls. This feature permits use of common tape preparation programs, post processor programs, and use of the store of old tapes. The user can benefit from the special capabilities available with this system without obsoleting old punched tape programs and eliminating the need to retrain parts programmers, but still permitting use of the proven tape preparation computer programs.

The automatic cutting of standard shapes using a simple programming language is performed to reduce the parts programming requirements placed on the user. Standard shapes are selected with g commands from the punched tape for automatic operation and from the keyboard for semiautomatic operation. Approximately 20 standard shapes are implemented in the basic system and stored in the core memory. Addition of another memory such as a parts program memory permits hundreds of shapes to be incorporated, to be used as an extensive library of shapes for programming use.

Additional capability permits the parts programmer to program fixed cycle subroutines such as identified with sequence numbers and loaded into a memory, which may be a parts program memory, and using a stored parts program arrangement such as described in the previously referenced application Ser. No. 230,872. These programmable fixed cycle subroutines can be accessed from the parts program with various commands. The data processor 112 will execute a parts program containing programmable fixed cycle commands, transfer control to the fixed cycle subroutine memory when a fixed cycle command is executed, execute the fixed cycle subroutine, then return to the parts program for the next block of commands. Higher levels of parts program subroutining can also be provided. Unconditional Transfer commands can be defined such as N050g48N752, where the g48 command contained in block 50(N050) will transfer parts program operations to the block 752 subroutine and will save the return address, which is block 51. Indirect Transfer commands can be defined such as N758g49, where the g49 command contained in block 758 (the last block in the previously described subroutine) will transfer parts program operations to the block 51, previously stored as the return address. Multilevel parts program subroutine capability can be provided such as with a push down list or other techniques well known in the computer art.

Control of machine acceleration and deceleration will now be discussed. Acceleration and deceleration operations for machine motion are provided in response to parts program commands, and are also provided automatically and adaptively when conditions warrant acceleration or deceleration operations. The data processor 12 modifies the contour calculations to change the real time interpolation commands 123 to the servos 120, 121, and 122 to provide acceleration and deceleration control signals to the machine 124. The machine 124 responds to these acceleration and deceleration control signals 120, 121, and 122 to gradually accelerate or decelerate the machine 124 to the required velocity as commanded by the data processor command signals.

Programmable acceleration and deceleration capability is provided for Continuous mode operation where continuity of the contour is required at the parts programmers option. Acceleration can be commanded with a g08 command and deceleration can be commanded with a g09 command. These commands apply only to the block in which they are programmed. A block of commands can contain either a g08, a g09, both or neither of these commands.

Automatic acceleration and deceleration is provided for all conditions that continuity of the contour is not required such as when the axes motions are initially at rest, come to a stop, or for rapid traverse conditions which are not used for cutting metal. Acceleration and deceleration will be commanded automatically for motion in the keyboard, jog, block, and index modes and for rapid traverse (g07), in the continuous mode. In addition, automatic acceleration will be commanded for all axes motions initiated with the cycle start switch 246 and automatic deceleration will be commanded for all axes motions terminated with the cycle stop switch 256, slide hold switch 260, and programmed stop conditions such as m00, m01, m02, and m30. Automatic acceleration and deceleration capability eliminates problems such as operation in the block mode with a parts program written for the continuous mode. An example is at the transition from one high speed contour to a second high speed contour in approximately the same direction, where acceleration and deceleration are not required for the continuous mode because the change in the velocity from the first contour to the second contour is slight, but are required for the block mode because the change in the velocity from the first contour to a stop condition is significant. Operations are determined by the data processor 112 to identify the conditions where machine motion will start from rest or will end at rest. The acceleration and deceleration commands are automatically executed by the data processor 112 under these conditions to insure that smooth transitions are provided.

Adaptive acceleration and deceleration is provided, where the data processor 112 provides a "look ahead" capability to calculate the velocity of each axis for sequential blocks of commands. The data processor 112 then defines the acceleration or deceleration operations required to make a smooth motion transition from one block of commanded motion to the next block of commanded motion. The data processor 112 adaptively provides the required real time interpolation commands 123 to the servos 120, 121, and 122 to provide smooth transitions from one machine motion to the next machine motion.

Programmable acceleration and deceleration ramps are provided to permit the parts programmer to control the ramp slope to optimize machine operations. For example, acceleration into a workpiece might be more gradual than deceleration out of a workpiece. Also, rapid ramps would be commanded for rough cuts and gradual ramps would be commanded for finish cuts. The parts program address a is used to set the acceleration ramp and the address d is used to set the deceleration ramp. The numeric characters following these addresses are used to define the ramp slope. The data processor 112 accesses the a and d parameters when required and adapts the contour calculations to control the change in machine velocity.

Programming for rotary axes will now be described. Rotary axes have the same scaling and operating characteristics as a linear axes. Standard resolver gearing for rotary axes is 10 degrees of table rotation for one resolver rotation or a 36:1 gear ratio. Therefore, the servo resolution for rotary axes is 0.005 degrees corresponding to 0.000050 inches for linear axes. This scaling has no special program scaling requirement for linear and rotary axes, except that the decimal point on the numeric display is different. The parts programmer can command a departure as high as 9999.995 degrees yet not require special contour considerations beyond that of a linear contour with a 99.99995 inch departure. The stored program does not have to discriminate between linear and rotary axes. Feedrate calculations consider only linear axes departures to define velocity, then synchronize the rotary axes to the linear axes for slope commands. As an example, a part program block with x, y, and b departures has a vector feedrate based upon: $\sqrt{x^2+y^2}$ but a slope based upon x, y, and b. Feedrate values for the rotary and linear axes correspond, where a part program block containing: x×00.70700 inches, y+00.70700 inches, b+0100.000 degrees, and f 01.0 IPM will provide 0.707 IPM x axis velocity, 0.707 IPM y axis velocity, 1 IPM, x-y axes vector velocity, and 100 degrees per minute b axis velocity. This relates to 100 degrees per minute/inch per minute for rotary axis feedrate scaling. Incremental and absolute coordinate programming is equally applicable to linear and rotary axes without special considerations. Mirror image axis reversal is equally applicable to linear and rotary axis without special considerations. Absolute position data for rotary axes must be modulo 360 degrees for display and storage, although ±9999.995 degree departures are permissable, accomplished with the data processor by substracting (or, for a negative absolute position, adding) 360 degrees (binary) from the new absolute position successively until the absolute position is less than 360 degrees absolute magnitude.

Other Considerations

Many terms well known in the numerical control art are used in this description and claims. These terms are generally defined in the prior art literature and in the numerical control industry standards. The meaning of numerical control terms is intended to be as used in this specification and, if not fully defined in this specification, then as further defined in those referenced EIA Standards and, if not fully defined in those EIA Standards, then as commonly used in the numerical control field.

Well known documents on numerical control are listed below and are incorporated herein be reference.

(1) Numerical Control by Nils O. Olesten for John Wiley and Sons.

(2) Numerical Control Users Handbook by Leslie for McGraw Hill (1970).

(3) Numerical Control, Practice and Applications by William J. Patton for Reston Publishing Company (1972).

(4) Automation Bulletin No. 3B Glossary of Terms For Numerically Controlled Machines by the Electronic Industries Association (1965) New York, N.Y.

(5) Interchangeable Perforated Tape Variable Block Format for Contouring and Contouring/Positioning Numerically Controlled Machine Tools (RS-274-A) by the Electronic Industries Association (1965) New York, N.Y.

The versatility of the control panel 114 and display panel 118 are presented in the previously referenced applications Ser. No. 101,881 and Ser. No. 101,449. This versatility permits the lamp displays 218, the momentary switches, and the selector switches to be assigned various functions, as described below.

The momentary switches may be assigned various functions such as Optional Stop 283, Block Delete 285, EIA and ASCII Codes 287, English and Metric Units 289, DNC Source Select 280, DNC Mode 282, Mirror Image 262, Mirror Image 263, Jog 252, Emergency Stop 258, Rapid Stop or Slide Hold 260, Cycle Start 246, Cycle Stop 256, Enter 254, Clear 250, and various spares 291, 292, 293, 294, and 295. These switch assignments can be changed and the execution can be defined under data processor program control.

The lamp displays may be assigned various functions such as Power On 234, Error 236, DNC 270, Execute 272, Edit 274, Delete 276, Record 278, Optional Stop 200, Block Delete 201, Spindle CW 202, Spindle CCW 203, X Reverse 204, Y Reverse 205, Z Reverse 206, B Reverse 207, EIA Code 208, ASCII Code 209, English Units 210, Metric Units 211, Slide Hold 212, Cycle On 213, Cycle Off 271, and various spares 215, 216, 217, 219 and 220. These lamp display assignments can be changed and the execution can be defined under data processor program control.

The selector switch such as the Parameter selector switch 242, can be assigned various functions. For a Milling machine the assignments can be X Axis 227, Y Axis 226, Z Axis 225, B Axis 224, Sequence Number 223, Spindle Speed 222, I Arc Center 228, J Arc Center 229, K Arc Center 230, M Command 231, G Command 232, Feedrate 237, Feedrate Override 239, Cutter Compensation 243, and spare 221. For a lathe the assignments can be X Axis 227, Z Axis 226, Sequence Number 225, Spindle Speed 224, Turret Select 223, Tool Offsets 222, I Arc Center 228, K Arc Center 229, M Command 230, G Command 231, Feedrate 232, Feedrate Override 237, and spares 221, 239, and 243. These selector switch assignments can be changed and the execution can be defined under data processor program control.

The parts program formats for commanding numerical control systems have been standardized by the Electronic Industries Association. A typical standard is EIA Standard RS-274-B; Interchangeable Perforated Tape Variable Block Format for Contouring and Contouring/Position Numerically Controlled Machines; published by the Electronic Industries Association; where this standard and the references contained therein are incorporated by reference herein.

A parts program is intended to mean a program that describes a sequence of machine operations to generate a part; wherein the parts program comprises a sequential set of blocks of commands, where each block contains one or more commands for the numerical control system in a control oriented language. This language is usually comprised of a word address format as described in the previously referenced EIA Standard RS-274, but may be another such control oriented language. This control oriented language is intended to be contrasted to a compiler oriented language such as the APT language which requires a generalized input to a large scale computer but is not acceptable by a typical numerical control system.

A parts program is composed of a sequence of blocks of commands, where each block defines an operation such as a single contour and the associated commands required to implement that operation. Each block is composed of a group of words, while the words are composed of a group of characters. Each character is composed of a binary code. A parts program may be a complete program for cutting a part or may be a portion of a complete program for cutting a part. For example, a parts program stored in the parts program memory can be a portion of the operations required to generate the part, particularly if the total set of parts programs to generate the part will not fit into the storage provided. Therefore the term parts program is intended to mean a large number of blocks of commands, but not necessarily the complete set of blocks required to cut the part.

Although the preferred embodiment of this invention accepts parts programs in EIA Standard form with EIA tape codes, words, and blocks; it will be obvious to those knowledgeable in the art that other forms of numerical control commands can be provided. Greater levels of freedom in defining these numerical control commands are available with the hierarchy of computer systems described herein. Therefore; although this invention is described relative to EIA Standard parts programs, it is intended that this intention include all languages directly acceptable by a numerical control system to control the associated machine.

The term computer as used herein is intended to mean a stored program digital data processor.

It is thus clearly seen that the present invention provides a novel means and method of providing a CNC system for controlling machines.

From the above description it will be apparent that there is thus provided a device of the character described possessing the particular features of advantage before enumerated as desirable, but which obviously is suceptible of modification in its form, proportions, detail construction and arrangement of parts without departing from the principles involved or sacrificing any of its advantages.

While in order to comply with the statute, the invention has been described in language more or less specific as to structural features, it is to be understood that the invention is not limited to the specific features shown, but that the means and construction herein disclosed comprise the preferred form of several modes of putting the invention into effect, and the invention is, therefore, claimed in any of its forms or modifications within the legitimate and valid scope of the appended claims.

What is claimed is:

1. A machine control system comprising:
input means for providing object path end point signals;
an integrated circuit object memory for storing object path end point signals received from said input means;
rotation command means for providing a multi-dimensional rotation command signal;
translation command means for providing a multi-dimensional translation command signal;
an integrated circuit data processor for processing the object path end point signals stored in said object memory in real time in response to the multi-dimensional rotation command signal from said rotation command means and the multi-dimensional translation command signal from said translation command means to generate real time object control signals, said data processor including
  a. multi-dimensional rotation processing means for performing multi-dimensional rotation processing of the object path end point signals from said object memory to generate multi-dimensional rotated object path end point signals in response to the multi-dimensional rotation command signal from said rotation command means,
  b. multi-dimensional translation processing means for performing multi-dimensional translation processing of the object path end point signals from said object memory to generate multi-dimensional translated object path end point signals in response to the multi-dimensional translation command signal from said translation command means,
  c. multi-dimensional scaling processing means for performing multi-dimensional scaling processing of the object path end point signals processed with said multi-dimensional rotation processing means and with said multi-dimensional translation processing means to generate reduced multi-dimensional rotated and translated path signals,
  d. path smoothing processing means for performing path smoothing processing of the multi-dimensional reduced rotated and translated path signals processed with said multi-dimensional scaling processing means to generate smoothed and reduced multi-dimensional rotated and translated path signals, and
  e. output means for generating the real time object control signals as smoothed and reduced multi-dimensional rotated and translated path control signals in response to the smoothed and reduced multi-dimensional rotated and translated path signals from said path smoothing processing means; and
control means for controlling motion of multi-dimensional machine elements in response to the smoothed and reduced multi-dimensional rotated and translated path control signals from said output means.

2. The system as set forth in claim 1 above, wherein said input means is a parts program tape reader input means for generating the object path end point signals as parts program motion command signals; wherein said object memory is a parts program memory for storing parts program commands; wherein said rotation command means is an operator rotation switch for generating the rotation command signals as a switch rotation command signal; wherein said translation command means is an operator translation switch for generating the translation command signal as a switch rotation command signal; wherein said data processor is a stored program data processor for processing the object path end point signals under control of a stored program;

wherein the real time object control signals are generated at a machine related rate for smooth path operation without discontinuities; wherein said rotation processing means includes incremental axis alignment processing means for incrementally performing the multi-dimensional rotation processing of the object path end point signals to obtain incremental multi-dimensional rotated axis alignment object path end point signals in response to the multi-dimensional rotation command signal; wherein said translation processing means includes incremental x, y, and z axis processing means for incrementally performing the multi-dimensional translation processing of the object path end point signals to obtain incremental multi-dimensional translated object path end point signals in response to the multi-dimensional translation command signal; wherein said scaling processing means includes incremental size reduction x, y, and z scaling means for incrementally reducing the x, y, and z dimension with incremental scaling processing of the x, y, and z object path end point signals to obtain incremental reduced x, y, and z object path end point signals; wherein said path smoothing processing means includes incremental fairing contour processing means for incrementally performing the path smoothing processing of the object path end point signals to obtain incremental smoothed object path end point signals; wherein said output means includes a program responsive data processor output circuit for generating the smoothed and reduced multi-dimensional rotated and translated path control signals under control of the program stored in said main memory; and wherein said control means is a machine servo.

3. The system as set forth in claim 1 above, wherein said multi-dimensional rotation command signal has a magnitude related to a desired resolution of the motion command signals.

4. The system as set forth in claim 1 above, wherein said data processor includes incremental processing means for processing the object path end point signals in incremental processing form.

5. The system as set forth in claim 1 above, wherein said multi-dimensional rotation processing means includes axis alignment processing means for processing the object path end point signals to generate the multi-dimensional rotated object path end point signals to align axis that were misaligned.

6. The system as set forth in claim 1 above, wherein said multi-dimensional rotation processing means includes axis alignment processing means for performing the multi-dimensional rotation processing of the object path end point signals to align axis that are misaligned to generate the multi-dimensional rotated object path end point signals as aligned object end point signals in response to the multi-dimensional rotation command signal from said rotation command means.

7. The system as set forth in claim 1 above, wherein said multi-dimensional rotation processing means includes axis alignment processing means for performing the multi-dimensional rotation processing of the object path end point signals as two dimensional rotation processing to align two axis that are misaligned to generate the multi-dimensional rotated object path end point signals as two dimensional aligned object end point signals in response to the multi-dimensional rotation command signal from said rotation command means.

8. The system as set forth in claim 1 above, wherein said multi-dimensional translation processing means includes means for performing the multi-dimensional translation processing of the object path end point signals as three dimensional translation processing to generate the multi-dimensional translated object path end point signals as two dimensional translated object path end point signals in response to the multi-dimensional translation command signal from said translation command means.

9. The system as set forth in claim 1 above, wherein said an integrated circuit data processor includes an incremental data processor for incrementally processing the object path end point signals stored in said object memory in real time in response to the multi-dimensional rotation command signal from said rotation command means and the multi-dimensional translation command signal from said translation command means to generate real time incremental object control signals.

10. The system as set forth in claim 1 above, wherein said multi-dimensional scaling processing means includes means for performing the multi-dimensional scaling processing of the object path end point signals processed with said multi-dimensional rotation processing means and with said multi-dimensional translation processing means to generate the reduced multi-dimensional rotated and translated path signals as reduced three dimensional rotated and translated path signals.

11. The system as set forth in claim 1 above, wherein said path smoothing processing means includes fairing contour means for performing the path smoothing processing of the multi-dimensional reduced rotated and translated path signals as fairing contour smoothing processing to provide a smooth contour between two paths to generate smoothed and reduced multi-dimensional rotated and translated path signals.

12. The system as set forth in claim 1 above, wherein said path smoothing processing means includes continuous means for performing the path smoothing processing of the multi-dimensional reduced rotated and translated path signals as high rate continuous smoothing processing to provide a smooth path to generate smoothed and reduced multi-dimensional rotated and translated path signals.

13. The system as set forth in claim 1 above, wherein said input means includes a data link to a host computer for communicating the object path end point signals from the host computer.

14. The system as set forth in claim 1 above, wherein said input means includes a serial data link to a remote computer for communicating the object path end point signals in serial data form from the host computer.

15. The system as set forth in claim 1 above, wherein the object end point command signals define a linear path and wherein said control means includes means for controlling motion of multi-dimensional machine elements along a linear path in response to the smoothed and reduced multi-dimensional rotated and translated path control signals from said output means.

16. The system as set forth in claim 1 above, wherein the object end point command signals define a non-linear path and wherein said control means includes means for controlling motion of multi-dimensional machine elements along a non-linear path in response to the smoothed and reduced multi-dimensional rotated and translated path control signals from said output means.

17. The system as set forth in claim 1 above, wherein the object end point command signals define a circular arc path and wherein said control means includes means for controlling motion of multi-dimensional machine elements along a circular arc path in response to the smoothed and reduced multi-dimensional rotated and translated path control signals from said output means.

18. A machine control system comprising:
motion input means for providing motion command signals;
rotation input means for providing a rotation command signal;
translation input means for providing a translation command signal;
a data processor for processing the motion command signals from said motion input means in response to the rotation command signal from said rotation input means and the translation command signal from said translation input means to generate rotated and translated motion control signals, said data processor including
  (a) a main memory for storing a program,
  (b) input logic for receiving the motion command signals from said motion input means, the rotation command signal from said rotation input means, and the translation command signal from said translation input means under control of the program stored in said main memory, and
  (c) rotation processing logic for rotating the motion command signals received with said input logic to generate rotated motion command signals in response to the rotation command signal received with said input logic,
  (d) translation processing logic for translating the rotated motion command signals that are rotated with said rotation processing logic to generate rotated and translated motion command signals in response to the translation command signal received with said input logic, and
  (e) smoothing logic for generating smoothed rotated and translated motion control signals in response to the rotated and translated motion command signals; and
means for controlling motion of a machine along a smoothed rotated and translated path in response to the smoothed rotated and translated motion control signals from said smoothing logic.

19. The system as set forth in claim 18 above, wherein said motion input means is a parts program tape reader input means for generating the motion command signals as parts program motion command signals; wherein said rotation input means is an operator rotation switch for generating the rotation command signal as a switch rotation command signal; wherein said translation input means is an operator translation switch for generating the translation command signal as a switch rotation command signal; wherein said data processor is a stored program data processor for processing the motion command signals under control of the program stored in said main memory; wherein the motion control signals generated with said smoothing means are generated at a machine related rate in real time for smooth path operation without discontinuities; wherein said rotation processing logic includes incremental axis alignment processing logic for incrementally performing the rotating of the motion command signals to obtain incremental multi-dimensional rotated axis alignment motion command signals in response to the rotation command signal from said rotation input means; wherein said translation processing logic includes incremental x, y, and z axis processing logic for incrementally performing multi-dimensional translation processing of the rotated motion command signals to obtain incremental multi-dimensional translated and rotated motion command signals in response to the translation command signal; wherein said smoothing logic includes incremental fairing contour processing means for incrementally performing path smoothing processing of the rotated and translated motion command signals to obtain incremental smoothed rotated and translated motion control signals; said data processor further including a program responsive data processor output circuit for generating the smoothed rotated and translated motion command signals under control of the program stored in said main memory.

20. A machine control system comprising:
end point input means for providing edge end point signals;
rotation input means for providing a multi-dimensional rotation command signal;
means for processing the edge end point signals from said end point input means in response to the multi-dimensional rotation command signal from said rotation input means to generate rotated path control signals, said processing means including coordinate rotating means for rotating the coordinates of the edge end point command signals to generate rotated coordinate edge end point command signals in response to the multi-dimensional rotation command signal and control signal generating means for generating the rotated path control signals in response to the rotated coordinate edge end point command signals; and
means for controlling motion of multi-dimensional machine elements along a rotated path in response to the rotated path control signals.

21. A machine control system comprising:
distance input means for providing distance command signals related to commanding of a first distance;
scaling input means for providing a scaling command signal to change the distance commanded with said distance input means;
a data processor for processing the distance command signals from said distance input means in response to the scaling command signal from said scaling input means to generate scaled distance control signals, said data processor including dimension scaling means for scaling dimensions of the distance command signals from said distance input means to generate scaled distance command signals related to commanding of a second distance different from said first distance in response to the scaling command signal and means for generating the scaled distance control signals in response to the scaled distance command signals; and
means for controlling motion of a machine to move the second distance in response to the scaled distance control signals.

22. A machine control system comprising:
motion input means for providing motion command signals;
misalignment input means for providing a misalignment command signal related to a misalignment of a part to be cut;
a data processor for processing the motion command signals from said motion input means in response to the misalignment command signal from said misalignment input means to generate aligned motion control signals, said data processor including axis alignment resolving means for aligning coordinates of the motion command signals to generate aligned motion command signals in response to the misalignment command signal and means for generating the motion control signals as aligned motion control signals in response to the aligned motion command signals; and means for controlling motion of a machine in an aligned direction in response to the aligned motion control signals.

23. A machine control system comprising:

motion input means for providing motion command signals in a first units system;

units input means for providing a units command signal to identify the first units system of the motion command signals;

a data processor for processing the motion command signals from said motion input means in response to the units command signal from said units input means to generate motion control signals in a second units system different from the first units system, said data processor including units converting means for converting the first units system of the motion command signals to generate converted motion command signals in the second units system in response to the units command signal and means for generating the motion control signals as converted motion control signals in the second units system in response to the converted motion command signals in the second units system; and means for controlling motion of a machine in the second units system in response to the motion control signals in the second units system.

24. A machine control system comprising:

motion input means for providing motion command signals;

resolution input means for providing a resolution command signal;

a stored program data processor for processing the motion command signals in response to the resolution command signal under control of a stored program to generate motion control signals, said data processor including means for resolving the motion command signals to generate resolved motion command signals in response to the resolution command signals under control of a stored program and means for generating the motion control signals as resolved motion control signals in response to the resolved motion command signals, wherein said resolving means includes means for reducing accumulated errors in the generation of the resolved motion command signals under control of a stored program; and means for controlling motion of a machine in response to the motion control signals.

25. A machine control system comprising:

motion input means for providing motion command signals;

resolution input means for providing a resolution command signal;

a stored program data processor for processing the motion command signals in response to the resolution command signal under control of a stored program to generate motion control signals, said data processor including means for resolving the motion command signals to generate resolved motion command signals in response to the resolution command signals under control of a stored program and means for generating the motion control signals as resolved motion control signals in response to the resolved motion command signals, wherein said resolving means includes means for reducing accumulated errors in the generation of the resolved motion command signals under control of a stored program, and wherein said accumulated error reducing means includes means for processing absolute position and incremental position information to provide the reduction of accumulated errors; and means for controlling motion of a machine in response to the motion control signals.

26. A machine control system comprising an input memory for storing edge endpoint coordinates;

rotation input means for generating a rotation command signal;

an incremental processor for incrementally processing the edge endpoint coordinates stored in said input memory in response to the rotation command signal from said rotation input means to generate rotated control signals, said incremental data processor including (a) an integrated circuit main memory for storing an incremental program, (b) an integrated circuit alterable memory for storing operands under control of the stored program, (c) integrated circuit incremental processing logic for incrementally processing the operands stored in said alterable memory under control of the program stored in said main memory to rotate the edge endpoint coordinates stored in said input memory in response to the rotation command signal from said rotation input means, and (d) means for generating the rotated control signals in response to the edge endpoint coordinates rotated with said incremental processing logic; and means for controlling rotated motion of a machine in response to the rotated control signals.

27. A machine control system comprising:

a data link for providing motion command signals from a remote computer source of motion command signals;

coordinate rotation input means for providing a coordinate rotation command signal;

a data processor for processing the motion command signals from said data link in response to the coordinate rotation command signal from said coordinate rotation input means to generate rotated motion control signals, said data processor including means for rotating the motion command signals from said data link to generate coordinate rotated motion command signals in response to the coordinate rotation command signal and means for generating the rotated motion control signals having rotated coordinates in response to the coordinate rotated motion command signals; and means for controlling rotated motion of a machine in response to the rotated motion control signals.

28. A machine control system comprising:

a data link to a host computer for communicating path endpoint signals;

a disk memory for storing path end point signals communicated with said data link;

rotation command means for generating a multi-dimensional rotation command signal;

translation command means for providing a multi-dimensional translation command signal;

an integrated circuit stored program data processor for processing the path end point signals stored in said disk memory in real time in response to the multi-dimensional rotation command signal from said rotation command means and the multi-dimensional translation command signal from said translation command means to generate real time control signals under control of a stored program, wherein said data processor includes a. an integrated circuit main memory for storing the program,
b. multi-dimensional rotation processing logic for performing multi-dimensional rotation processing of the path end point signals stored in said disk memory to generate multi-dimensional rotated path end point signals in response to the multi-dimensional rotation command signal from said rotation command means under control of the program stored in said main memory,
c. multi-dimensional translation processing logic for performing multi-dimensional translation processing of the path end point signals stored in said disk memory to generate multi-dimensional translated path end point signals in response to the multi-dimensional translation command signal from said translation command means under control of the program stored in said main memory,
d. multi-dimensional scaling processing logic for performing multi-dimensional scaling processing of the path end point signals processed with said multi-dimensional rotation processing logic and with said multi-dimensional translation processing logic to generate reduced multi-dimensional rotated and translated path signals,
e. path smoothing processing logic for performing path smoothing processing of the multi-dimensional reduced rotated and translated path signals processed with said multi-dimensional scaling processing logic to generate smoothed and reduced multi-dimensional rotated and translated path signals, and
f. output logic for generating the real time control signals as smoothed and reduced multi-dimensional rotated and translated path control signals in response to the smoothed and reduced multi-dimensional rotated and translated path signals from said path smoothing processing logic; and control means for controlling motion of multi-dimensional machine elements in response to the smoothed and reduced multi-dimensional rotated and translated path control signals from said output logic.

* * * * *